(12) United States Patent
Chang et al.

(10) Patent No.: US 11,152,587 B2
(45) Date of Patent: Oct. 19, 2021

(54) LIGHT TRANSMISSIVE ELECTRODE FOR LIGHT EMITTING DEVICES

(71) Applicants: OTI Lumionics Inc., Toronto (CA); Yi-Lu Chang, Scarborough (CA); Qi Wang, North York (CA); Michael Helander, Toronto (CA); Jacky Qiu, Toronto (CA); Zhibin Wang, Toronto (CA)

(72) Inventors: Yi-Lu Chang, Scarborough (CA); Qi Wang, North York (CA); Michael Helander, Toronto (CA); Jacky Qiu, Toronto (CA); Zhibin Wang, Toronto (CA)

(73) Assignee: OTI Lumionics Inc., Toronto (CA)

( * ) Notice: Subject to any disclaimer, the term of this patent is extended or adjusted under 35 U.S.C. 154(b) by 70 days.

(21) Appl. No.: 15/757,308

(22) PCT Filed: Aug. 15, 2017

(86) PCT No.: PCT/IB2017/054970
§ 371 (c)(1),
(2) Date: Mar. 2, 2018

(87) PCT Pub. No.: WO2018/033860
PCT Pub. Date: Feb. 22, 2018

(65) Prior Publication Data
US 2020/0227673 A1  Jul. 16, 2020

Related U.S. Application Data

(60) Provisional application No. 62/375,223, filed on Aug. 15, 2016, provisional application No. 62/521,497, filed on Jun. 18, 2017.

(51) Int. Cl.
H01L 51/52 (2006.01)
C22C 23/00 (2006.01)
(Continued)

(52) U.S. Cl.
CPC .......... H01L 51/5234 (2013.01); C22C 23/00 (2013.01); H01L 27/322 (2013.01);
(Continued)

(58) Field of Classification Search
CPC ............. H01L 51/5206; H01L 51/5215; H01L 51/5218; H01L 51/5221; H01L 51/5234;
(Continued)

(56) References Cited

U.S. PATENT DOCUMENTS 4,885,211 A  12/1989 Tang et al.
5,059,862 A  10/1991 Vanslyke et al.
(Continued)

FOREIGN PATENT DOCUMENTS

CA  2450611 A1  2/2004
CA  2552488 A1  9/2005
(Continued)

OTHER PUBLICATIONS

Chen, Y. et al., "Fullerides of alkaline-earth metals", Phys Rev.B. 45(15), (1992), 8845-8848.
(Continued)

*Primary Examiner* — Yu Chen
(74) *Attorney, Agent, or Firm* — Foley & Lardner LLP

(57) ABSTRACT

An opto-electronic device includes: (1) a first electrode; (2) at least one semiconductor layer disposed over the first electrode, the semiconductor layer including an emissive layer; and (3) a second electrode disposed over the semiconductor layer. The second electrode includes a fullerene-containing magnesium alloy which includes a non-zero amount of a fullerene of up to about 15 vol. % of the fullerene, and the second electrode has a thickness of about 50 nm or less.

19 Claims, 34 Drawing Sheets

(51) Int. Cl.
*H01L 27/32* (2006.01)
*H01L 51/56* (2006.01)
*H01L 51/00* (2006.01)
*C22C 26/00* (2006.01)

(52) U.S. Cl.
CPC ........ *H01L 27/3244* (2013.01); *H01L 51/001* (2013.01); *H01L 51/5221* (2013.01); *H01L 51/5228* (2013.01); *H01L 51/56* (2013.01); *C22C 2026/001* (2013.01); *H01L 27/3211* (2013.01); *H01L 51/0046* (2013.01); *H01L 2251/5315* (2013.01); *H01L 2251/5369* (2013.01); *H01L 2251/558* (2013.01)

(58) Field of Classification Search
CPC ............. H01L 51/0046; H01L 51/5088; H01L 51/5092; H01L 2251/5369; H01L 31/022425; H01L 31/022491; H01L 31/1884; H01L 33/42; C22C 23/00; C22C 2026/001
See application file for complete search history.

(56) References Cited

U.S. PATENT DOCUMENTS

| | | | |
|---|---|---|---|
| 5,703,436 | A | 12/1997 | Forrest et al. |
| 5,707,745 | A | 1/1998 | Forrest et al. |
| 6,016,033 | A | 1/2000 | Jones et al. |
| 6,407,408 | B1 | 6/2002 | Zhou et al. |
| 6,538,374 | B2 | 3/2003 | Hosokawa |
| 6,794,061 | B2 | 9/2004 | Liao et al. |
| 6,900,470 | B2 | 5/2005 | Kobayashi et al. |
| 7,009,338 | B2 | 3/2006 | D'Andrade et al. |
| 7,285,907 | B2 | 10/2007 | D'Andrade et al. |
| 7,402,948 | B2 | 7/2008 | Yamazaki et al. |
| 7,491,975 | B2 | 2/2009 | Kubota |
| 7,495,389 | B2 | 2/2009 | Noguchi et al. |
| 7,839,083 | B2 | 11/2010 | Kubota |
| 8,018,137 | B2 | 9/2011 | Shimoji et al. |
| 8,030,838 | B2 | 10/2011 | Kwak et al. |
| 8,040,053 | B2 | 10/2011 | D'Andrade et al. |
| 8,044,580 | B2 | 10/2011 | Yamazaki et al. |
| 8,089,066 | B2 | 1/2012 | Yamazaki et al. |
| 8,105,701 | B2 | 1/2012 | Matsuura et al. |
| 8,362,469 | B2 | 1/2013 | Suh |
| 8,445,895 | B2 | 5/2013 | Okumoto et al. |
| 8,659,010 | B2 | 2/2014 | Song et al. |
| 8,872,206 | B2 | 10/2014 | Chung et al. |
| 8,895,972 | B2 | 11/2014 | Chung et al. |
| 8,957,413 | B2 | 2/2015 | Song et al. |
| 8,994,010 | B2 | 3/2015 | Choi et al. |
| 9,088,004 | B2 | 7/2015 | Chung et al. |
| 9,093,403 | B2 | 7/2015 | Kim et al. |
| 9,231,030 | B2 | 1/2016 | Choi et al. |
| 9,245,934 | B2 | 1/2016 | Chung et al. |
| 9,287,339 | B2 | 3/2016 | Lee et al. |
| 9,315,387 | B2 | 4/2016 | Shin et al. |
| 9,331,308 | B2 | 5/2016 | Choi et al. |
| 2004/0048033 | A1 | 3/2004 | Klausmann et al. |
| 2004/0149984 | A1 | 8/2004 | Tyan et al. |
| 2004/0214041 | A1 | 10/2004 | Lu et al. |
| 2006/0006796 | A1 | 1/2006 | Lee et al. |
| 2006/0011927 | A1 | 1/2006 | Ko |
| 2006/0202614 | A1 | 9/2006 | Li et al. |
| 2006/0228543 | A1 | 10/2006 | Lu et al. |
| 2006/0251924 | A1 | 11/2006 | Lu et al. |
| 2007/0262707 | A1 | 11/2007 | Lee et al. |
| 2008/0258612 | A1 | 10/2008 | Kim et al. |
| 2009/0050206 | A1 | 2/2009 | Halls et al. |
| 2009/0066223 | A1 | 3/2009 | Yabe et al. |
| 2009/0151787 | A1 | 6/2009 | Yoshikawa et al. |
| 2009/0166512 | A1 | 7/2009 | Furst et al. |
| 2009/0199903 | A1 | 8/2009 | Oyamada et al. |
| 2010/0237341 | A1 | 9/2010 | Okumoto et al. |
| 2012/0016074 | A1 | 1/2012 | Elizalde et al. |
| 2012/0146030 | A1 | 6/2012 | You et al. |
| 2012/0216867 | A1 | 8/2012 | Ito et al. |
| 2012/0280217 | A1 | 11/2012 | Matsuura et al. |
| 2012/0313099 | A1 | 12/2012 | Chung et al. |
| 2013/0000952 | A1 | 1/2013 | Srinivas et al. |
| 2013/0074920 | A1 | 3/2013 | Echegoyen et al. |
| 2013/0333619 | A1 | 12/2013 | Omori et al. |
| 2014/0070236 | A1 | 3/2014 | Chen et al. |
| 2014/0110680 | A1 | 4/2014 | Choe |
| 2014/0186983 | A1 | 7/2014 | Kim et al. |
| 2014/0353601 | A1 | 12/2014 | Cho et al. |
| 2015/0287846 | A1 | 10/2015 | Helander et al. |
| 2016/0180763 | A1 | 6/2016 | Park et al. |

FOREIGN PATENT DOCUMENTS

| | | | | |
|---|---|---|---|---|
| CN | 1170383 | A | | 1/1998 |
| CN | 1596048 | A | | 3/2005 |
| CN | 102315390 | A | | 1/2012 |
| EP | 2 012 375 | A2 | | 7/2009 |
| JP | 07-224012 | A | | 8/1995 |
| JP | 2002-249765 | A | | 9/2002 |
| JP | 2004-327436 | A | | 11/2004 |
| JP | 2004-335610 | A | | 11/2004 |
| JP | 2007-005047 | A | | 1/2007 |
| JP | 2008-541356 | A | | 11/2008 |
| JP | 2009-016332 | A | | 1/2009 |
| JP | 2010-219447 | A | | 9/2010 |
| JP | 2011-181413 | A | | 9/2011 |
| JP | 2012-160702 | A | | 8/2012 |
| KR | 100838088 | B1 | * | 6/2008 ......... H01L 51/5234 |
| TW | 201237197 | A | | 9/2012 |
| WO | WO-2004/097954 | A1 | | 11/2004 |
| WO | WO-2006/121872 | A2 | | 11/2006 |
| WO | WO-2012/016074 | A1 | | 2/2012 |
| WO | WO-2014/071518 | A1 | | 5/2014 |

OTHER PUBLICATIONS

International Search Report and Written Opinion for International Patent Application No. PCT/IB2017/054970, dated Dec. 7, 2017, 9 pages.

* cited by examiner

LIGHT TRANSMISSIVE ELECTRODE FOR LIGHT EMITTING DEVICES

CROSS REFERENCE TO RELATED APPLICATION

This application is a National Stage Entry of International Application No. PCT/IB2017/054970, filed Aug. 15, 2017, which claims the benefit of and priority to U.S. Provisional Patent Application No. 62/375,223, filed Aug. 15, 2016, and U.S. Provisional Application No. 62/521,497, filed Jun. 18, 2017, the contents of which are incorporated herein by reference in their entirety.

TECHNICAL FIELD

The following generally relates to a thin film conductor and a method for forming such conductor. Specifically, a thin film conductor and a method for forming a thin film conductor for use as an electrode of an opto-electronic device are provided.

BACKGROUND

Organic light emitting diodes (OLEDs) typically include several layers of organic materials interposed between conductive thin film electrodes, with at least one of the organic layers being an electroluminescent layer. When a voltage is applied to the electrodes, holes and electrons are injected from an anode and a cathode, respectively. The holes and electrons injected by the electrodes migrate through the organic layers to reach the electroluminescent layer. When a hole and an electron are in close proximity, they are attracted to each other due to a Coulomb force. The hole and electron may then combine to form a bound state referred to as an exciton. An exciton may decay though a radiative recombination process, in which a photon is released. Alternatively, an exciton may decay through a non-radiative recombination process, in which no photon is released. It is noted that, as used herein, an internal quantum efficiency (IQE) will be understood to be a proportion of all electron-hole pairs generated in a device which decay through a radiative recombination process.

A radiative recombination process can occur as a fluorescence or phosphorescence process, depending on a spin state of the electron-hole pair (namely, an exciton). Specifically, the exciton formed by the electron-hole pair may be characterized as having a singlet or triplet spin state. Generally, radiative decay of a singlet exciton results in fluorescence, whereas radiative decay of a triplet exciton results in phosphorescence.

More recently, other light emission mechanisms for OLEDs have been proposed and investigated, including thermally activated delayed fluorescence (TADF). Briefly, TADF emission occurs through a conversion of triplet excitons into singlet excitons via a reverse inter system crossing process with the aid of thermal energy, followed by radiative decay of the singlet excitons.

An external quantum efficiency (EQE) of an OLED device may refer to a ratio of charge carriers provided to the OLED device relative to a number of photons emitted by the device. For example, an EQE of 100% indicates that one photon is emitted for each electron that is injected into the device. As will be appreciated, an EQE of a device is generally substantially lower than an IQE of the device. The difference between the EQE and the IQE can generally be attributed to a number of factors such as absorption and reflection of light caused by various components of the device.

An OLED can typically be classified as being either a "bottom-emission" or "top-emission" device, depending on a relative direction in which light is emitted from the device. In a bottom-emission device, light generated as a result of a radiative recombination process is emitted in a direction towards a base substrate of the device, whereas, in a top-emission device, light is emitted in a direction away from the base substrate. Accordingly, an electrode that is proximal to the base substrate is generally made to be light transmissive (e.g., substantially transparent or semi-transparent) and another electrode reflective in a bottom-emission device, whereas, in a top-emission device, an electrode that is distal to the base substrate is generally made to be light transmissive in order to reduce attenuation of light. Depending on the specific device structure, either an anode or a cathode may act as a transmissive electrode in top-emission and bottom-emission devices. As would be appreciated, it is generally favorable for a non-transmissive electrode of such one-sided emission devices (whether top-emission or bottom-emission) to be reflective or substantially reflective to enhance an output of light from the devices.

An OLED device also may be a double-sided emission device, which is configured to emit light in both directions relative to a base substrate. For example, a double-sided emission device may include a transmissive anode and a transmissive cathode, such that light from each pixel is emitted in both directions. In another example, a double-sided emission display device may include a first set of pixels configured to emit light in one direction, and a second set of pixels configured to emit light in the other direction, such that a single electrode from each pixel is light transmissive.

In addition to the above device configurations, a transparent or semi-transparent OLED devices also can be implemented, in which the device includes a transparent portion which allows external light to be transmitted through the device. For example, the transparent portion may be provided in a non-emissive region between each neighboring pixels. Transparent or semi-transparent OLED devices may be bottom-emission, top-emission, or double-sided emission devices.

While either a cathode or an anode can be selected as a transmissive electrode, a typical top-emission device includes a light transmissive cathode. Materials which are typically used to form the transmissive cathode include transparent conducting oxides (TCOs), such as indium tin oxide (ITO) and zinc oxide (ZnO). Transparent conducting oxides are typically deposited by a sputtering process, in which a target is bombarded to produce sputtered atoms. The sputtered atoms then travel to a desired substrate surface to be deposited thereon. However, since sputtered atoms generally possess a high kinetic energy, there is a relatively high likelihood of any organic or inorganic semiconductor layers formed on the substrate surface becoming damaged during a sputtering process. Accordingly, sputtered films are generally undesirable for use as a top-emission electrode, particularly in cases where the top-emission electrode is to be disposed directly on top of sensitive organic semiconductor layers.

Thin films, such as those formed by depositing a thin layer of silver (Ag), aluminum (Al), or various metallic alloys such as magnesium silver (Mg:Ag) alloy and ytterbium silver (Yb:Ag) alloy with compositions ranging from about 1:9 to 9:1 by volume, may also be used to form a transmissive cathode. A multi-layered cathode including two or more layers of TCOs and/or thin metal films also can be used. However, these materials generally provide relatively poor trade-off between light transmission and resistivity. Moreover, the use of metals such as silver and/or aluminum specify that such materials are deposited by thermal evaporation at high temperatures in excess of 1000° C., which can cause degradation or damages to a substrate and/or organic semiconductor layers onto which the materials are deposited. For a multi-layered cathode, two or more separate deposition steps are generally involved to achieve such construction. Since each additional deposition step that is introduced into a production process generally increases cost and may introduce additional device defects to result in lower yield, it may be difficult to incorporate such multi-layered cathode into a device structure.

Particularly in the case of thin films, a relatively thin layer thickness of up to about a few tens of nanometers contributes to enhanced transparency and favorable optical properties (e.g., reduced microcavity effects) for use in OLEDs. However, a reduction in the thickness of a transmissive electrode is generally accompanied by an increase in its sheet resistance. An electrode with a high sheet resistance is generally undesirable for use in OLEDs, since it creates a large voltage drop when a device is in use, which is detrimental to the performance and efficiency of OLEDs.

Specifically for a top-emission active matrix OLED (AMOLED) display device, a thin layer of a substantially transparent conductive material may be used to form a cathode that is common to all pixels or sub-pixels of the display device (e.g., a "common cathode"). However, as stated above, a transmissive common cathode having a relatively thin average thickness across an entire device area would possess a relatively high sheet resistance. One way of compensating for the high sheet resistance of the common cathode and an associated increase in a current-resistance (IR) drop of each diode is to provide a larger power supply (VDD) to each diode. However, when the VDD is increased, other voltages supplied to a thin-film transistor (TFT) also should be increased to maintain proper operation of the diode, which is unfavorable due to increased power consumption.

SUMMARY

According to some embodiments, an opto-electronic device includes: (1) a first electrode; (2) at least one semiconductor layer disposed over the first electrode, the semiconductor layer including an emissive layer; and (3) a second electrode disposed over the semiconductor layer. The second electrode includes a fullerene-containing magnesium alloy which includes a non-zero amount of a fullerene of up to about 15 vol. % of the fullerene, and the second electrode has a thickness of about 50 nm or less.

According to some embodiments, an opto-electronic device includes: (1) a first electrode; (2) at least one semiconductor layer disposed over the first electrode, the semiconductor layer including an emissive layer; (3) a fullerene-containing coating disposed over the semiconductor layer; and (4) a light transmissive, second electrode disposed over the fullerene-containing coating. The light transmissive, second electrode includes a metallic coating which includes a non-zero amount of a fullerene.

According to some embodiments, a method of manufacturing an opto-electronic device includes: (1) providing a substrate; and (2) depositing magnesium and a fullerene to form a light transmissive electrode over the substrate, where depositing magnesium and the fullerene is such that the light transmissive electrode includes a non-zero amount of the fullerene of up to 15 vol. % of the fullerene, and the light transmissive electrode has a thickness of 30 nm or less.

BRIEF DESCRIPTION OF THE DRAWINGS

Some embodiments will now be described by way of example with reference to the appended drawings wherein.

DETAILED DESCRIPTION

Figure 1:
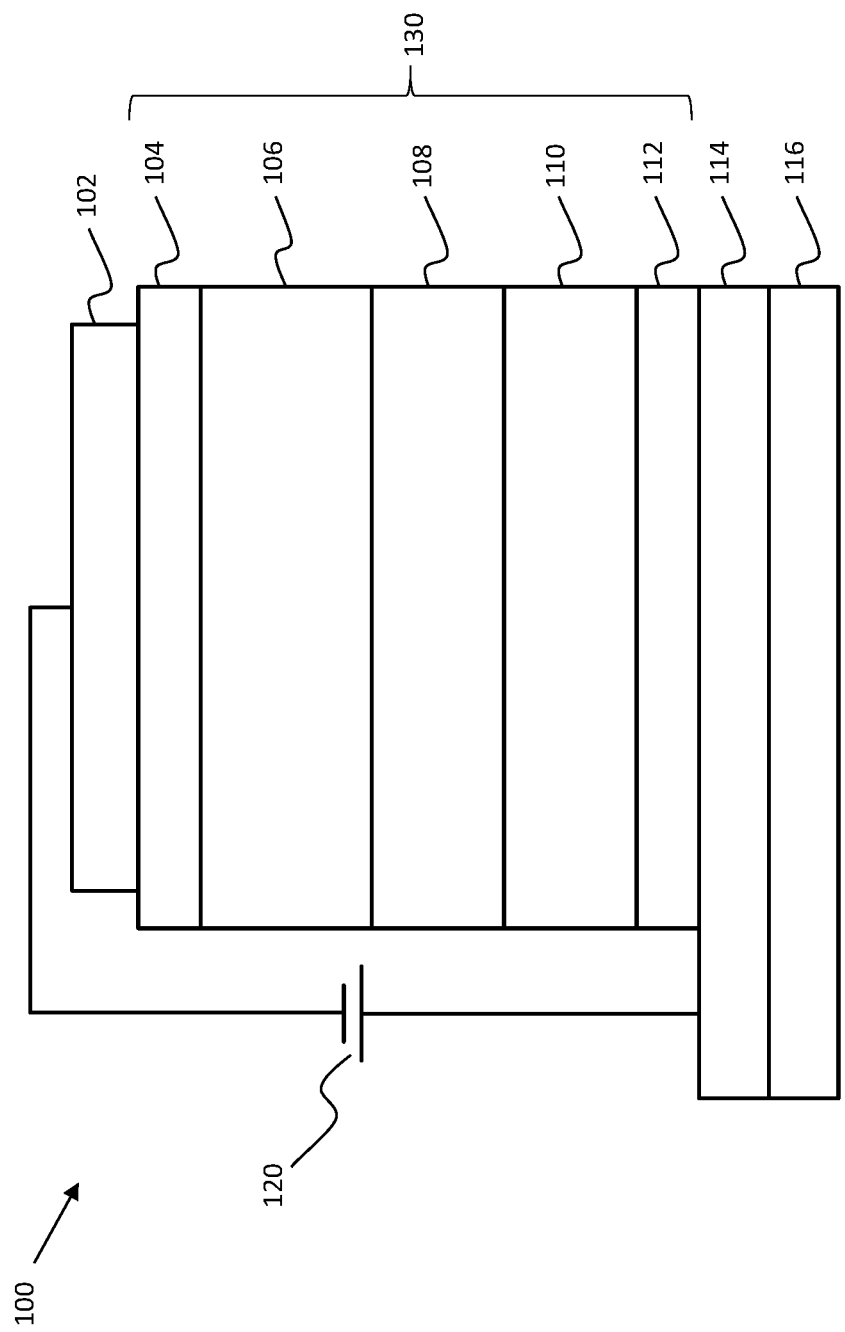
FIG. 1 is a schematic illustration of an OLED device according to an embodiment.

It will be appreciated that for simplicity and clarity of illustration, where considered appropriate, reference numerals may be repeated among the figures to indicate corresponding or analogous components. In addition, numerous specific details are set forth in order to provide a thorough understanding of the example embodiments described herein. However, it will be understood by those of ordinary skill in the art that the example embodiments described herein may be practised without some of these specific details. In other instances, certain methods, procedures and components have not been described in detail so as not to obscure the example embodiments described herein.

In one aspect according some embodiments, an electronic device is provided. In some embodiments, the electronic device includes a first electrode, a set of one or more semiconductor layers disposed over the first electrode, and a second electrode disposed over the set of semiconductor layers. In some embodiments, the set of semiconductor layers includes an emissive layer. In some embodiments, the second electrode includes a conductive coating including magnesium and a fullerene. In some embodiments, the conductive coating may be substantially metallic, and thus may be referred to as a metallic coating. In some embodiments, the conductive coating includes a fullerene-containing magnesium alloy. In some embodiments, the electronic device is an opto-electronic device, such as an OLED device. For example, the second electrode is a light transmissive cathode for a top-emission OLED device.

FIG. 1 illustrates an OLED device according to an embodiment. The OLED device 100 includes a base substrate 116, an anode (or a first electrode) 114, semiconductor layers 130, and a cathode (or a second electrode) 102. In the illustrated embodiment, the semiconductor layers 130 include a hole injection layer 112, a hole transport layer 110, an electroluminescence (EL) layer or emissive layer 108, an electron transport layer 106, and an electron injection layer 104. The semiconductor layers 130 may include one or more organic layers (e.g., layers that are substantially formed of organic materials). The OLED device 100 may be connected to a power source 120 for powering the OLED device 100.

The base substrate 116 may be a flexible or rigid substrate. The base substrate 116 may include, for example, silicon, glass, metal, polymer (e.g., polyimide), sapphire, or other materials suitable for use as the base substrate 116.

The hole injection layer 112 may be formed using a hole injection material which generally facilitates the injection of holes by the anode 114. The hole transport layer 110 may be formed using a hole transport material, which is generally a material that exhibits high hole mobility.

The emissive layer 108 may be formed, for example, by doping a host material with an emitter material. The emitter material may be a fluorescent emitter, a phosphorescent emitter, or a TADF emitter, for example. A plurality of emitter materials may also be doped into the host material to form the emissive layer 108.

The electron transport layer 106 may be formed using an electron transport material which generally exhibits high electron mobility. The electron injection layer 104 may be formed using an electron injection material, which generally acts to facilitate the injection of electrons by the cathode 102.

It will be understood that the structure of the device 100 may be varied by omitting or combining one or more layers. Specifically, one or more of the hole injection layer 112, the hole transport layer 110, the electron transport layer 106, and the electron injection layer 104 may be omitted from the device structure. One or more additional layers may also be present in the device structure. Such additional layers include, for example, a hole blocking layer, an electron blocking layer, a charge generation layer, an efficiency-enhancement layer, and additional charge transport and/or injection layers. Each layer may further include any number of sub-layers, and each layer and/or sub-layer may include various mixtures and composition gradients. It will also be appreciated that the device 100 may include one or more layers containing inorganic and/or organo-metallic materials, and is not limited to devices composed solely of organic materials. For example, the device 100 may include quantum dots.

In the embodiment of FIG. 1, the OLED device 100 is a top-emission device and thus the cathode 102 is light transmissive or substantially transparent or semi-transparent in the visible portion of the electromagnetic spectrum. As would be appreciated, by providing the light transmissive cathode 102, the likelihood of the cathode 102 unfavorably attenuating or affecting an output of light emitted from the device 100 is reduced.

In the illustrated embodiment, the cathode 102 is a thin film conductor having a relatively small thickness. For example, the thickness of the cathode 102 is a non-zero value of less than about 100 nm, such as about 60 nm or less, about 50 nm or less, about 40 nm or less, about 35 nm or less, about 30 nm or less, about 25 nm or less, about 20 nm or less, about 15 nm or less, from about 5 nm to about 50 nm, from about 5 nm to about 40 nm, from about 5 nm to about 35 nm, from about 5 nm to about 30 nm, from about 5 nm to about 25 nm, from about 5 nm to about 20 nm, from about 5 nm to about 15 nm, from about 10 nm to about 50 nm, from about 10 nm to about 40 nm, from about 10 nm to about 35 nm, from about 10 nm to about 30 nm, from about 10 nm to about 25 nm, from about 10 nm to about 20 nm, from about 15 nm to about 50 nm, from about 15 nm to about 40 nm, from about 15 nm to about 35 nm, from about 15 nm to about 30 nm, from about 15 nm to about 25 nm, or from about 15 nm to about 20 nm.

While other thin film conductors are suitable for use as a light transmissive electrode, it has now been found that a thin film or coating including magnesium and a fullerene exhibits particularly favorable properties for use as a light transmissive electrode.

Accordingly, in an embodiment, the cathode 102 includes a fullerene-containing magnesium alloy. As used herein, the term "fullerene-containing magnesium alloy" or "fullerene-dispersed magnesium alloy" shall be understood to refer to an alloy formed by a mixture or other combination of magnesium and a fullerene. For example, such alloy may be formed by co-evaporating magnesium and a fullerene in a thermal deposition process. For example, such alloy may be formed by evaporating a single source material including both magnesium and fullerene or by concurrently evaporating magnesium and fullerene from separate sources. In some embodiments, the cathode 102 is substantially devoid of a transparent conducting oxide (TOO), and the OLED device 100 omits a layer of a TCO directly adjacent to, or in contact with, the cathode 102.

As used herein, the term "fullerene" refers to a material including carbon molecules. Examples of fullerene molecules include carbon cage molecules including a three-dimensional skeleton that includes multiple carbon atoms, which form a closed shell, and which can be spherical or semi-spherical in shape. A fullerene molecule can be designated as $C_n$, where n is an integer corresponding to a number of carbon atoms included in a carbon skeleton of the fullerene molecule. Examples of fullerene molecules include $C_n$, where n is an integer in the range of 50 to 250, 60 to 84, or 60 or greater, such as $C_{60}$, $C_{70}$, $C_{72}$, $C_{74}$, $C_{76}$, $C_{78}$, $C_{80}$, $C_{82}$, $C_{84}$, and mixtures or other combinations thereof. Additional examples of fullerene molecules include carbon molecules in a tube or cylindrical shape, such as single-walled carbon nanotubes and multi-walled carbon nanotubes.

In some embodiments, a fullerene-containing magnesium alloy may include a non-zero amount of a fullerene of up to about 15 percentage by volume (vol. %) of the fullerene. For example, a fullerene-containing magnesium alloy may include a non-zero amount of a fullerene of about 15 vol. % or less, about 14 vol. % or less, about 13 vol. % or less, about 12 vol. % or less, about 11 vol. % or less, about 10 vol. % or less, from about 0.1 vol. % to about 15 vol. %, from about 0.1 vol. % to about 13 vol. %, from about 0.1 vol. % to about 10 vol. %, from about 1 vol. % to about 15 vol. %, from about 1 vol. % to about 13 vol. %, from about 1 vol. % to about 10 vol. %, from about 5 vol. % to about 15 vol. %, from about 5 vol. % to about 13 vol. %, or from about 5 vol. % to about 10 vol. %. In some embodiments, a fullerene-containing magnesium alloy may include non-zero amounts of two or more different fullerenes, in which case a combined amount of the fullerenes may be about 15 vol. % or less, about 14 vol. % or less, about 13 vol. % or less, about 12 vol. % or less, about 11 vol. % or less, about 10 vol. % or less, from about 0.1 vol. % to about 15 vol. %, from about 0.1 vol. % to about 13 vol. %, from about 0.1 vol. % to about 10 vol. %, from about 1 vol. % to about 15 vol. %, from about 1 vol. % to about 13 vol. %, from about 1 vol. % to about 10 vol. %, from about 5 vol. % to about 15 vol. %, from about 5 vol. % to about 13 vol. %, or from about 5 vol. % to about 10 vol. %.

In some embodiments, magnesium (or Mg) may constitute at least a majority, or more than a majority, of a fullerene-containing magnesium alloy, in terms of percentage by volume. In some embodiments, a remainder of a fullerene-containing magnesium alloy substantially comprises magnesium. For example, in such embodiments, a fullerene-containing magnesium alloy may include a non-zero amount of a fullerene of up to about 15 vol. %, and magnesium may constitute at least about 90% of a remaining volume of the alloy, such as at least about 93%, at least about 95%, at least about 98%, at least about 99%, at least about 99.5%, or at least about 99.9% of the remaining volume. As another example, in such embodiments, a fullerene-containing magnesium alloy may include a non-zero amount of a fullerene of up to about 15 vol. %, and a remainder of the alloy may consist of, or may consist essentially of, magnesium. While it will be appreciated that there may be some impurities present in an alloy, which may be introduced, for example, due to impurities in source materials or contamination during a deposition process, any such impurities would generally comprise a relatively small fraction of an overall composition of the alloy and may not substantially affect properties of the alloy.

In some embodiments, a fullerene-containing magnesium alloy may be polycrystalline and may include constituent grains having grain sizes or an average grain size of about 30 nm or greater, about 35 nm or greater, about 40 nm or greater, about 45 nm or greater, about 50 nm or greater, from about 30 nm to about 70 nm, from about 35 nm to about 70 nm, from about 40 nm to about 70 nm, from about 45 nm to about 70 nm, from about 50 nm to about 70 nm, from about 30 nm to about 65 nm, from about 35 nm to about 65 nm, from about 40 nm to about 65 nm, from about 45 nm to about 65 nm, from about 50 nm to about 65 nm, from about 30 nm to about 60 nm, from about 35 nm to about 60 nm, from about 40 nm to about 60 nm, from about 45 nm to about 60 nm, or from about 50 nm to about 60 nm.

It has now been found that a sheet resistance of a magnesium-based electrode may be reduced and a light transmittance of the magnesium-based electrode may be increased, by providing a relatively small and non-zero amount of a fullerene to form a fullerene-containing magnesium alloy. This is surprising since a conductivity of a fullerene (e.g., $C_{60}$) by itself is relatively low compared to that of substantially pure magnesium. Specifically, a thin film formed of a fullerene-containing magnesium alloy has been found to exhibit a lower sheet resistance and a higher light transmittance compared to a thin film of comparable thickness formed of substantially pure magnesium. In some embodiments, a fullerene-containing magnesium alloy including a relatively small and non-zero amount of a fullerene is metallic or exhibits a charge transport property that is metallic, as compared with the inclusion of a higher amount of the fullerene that results in a semiconductor material having a less favorable charge transport property (e.g., a higher sheet resistance). In some embodiments, a combination of a reduced sheet resistance and an increased light transmittance may be attained by a fullerene-containing magnesium alloy in the form of a thin film having a relatively small thickness and a relatively small and non-zero amount of a fullerene, such as where (1) the thickness is about 50 nm or less, about 40 nm or less, about 30 nm or less, about 25 nm or less, about 20 nm or less, about 15 nm or less, from about 5 nm to about 50 nm, from about 5 nm to about 40 nm, from about 5 nm to about 30 nm, from about 5 nm to about 25 nm, from about 5 nm to about 20 nm, from about 5 nm to about 15 nm, from about 10 nm to about 50 nm, from about 10 nm to about 40 nm, from about 10 nm to about 30 nm, from about 10 nm to about 25 nm, from about 10 nm to about 20 nm, from about 15 nm to about 50 nm, from about 15 nm to about 40 nm, from about 15 nm to about 30 nm, from about 15 nm to about 25 nm, or from about 15 nm to about 20 nm; and (2) the non-zero amount of the fullerene is about 15 vol. % or less, about 14 vol. % or less, about 13 vol. % or less, about 12 vol. % or less, about 11 vol. % or less, about 10 vol. % or less, from about 0.1 vol. % to about 15 vol. %, from about 0.1 vol. % to about 13 vol. %, from about 0.1 vol. % to about 10 vol. %, from about 1 vol. % to about 15 vol. %, from about 1 vol. % to about 13 vol. %, from about 1 vol. % to about 10 vol. %, from about 5 vol. % to about 15 vol. %, from about 5 vol. % to about 13 vol. %, or from about 5 vol. % to about 10 vol. %.

In some embodiments, a light transmissive electrode has (1) a sheet resistance of about 25 Ω/sq or less, about 20 Ω/sq or less, about 15 Ω/sq or less, about 10 Ω/sq or less, from about 3 Ω/sq to about 25 Ω/sq, from about 4 Ω/sq to about 25 Ω/sq, from about 4 Ω/sq to about 20 Ω/sq, from about 4 Ω/sq to about 15 Ω/sq, from about 4 Ω/sq to about 10 Ω/sq, from about 5 Ω/sq to about 25 Ω/sq, from about 5 Ω/sq to about 20 Ω/sq, from about 5 Ω/sq to about 15 Ω/sq, from about 5 Ω/sq to about 10 Ω/sq, from about 8 Ω/sq to about 25 Ω/sq, from about 8 Ω/sq to about 20 Ω/sq, from about 8 Ω/sq to about 15 Ω/sq, or from about 8 Ω/sq to about 10 Ω/sq, and (2) a visible light transmittance of about 15% or greater, about 20% or greater, about 25% or greater, about 30% or greater, about 35% or greater, about 40% or greater, about 50% or greater, about 60% or greater, from about 15% to about 80%, from about 15% to about 60%, from about 20% to about 60%, from about 25% to about 60%, from about 30% to about 60%, from about 35% to about 60%, from about 40% to about 60%, from about 15% to about 55%, from about 20% to about 55%, from about 25% to about 55%, from about 30% to about 55%, from about 35% to about 55%, from about 40% to about 55%, from about 15% to about 50%, from about 20% to about 50%, from about 25% to about 50%, from about 30% to about 50%, from about 35% to about 50%, or from about 40% to about 50%, where the visible light transmittance is measured at a wavelength of about 550 nm.

In some applications, it may be particularly desirable to select a composition and a thickness of a light transmissive electrode including a fullerene-containing magnesium alloy, such that a sheet resistance of the electrode is about 4 Ω/sq or greater, and a visible light transmittance of the electrode is greater than or equal to about 30 times the base 10 logarithm of the sheet resistance expressed in units of Ω/sq. In other words, a relationship between the visible light transmittance (as a percentage of light incident on such electrode) and the sheet resistance of such electrode can be expressed as follows:

$$\text{Transmittance}(\%) \geq 30 \times \log(R_s)$$

wherein $R_s$ is the sheet resistance of the electrode in Ω/sq.

It may be further desirable in some applications to select a composition and a thickness of a light transmissive electrode including a fullerene-containing magnesium alloy, such that a sheet resistance of the electrode is about 4 Ω/sq or greater, and a visible light transmittance of the electrode is greater than or equal to about 32 times, greater than or equal to about 35 times, greater than or equal to about 37 times, greater than or equal to about 40 times, greater than or equal to about 45 times, or greater than or equal to about 50 times the base 10 logarithm of the sheet resistance expressed in units of Ω/sq.

In some embodiments, a light transmissive electrode having low reflectance may be provided. For example, it has now been found that a light transmissive electrode formed by a fullerene-containing magnesium alloy having a relatively high fullerene composition, for example from about 7 vol. % to about 15 vol. %, from about 8 vol. % to about 15 vol. %, or from about 10 vol. % to about 15 vol. % fullerene, may exhibit relatively low reflectance. A light transmissive electrode having a low reflectance may be particularly desirable for use in some opto-electronic device applications (e.g. top-emission AMOLED devices) where reflection of external light off any device layer(s) may cause loss of contrast of the image projected by the device. Additionally, the use of low reflectance electrode may substantially reduce the likelihood of the light emitted by the device being reflected off a device layer (including an electrode), thus causing undesirable optical interference to occur.

In some embodiments, a light transmissive electrode having high reflectance may be provided. For example, it has now been found that a light transmissive electrode formed by a fullerene-containing magnesium alloy having a relatively low fullerene composition, for example a non-zero amount of fullerene less than about 7%, from about 0.1 vol. % to about 6 vol. %, from about 0.1 vol. % to about 5 vol. %, or from about 1 vol. % to about 5 vol. % fullerene, may exhibit relatively high reflectance. A light transmissive electrode having a high reflectance may be particularly desirable for use in some opto-electronic device applications (e.g. top-emission AMOLED devices) where a high reflectance of the electrode creates a strong microcavity structure, resulting in a higher degree of color purity for the light emitted from the device.

In some embodiments, a light transmissive electrode exhibiting a low degree of variation in light transmittance across the visible spectrum may be provided. For example, it has now been found that a light transmissive electrode formed by a fullerene-containing magnesium alloy having a relatively high fullerene composition, for example, from about 5 vol. % to about 15 vol. %, from about 5 vol. % to about 10 vol. %, or from about 8 vol. % to about 10 vol. % fullerene, may exhibit relatively high uniformity in light transmittance across the visible wavelength spectrum.

In some embodiments, a light transmissive electrode exhibiting a higher degree of light transmittance at certain wavelengths than at other wavelengths may be provided. For example, it has now been found that a light transmissive electrode formed by a fullerene-containing magnesium alloy having a relatively low fullerene composition of non-zero amount, for example, about 0.1 vol. % to about 4 vol. %, from about 0.1 vol. % to about 3 vol. %, or from about 0.1 vol. % to about 2 vol. % fullerene, may exhibit substantially higher light transmittance at around wavelengths of about 420 nm to about 440 nm (corresponding to blue) than at about 534 nm to about 545 nm (corresponding to green) or about 564 nm to about 580 nm (corresponding to red). In particular, such electrode may be particularly useful in top-emission AMOLED devices where the performance (e.g. efficiencies and lifetime) of blue emitters may be substantially lower than those of the green or red emitters. A top-emission common cathode, which preferentially transmits in the wavelength range corresponding to blue emission, may allow the device to operate for a longer period without substantial degradation of the overall device performance.

In some embodiments, a light transmissive electrode formed by a fullerene-containing magnesium alloy is provided. In a further embodiment, the fullerene-containing magnesium alloy contains a non-zero amount of a fullerene of up to 15 vol. % of the fullerene, and the light transmissive electrode has a thickness of 50 nm or less to allow transmission of light through the electrode, while maintaining sufficiently low sheet resistance for conducting electrical current. For example, the light transmissive electrode may exhibit a light transmittance of greater than about 20% at wavelengths corresponding to visible portion of the electromagnetic spectrum, and a sheet resistance greater than about 4 Ω/sq and less than about 100 Ω/sq.

Figure 2:
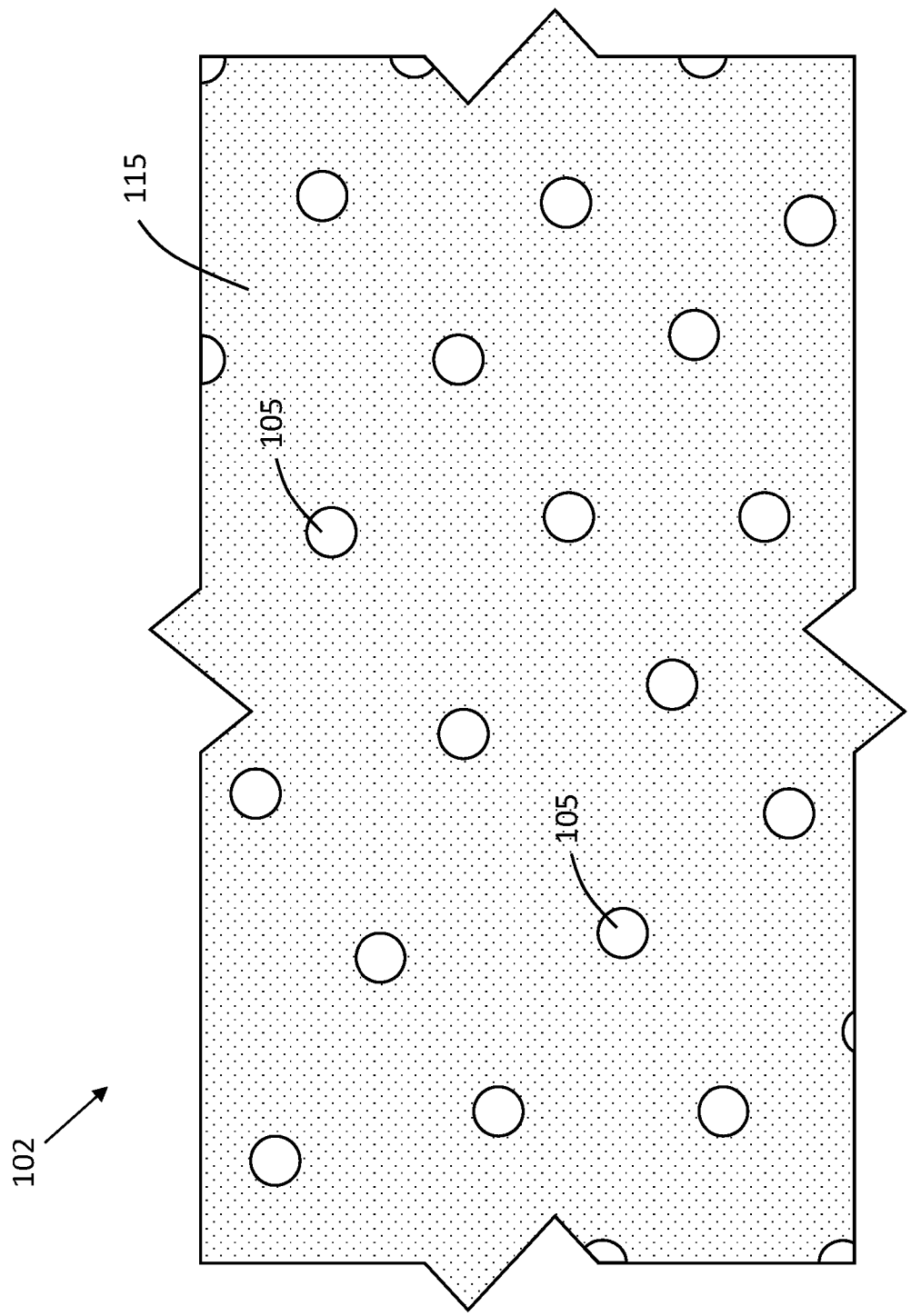
FIG. 2 is a schematic illustration of a portion of an electrode according to an embodiment.

In some embodiments, a fullerene may be dispersed substantially uniformly within a fullerene-containing magnesium alloy. FIG. 2 illustrates a portion of the cathode 102 incorporating a fullerene-containing magnesium alloy according to one such embodiment. In FIG. 2, fullerene molecules 105 are illustrated as being dispersed relatively uniformly within a magnesium matrix 115. As will be explained, a relatively uniform dispersion of a fullerene may be achieved, for example, by co-depositing the fullerene and magnesium at a substantially constant deposition rate to form the alloy for use in the cathode 102.

Figure 3A:
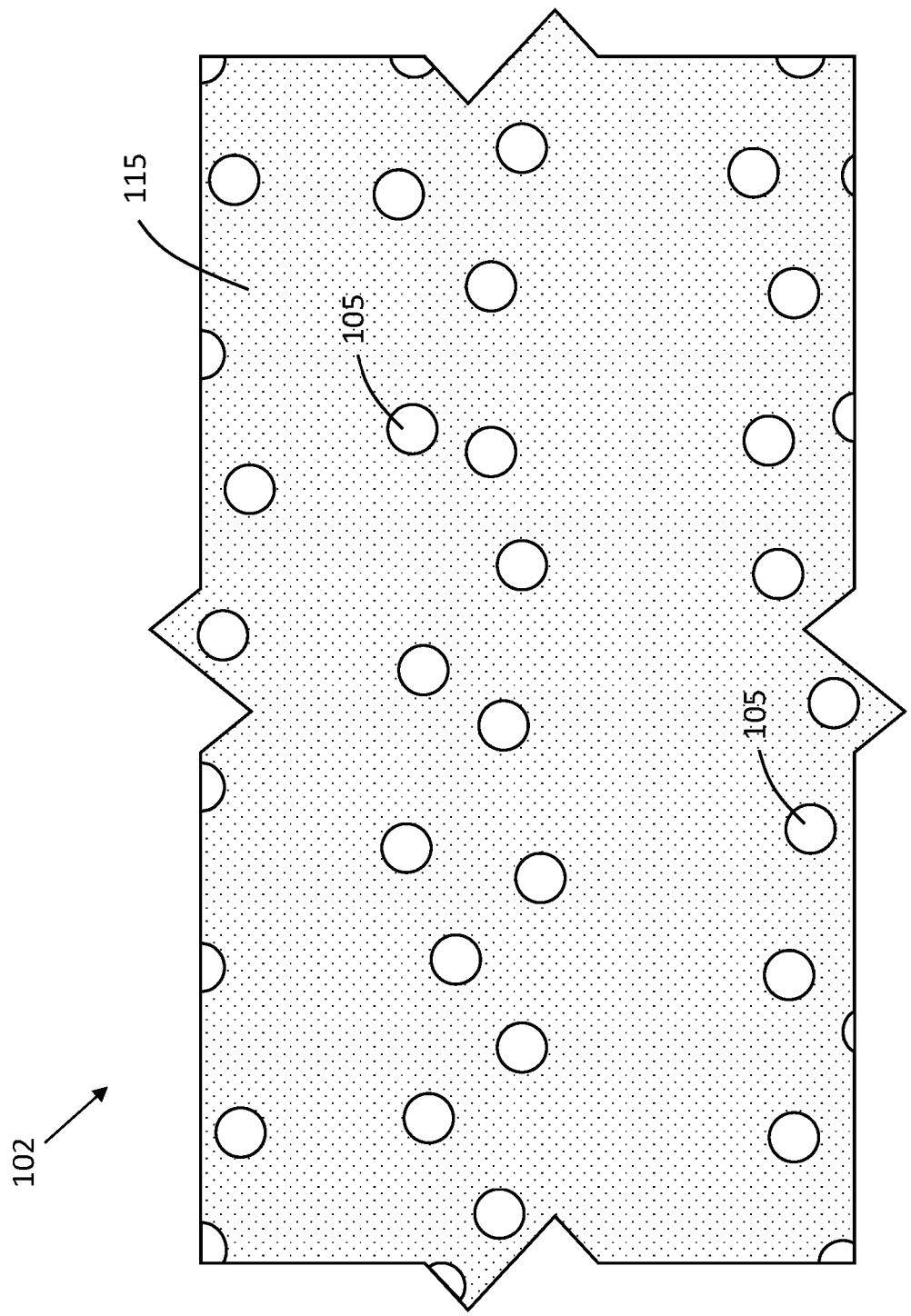
FIG. 3A is a schematic illustration of a portion of an electrode according to another embodiment.
Figure 3B:
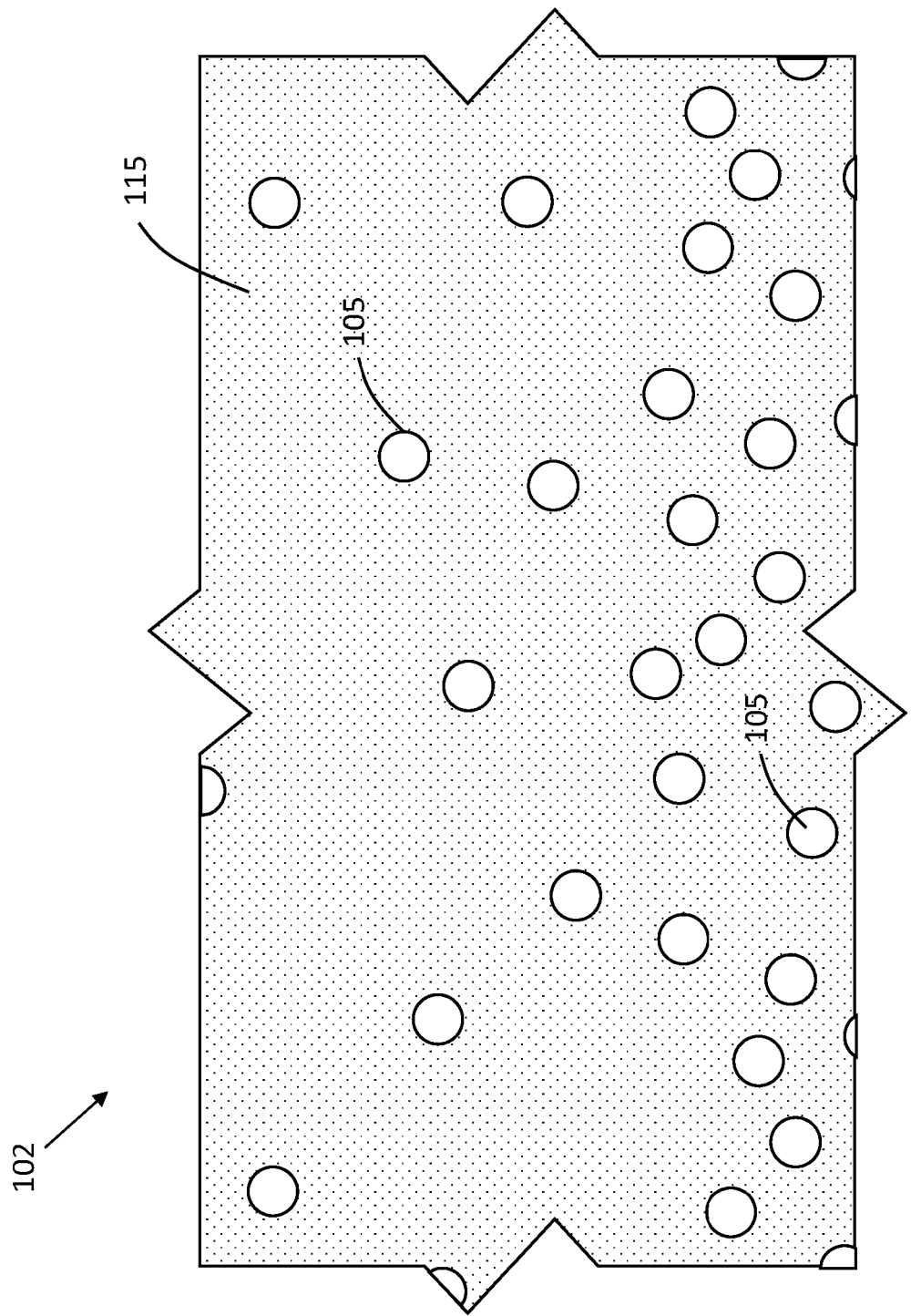
FIG. 3B is a schematic illustration of a portion of an electrode according to another embodiment.

In other embodiments, a composition of a fullerene-containing magnesium alloy forming a cathode may be varied by dispersing a fullerene non-uniformly within the alloy. FIG. 3A illustrates a portion of the cathode 102 incorporating such alloy according to an embodiment. In FIG. 3A, fullerene molecules 105 are illustrated as being present at a higher concentration in certain regions of the alloy than in other regions. For example, a non-uniform dispersion of a fullerene may be achieved by co-depositing the fullerene and magnesium and varying a deposition rate of the fullerene with respect to a deposition rate of magnesium. For example and referring to FIG. 3A, a concentration of the fullerene at or near interface(s) between the cathode 102 and an underlying layer (e.g., the electron injection layer 104 or another layer over which the cathode 102 is disposed) and/or an overlying layer (e.g., a layer disposed over the cathode 102) may be higher than an average concentration of the fullerene in the cathode 102. As another example and referring to FIG. 3B, a concentration of the fullerene may vary according to a concentration gradient so as to generally decrease from an interface between the cathode 102 and an underlying (or overlying) layer towards an interface between the cathode 102 and an overlying (or underlying) layer.

In other examples, a fullerene-containing magnesium alloy may be polycrystalline and may include constituent grains, which are separated from one another by grain boundaries. For example, such microstructure may be formed as a result of phase separation. In such alloy, the relative composition of fullerene may vary between different phases. For example, the alloy may contain a higher composition of fullerene in the grain boundaries than in the grains and vice versa. Accordingly, it will be appreciated that the fullerene composition of a fullerene-containing magnesium alloy may generally be determined based on the average composition of the layer or coating formed by such alloy, and any fullerene compositions or composition ranges described herein does not limit an alloy from containing higher or lower fullerene in localized portions thereof.

In some applications, it may be desirable to deposit a nucleation promoting coating to accelerate the formation of a thin film of a fullerene-containing magnesium alloy on some surfaces. For example, pure or substantially pure magnesium typically cannot be readily deposited onto an organic surface due to a low sticking probability of magnesium on various organic surfaces. Accordingly, in some embodiments, a surface on which an electrode is to be deposited is first treated by depositing a nucleation promoting coating thereon prior to the deposition of the electrode. The use of such nucleation promoting coating is further described in U.S. Patent Application Publication No. 2015/0287846, published on Oct. 8, 2015, and International Patent Application Publication No. WO 2017/072678, published on May 4, 2017, the contents of which are incorporated herein by reference in their entirety.

In some embodiments, a nucleation promoting coating may include a fullerene, such as including $C_n$, where n is an integer in the range of 50 to 250, 60 to 84, or 60 or greater, such as $C_{60}$, $C_{70}$, $C_{72}$, $C_{74}$, $C_{76}$, $C_{78}$, $C_{80}$, $C_{82}$, $C_{84}$, and mixtures or other combinations thereof. In some embodiments, a nucleation promoting coating may consist of, or may consist essentially of, a fullerene. More generally, suitable materials for use to form a nucleation promoting coating include those exhibiting or characterized as having an initial sticking probability for magnesium (or another material of an electrode) of at least about 0.6 (or 60%), at least about 0.7, at least about 0.75, at least about 0.8, at least about 0.9, at least about 0.93, at least about 0.95, at least about 0.98, or at least about 0.99. A nucleation promoting coating may be formed by a sub-monolayer, a monolayer, or several monolayers of a fullerene. For example, a nucleation promoting layer may be formed from about 0.1 to about 0.3 monolayers, from about 0.3 to about 0.5 monolayers, from about 0.5 to about 0.9 monolayers, from about 0.1 to about 1 monolayers, or about 1 or more monolayers of a fullerene. As used herein, depositing 1 monolayer of a material refers to an amount of the material to cover a desired area of a surface with a single layer of constituent molecules or atoms of the material. Similarly, as used herein, depositing 0.1 monolayer of a material refers to an amount of the material to cover 10% of a desired area of a surface with a single layer of constituent molecules or atoms of the material. Due to, for example, possible stacking or clustering of molecules or atoms, an actual thickness of a deposited material may be non-uniform. In some embodiments, a thickness (or an average thickness) of a nucleation promoting coating is a non-zero value of less than about 10 nm, such as about 8 nm or less, about 5 nm or less, about 3 nm or less, or about 2 nm or less, from about 0.1 nm to about 10 nm, from about 0.1 nm to about 8 nm, from about 0.1 nm to about 5 nm, from about 0.1 nm to about 3 nm, from about 0.1 nm to about 2 nm, from about 0.5 nm to about 10 nm, from about 0.5 nm to about 8 nm, from about 0.5 nm to about 5 nm, from about 0.5 nm to about 5 nm, from about 0.5 nm to about 3 nm, or from about 0.5 nm to about 2 nm. In some embodiments, a thickness of a nucleation promoting coating is less than a thickness of an overlying thin film including a fullerene-containing magnesium alloy. In some embodiments, it may be particularly advantageous to keep the amount of a fullerene for use as the nucleation promoting layer relatively low, since certain fullerenes may absorb light in the visible portion of the electromagnetic spectrum. For example, the nucleation promoting layer including the fullerene may have a thickness of between about 0.1 nm to about 3 nm, or about 1 nm to about 3 nm.

Various additive and subtractive processes of patterning a surface may be used to deposit a nucleation promoting coating including a fullerene. Examples of such processes include, but are not limited to, photolithography, microcontact transfer printing, printing (including ink or vapor jet printing and reel-to-reel printing), organic vapor phase deposition (OVPD), and laser induced thermal imaging (LITI) patterning, and combinations thereof.

In some applications, it may be desirable to provide an auxiliary electrode or a busbar structure to effectively reduce a sheet resistance of an electrode, such as a cathode. In some embodiments, a busbar structure is provided to be in electrical connection with a cathode. The busbar structure may be formed, for example, as a grid on top of the cathode to reduce the likelihood of the busbar structure affecting an optical output of a device. Specifically in an AMOLED device, apertures of a grid may correspond with emissive regions or pixels of the device such that a busbar structure does not substantially interfere with a device output.

Referring back to FIG. 1, the cathode 102 may be deposited using a physical vapor deposition (PVD) process, such as evaporative deposition, electron-beam physical vapor deposition, or sputtering. For example, the cathode 102 may be deposited using an evaporation process. As will be understood, an evaporation process is a type of PVD process, where one or more source materials are evaporated or sublimed under a vacuum environment and deposited on a target surface through condensation of the one or more evaporated source materials. A variety of different evaporation sources may be used for heating a source material, and as such, it will be appreciated that the source material may be heated in various ways. For example, the source material may be heated by an electric filament, electron beam, inductive heating, or resistive heating.

Figure 4:
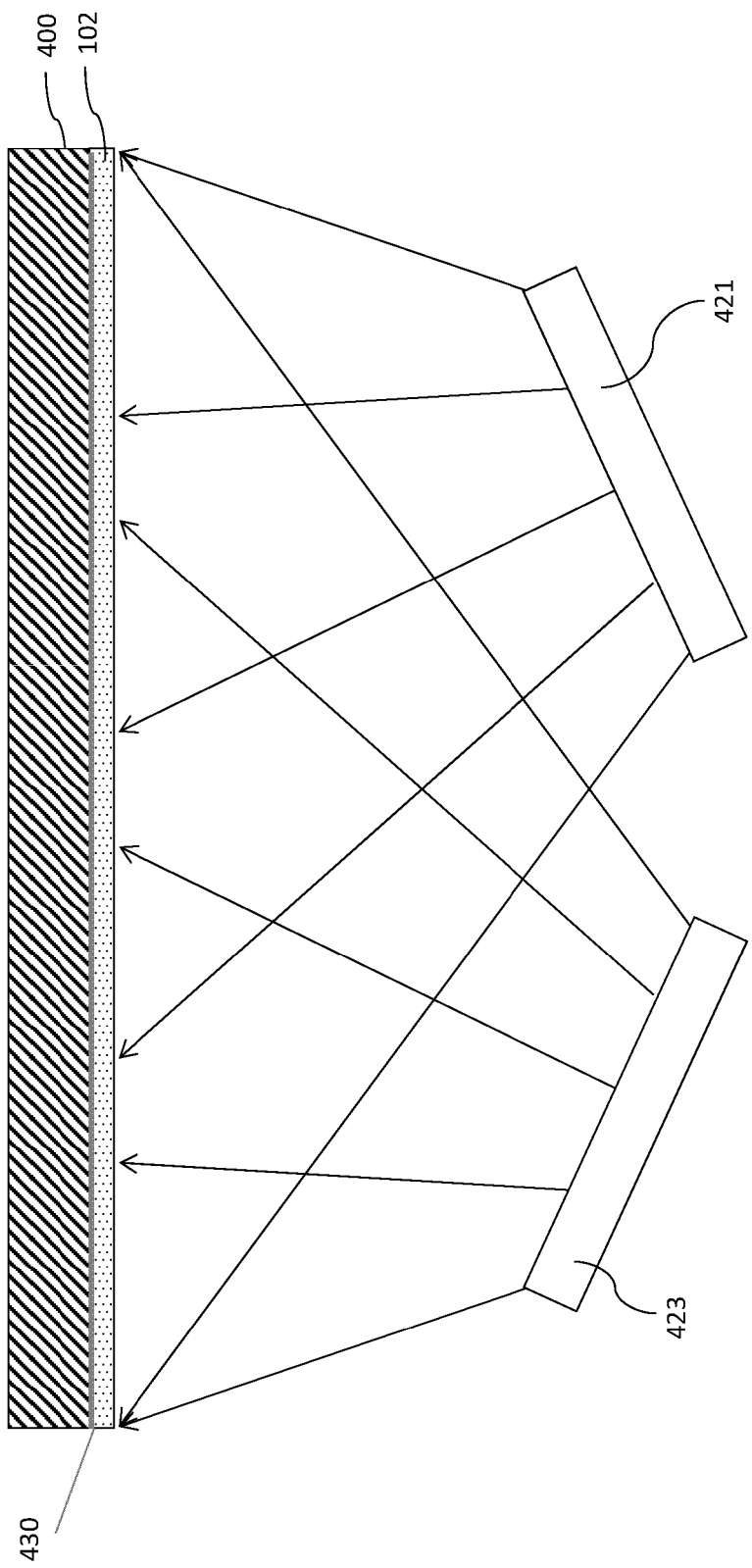
FIG. 4 is a schematic diagram illustrating a co-deposition process for forming an electrode according to one embodiment.

FIG. 4 illustrates an evaporation process according to one embodiment, in which a fullerene deposition source 421 and a magnesium deposition source 423 are used to deposit the cathode 102. The magnesium source 423 may include pure or substantially pure magnesium. Purity of magnesium may be about 95% or higher, about 98% or higher, about 99% or higher, or about 99.9% or higher. Deposition source materials used to deposit the cathode 102 may include other metals in place of, or in combination with, magnesium, such as copper (or Cu), ytterbium (or Yb), cadmium (or Cd), or zinc (or Zn).

In one embodiment, a fullerene is deposited onto a surface of a substrate 400 by initiating the deposition by the fullerene source 421 prior to initiating deposition by the magnesium source 423. In such an embodiment, the surface of the substrate 400 is treated by deposition of the fullerene, such that a fullerene-containing nucleation promoting coating 430 is formed on the surface of the substrate 400. It will be appreciated that the substrate 400 may include one or more additional organic and/or inorganic layers and a base substrate for supporting the additional organic and/or inorganic layers, such as shown in FIG. 1. According to such embodiment, the fullerene-containing nucleation promoting coating 430 is disposed at the interface formed between the fullerene-containing magnesium alloy coating and the underlying layer (e.g. the substrate 400).

The nucleation promoting coating 430 may not completely cover the surface of the substrate 400, thereby leaving at least a portion of the surface of the substrate 400 uncovered. Alternatively, the surface of the substrate 400 may be substantially completely covered by the fullerene. Once the surface of the substrate 400 has been treated, the magnesium source 423 may be actuated to initiate the deposition of magnesium, such that evaporated materials from both the magnesium source 423 and the fullerene source 421 are incident on the surface to form the cathode 102. The fullerene deposited on the surface of the substrate 400 may act as nucleation sites, which allow magnesium to bind to fullerene molecules and subsequently grow through further deposition of magnesium and the fullerene to form the cathode 102. The nucleation promoting coating 430 may be considered to be a part of the cathode 102, instead of a separate coating or layer.

In a further embodiment, a vapor flux emanating from the fullerene source 421 and/or the magnesium source 423 may be modulated during the deposition process of the cathode 102 to vary a concentration of the fullerene in certain regions of the resulting cathode 102. For example, the vapor flux from the fullerene source 421 may be reduced during certain phase(s) of the deposition process and increased during other phase(s) while keeping a vapor flux from the magnesium source 423 relatively constant throughout, such that the concentration of the fullerene in certain region(s) of the cathode 102 is lower than others. The vapor flux may be modulated, for example, by using a moveable shutter and/or by changing a deposition parameter such as a source temperature.

It will be appreciated that the magnesium source 423 may initiate the deposition of magnesium in advance of, or substantially simultaneously with, the fullerene source 421. However, in such cases, it is likely that at least a fraction of magnesium incident on the surface of the substrate 400 prior to the surface becoming treated by deposition of the fullerene would not adhere to the surface, particularly if the surface exhibits a relatively low initial sticking coefficient with respect to magnesium vapor. As such, in such cases, a thin film conductor would begin to form upon the surface being treated with the fullerene. However, it will be appreciated that the nucleation promoting coating 430 may be omitted or may not be present in some embodiments.

In some cases where the vapor flux from the fullerene source 421 is relatively low (e.g., about 1% of a total combined vapor flux) compared to the vapor flux from the magnesium source 423, a significantly longer deposition time may be involved to deposit a coating of a fullerene-containing magnesium alloy of a desired thickness onto certain target surfaces when such surfaces have not been treated by depositing a nucleation promoting coating thereon. Accordingly, it may be particularly advantageous to provide a nucleation promoting coating on a target surface prior to subjecting such surface to co-deposition of magnesium and a fullerene to decrease a deposition time for reaching a desired coating thickness. Without wishing to be bound by any particular theory, it is also postulated that a fullerene-containing magnesium alloy disposed over a nucleation promoting coating may exhibit more favorable charge injection properties into the underlying layers and/or provide more favorable layer interface, and thus may be particularly useful in forming a light transmissive electrode (e.g. a cathode) of an OLED device.

Figure 5:
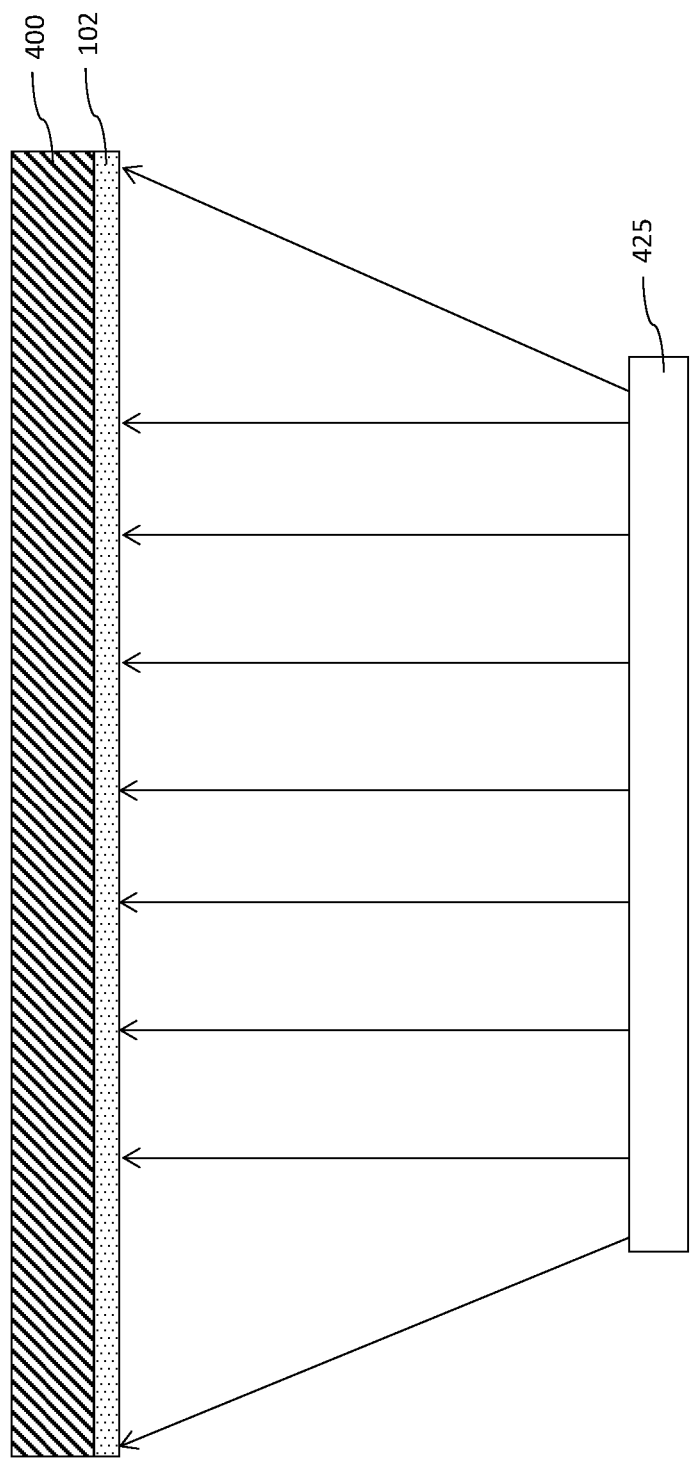
FIG. 5 is a schematic diagram illustrating an electrode deposition process according to another embodiment.

FIG. 5 illustrates an evaporation process according to another embodiment, in which a common evaporation source 425 is used to deposit the cathode 102. In such embodiment, the common evaporation source 425 may contain a mixture of magnesium and a fullerene, such that when the source 425 is actuated, both magnesium and the fullerene are deposited simultaneously from the source 425 to form the cathode 102 on the substrate 400.

By way of example, deposition conditions for $C_{60}$ may be about 430 to about 500° C. at a pressure of about $10^{-7}$ Torr, thereby producing a deposition rate on the order of about 0.1 angstroms per second. Deposition conditions for magnesium may be about 380 to about 430° C. in a Knudsen cell at a pressure of about $10^{-7}$ Torr, thereby producing a deposition rate on the order of about 2 or more angstroms per second. However, it will be appreciated that other deposition conditions may be used.

Figure 6:
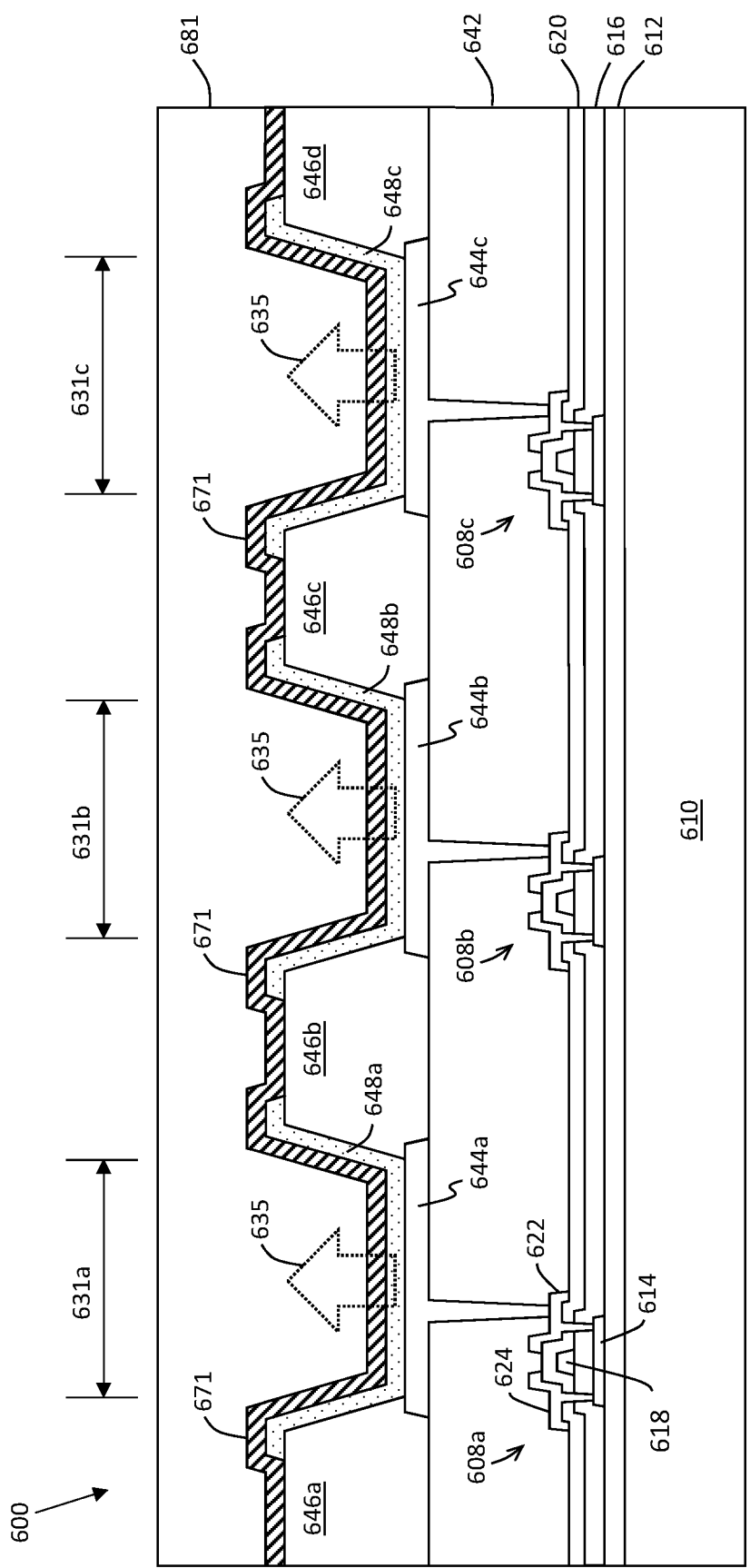
FIG. 6 is a schematic cross-sectional diagram illustrating a portion of an AMOLED device according to an embodiment.

FIG. 6 is a schematic cross-sectional diagram illustrating a portion of an AMOLED device 600 according to an embodiment.

In the embodiment of FIG. 6, the device 600 includes a backplane and a frontplane. The backplane includes one or more TFTs 608a-608c formed or disposed on a base substrate 610. A process of fabricating the one or more TFTs 608a-608c is described in reference to the TFT 608a. A buffer layer 612 is deposited over the base substrate 610. A semiconductor active area 614 is then formed over a portion of the buffer layer 612, and a gate insulating layer 616 is deposited to substantially cover the semiconductor active area 614. Next, a gate electrode 618 is formed on top of the gate insulating layer 616, and an interlayer insulating layer 620 is deposited. A source electrode 624 and a drain electrode 622 are formed such that they extend through openings formed through the interlayer insulating layer 620 and the gate insulating layer 616 to be connected with the semiconductor active layer 614. Once the TFTs 608a-608c have been formed, an insulating layer 642 may then be formed or disposed over the TFTs 608a-608c.

The device 600 includes a first emissive region 631a, a second emissive region 631b, and a third emissive region 631c. For example, the emissive regions 631a-631c may correspond to pixels or subpixels of the device 600. In the device 600, a first electrode 644a, 644b, or 644c is formed in each of the first emissive region 631a, the second emissive region 631b, and the third emissive region 631c, respectively. In the depicted embodiment, the first electrodes 644a-644c are anodes. The frontplane of the device 600 will now be described. As illustrated in FIG. 6, each of the first electrodes 644a-644c extends through an opening of the insulating layer 642 such that it is connected with the respective TFTs 608a-608c. Pixel definition layers (PDLs) 646a-646d are then formed or disposed to cover at least a portion of the first electrodes 644a-644c, including outer edges of each first electrode 644a-644c. For example, the PDLs 646a-646d may include an insulating organic or inorganic material. A semiconductor layer 648a, 648b, or 648c is then deposited over the respective first electrode 644a, 644b, or 644c, particularly in regions between the neighboring PDLs 646a-646d. Each of the semiconductor layers 648a-648c includes an emissive layer or an electroluminescent layer. Each of the semiconductor layers 648a-648c may further include any number of additional layers including charge transport and injection layers. A second electrode 671 is deposited to substantially cover the semiconductor layers 648a-648d and portions of the PDLs 1346a-d which are substantially free of, or exposed from, the semiconductor layers 648a-648d. The general direction in which light is emitted from each of the emissive regions 631a-631c is indicated by an arrow 635.

In the depicted embodiment, the second electrode 671 forms a common cathode across multiple emissive regions, including the emissive regions 631a-631c. The second electrode 671 may include a metallic coating including a fullerene-containing magnesium alloy. The descriptions of such fullerene-containing magnesium alloys, including methods for forming electrodes including such alloys, are provided above.

In some embodiments, an opto-electronic device includes: (1) a plurality of first electrodes, each of the plurality of first electrodes being electrically connected to one or more thin film transistors; (2) a plurality of pixel definition layers disposed in a region between neighboring first electrodes; (3) at least one semiconductor layer disposed over the plurality of first electrodes, the semiconductor layer including an emissive layer; (4) a fullerene-containing coating disposed over the semiconductor layer and the plurality of pixel definition layers; and (5) a second electrode disposed over the fullerene-containing coating. In a further embodiment, the second electrode includes a fullerene-containing magnesium alloy which includes a non-zero amount of a fullerene of up to about 15 vol. % of the fullerene. In another further embodiment, the second electrode has a thickness of about 50 nm or less.

Figure 7A:
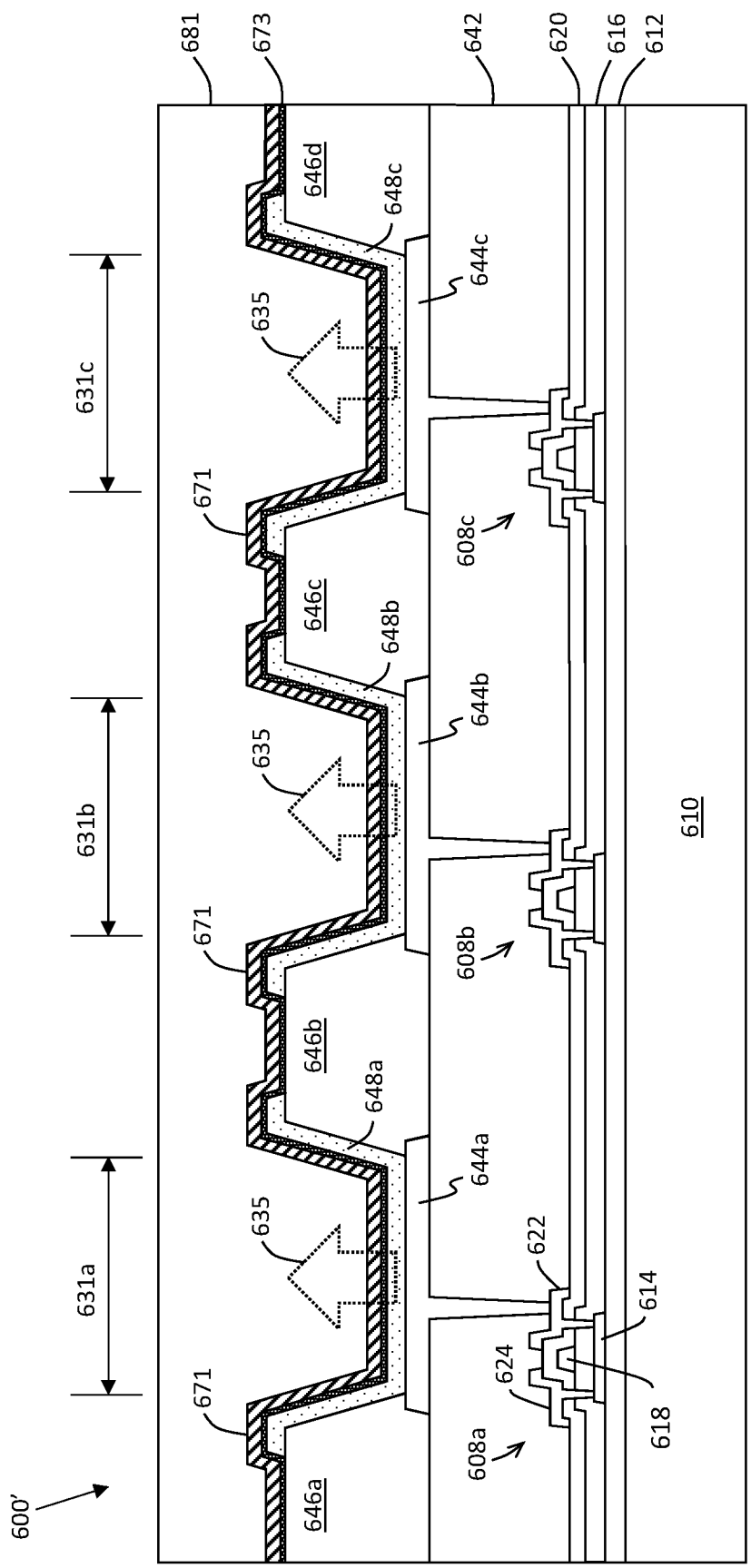
FIG. 7A is a schematic cross-sectional diagram illustrating a portion of an AMOLED device according to another embodiment.

FIG. 7A illustrates a device 600' according to an embodiment. The device 600' is similarly configured as the device 600 of FIG. 6, with at least one difference in that the device 600' also includes a nucleation promoting coating 673. In such embodiment, the second electrode 671 may include a metallic coating including a fullerene-containing magnesium alloy, and the nucleation promoting coating 673 may include a fullerene, which may be the same as or different from a fullerene included in the second electrode 671. The nucleation promoting coating 673 is disposed at an interface between the metallic coating and an underlying surface onto which the second electrode 671 is disposed. Specifically in FIG. 7A, the nucleation promoting coating 673 is illustrated as being disposed to substantially cover surfaces of the semiconductor layers 648a-648c, and surfaces of the PDLs 646a-646d. The presence of the nucleation promoting coating 673 may facilitate the deposition of the metallic coating over portions of the device 600', especially in cases where desired surfaces onto which the second electrode 671 is to be deposited (e.g., the surfaces of the semiconductor layers 648a-648c and/or the PDLs 646a-646d) are organic surfaces. The nucleation promoting coating 673 may be considered to be a part of the second electrode 671, instead of a separate coating or layer.

In both FIG. 6 and FIG. 7A, a capping layer 681 may optionally be formed or disposed over the second electrode 671 to enhance out-coupling of light emitted by the device 600 or 600'. It will be understood that the device 600 or 600' may include any number of additional layers, coating, and/or components. For example, the device 600 or 600' may further include a thin film encapsulation (TFE) layer or one or more barrier coatings. As will be appreciated, such TFE layer or barrier coatings may inhibit various device layers, including organic layers and a cathode which may be relatively easily oxidized, from being exposed to moisture and ambient air. For example, such barrier coating may be a thin film encapsulation formed by printing, chemical vapor deposition (CVD), sputtering, atomic-layer deposition (ALD), any combinations of the foregoing, or by any other suitable methods. Such barrier coating also may be provided by laminating a pre-formed barrier film onto the device 600 or 600' using an adhesive. For example, such barrier coating may be a multi-layer coating including organic materials, inorganic materials, or combination of both. The barrier coating may further include a getter material and/or a desiccant in some embodiments.

In some embodiments, the semiconductor layers may be formed as a common layer (e.g., continuously as a single layer) across multiple emissive regions, including the emissive regions 631a-631c. For example in such embodiments, a common semiconductor layer may include one or more emissive layers configured to emit substantially white light, which is filtered by a color filter to obtain a desired color output from each of the emissive regions 631a-631c.

Figure 7B:
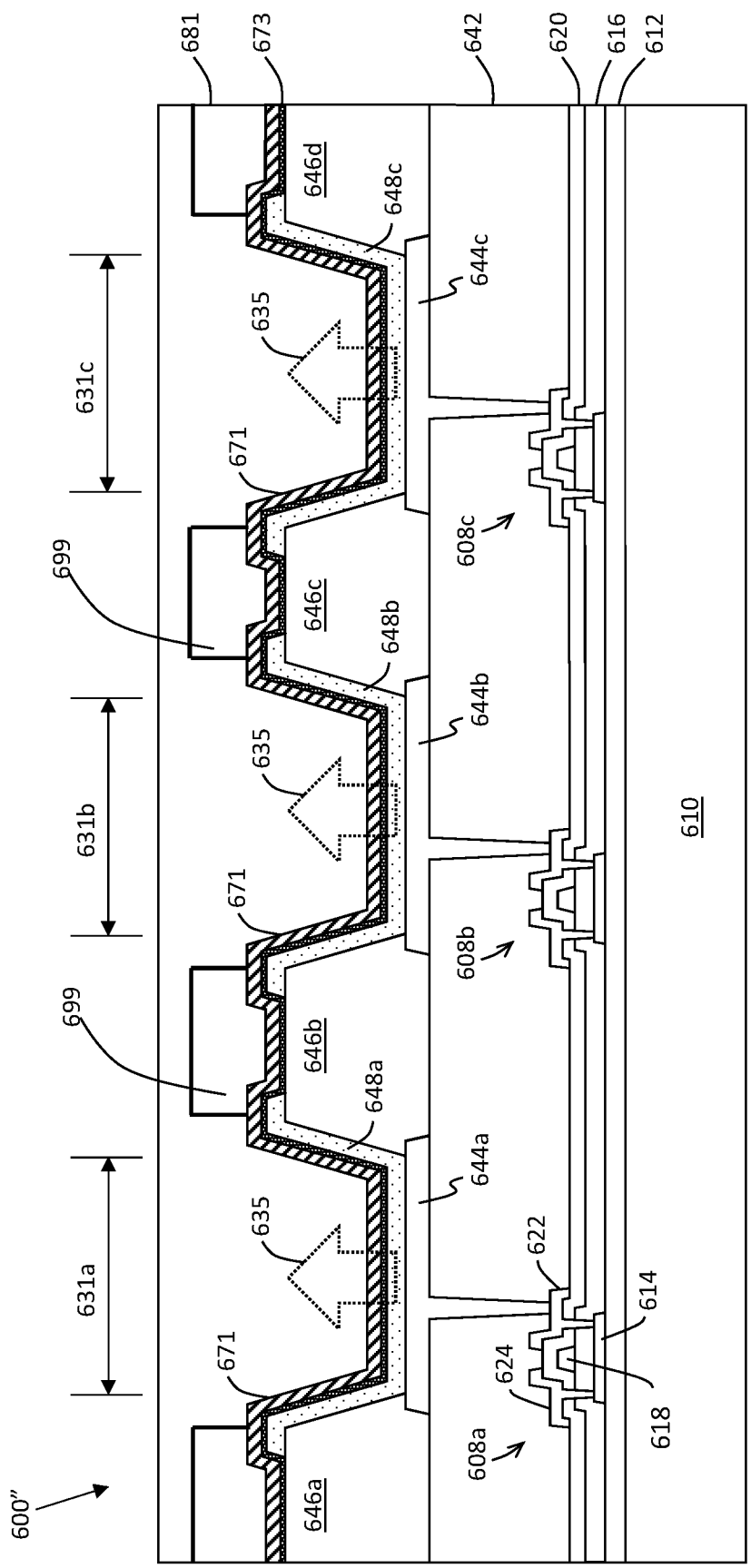
FIG. 7B is a schematic cross-sectional diagram illustrating a portion of an AMOLED device according to another embodiment.

In some embodiments, the device 600 or 600' may include one or more auxiliary electrodes or a busbar structure to effectively reduce a sheet resistance of the second electrode 671. For example and referring to a device 600" illustrated in FIG. 7B, an auxiliary electrode 699 is provided to be in electrical connection with the second electrode 671. The auxiliary electrode 699 may be formed, for example, as a grid or a series of buslines on top of the second electrode 671 in non-emissive regions (e.g., portions of the device 600" which do not correspond to the emissive regions 631a-631c which are exposed from the auxiliary electrode 699). For example, the auxiliary electrode 699 may be formed between neighboring ones of the emissive regions 631a-631c and over regions corresponding to the PDLs 646a-646d. A thickness of the auxiliary electrode 699 is greater than a thickness of the second electrode 671, such as at least about 1.2 times greater, at least about 1.5 times greater, at least about 1.8 times greater, at least about 2 times greater, at least about 5 times greater, or at least about 10 times greater. For example, the thickness of the auxiliary electrode 699 may be greater than about 50 nm, such as about 80 nm or greater, about 100 nm or greater, about 200 nm or greater, about 500 nm or greater, about 700 nm or greater, about 1000 nm or greater, about 1500 nm or greater, about 1700 nm or greater, or about 2000 nm or greater. The auxiliary electrode 699 may be formed by depositing substantially pure magnesium. Deposition of other metals or alloys in place of, or in combination with, magnesium can be used to form the auxiliary electrode 699.

Figure 7C:
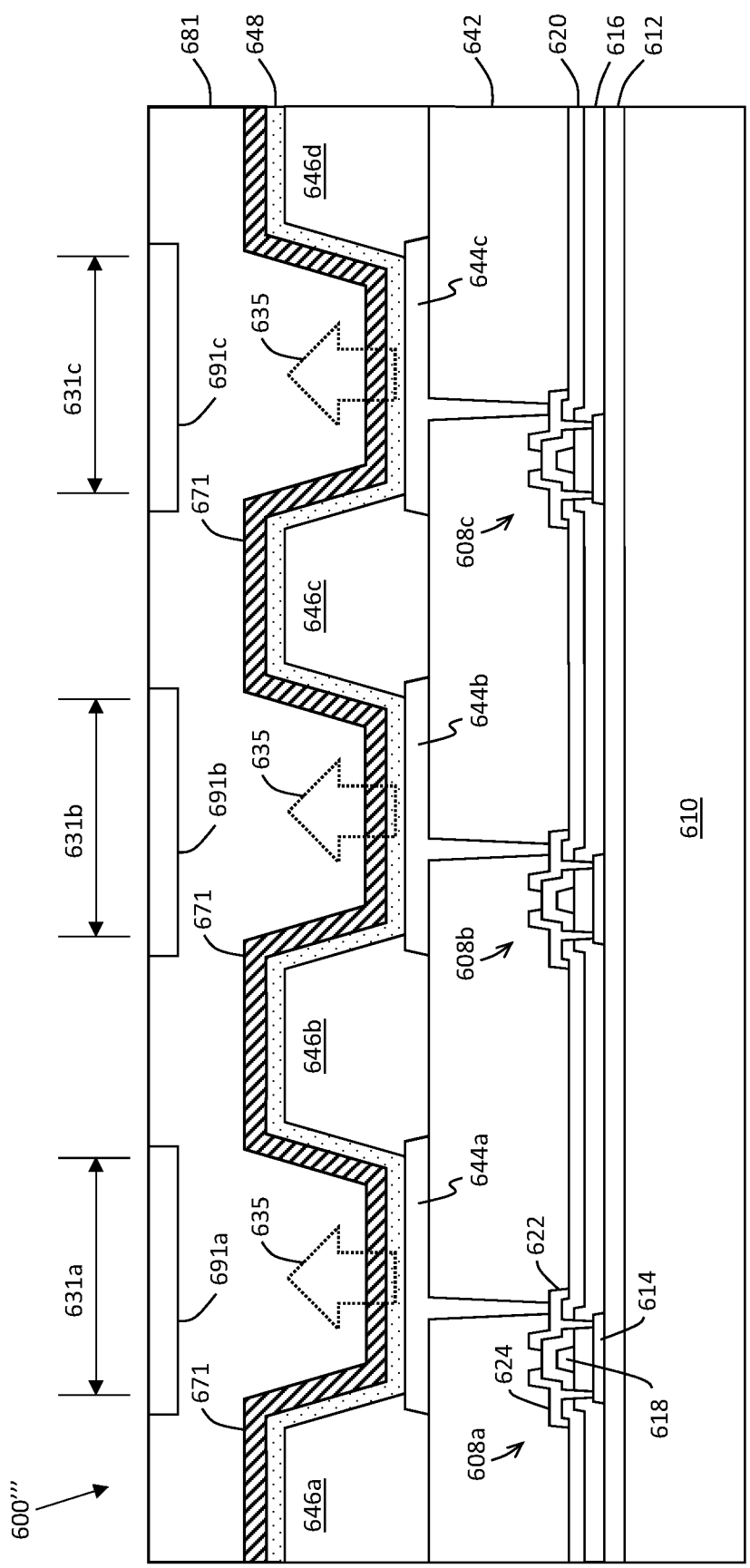
FIG. 7C is a schematic cross-sectional diagram illustrating a portion of an AMOLED device according to another embodiment.

FIG. 7C is a diagram illustrating a device 600''' according to one embodiment wherein the semiconductor layer 648 is formed as a common layer. Specifically, the semiconductor layer 648 is disposed over the surface of the anode 644a-c and the PDLs 646a-646d. For example, the semiconductor layer 648 may include emissive layers or emissive materials which emit substantially white light when electrical current is applied. For example, the semiconductor layer 648 may include a combination of red, green, and blue emissive layers or materials. In other examples, the semiconductor layer 648 may include a combination of yellow-green and blue emissive layers or materials. In yet another example, the semiconductor layer 648 may include a combination of yellow-green, red, and blue emissive layers or materials to emit substantially white light. A capping layer or TFE layer 681 may be provided over the second electrode 671. A color filter 691a-c may disposed over the capping layer or TFE layer 681. Each color filter 691a-c may be configured to filter the substantially white light emitted by the device 600''' from the emissive regions 631a-c to obtain the desired color output from each emissive region 631a-c. For example, a first color filter 691a may be configured to selectively transmit light having wavelengths corresponding to a red spectrum, a second color filter 691b may be configured to selectively transmit light having wavelengths corresponding to a green spectrum, and a third color filter 691c may be configured to selectively transmit light having wavelengths corresponding to a blue spectrum. The device 600''' may optionally include one or more auxiliary electrodes or a busbar structure, such as the one illustrated in the embodiment of FIG. 7B.

Although certain processes have been described with reference to evaporation, it will be appreciated that various other processes may be used. For example, deposition may be conducted using other PVD processes (including sputtering), CVD processes (including plasma enhanced chemical vapor deposition (PECVD)), or other suitable processes for depositing materials. In some embodiments, magnesium is deposited by heating a magnesium source material using a resistive heater. In other embodiments, a magnesium and/or a fullerene source material may be loaded in a heated crucible, a heated boat, a Knudsen cell (e.g., an effusion evaporator source), or any other type of evaporation source.

As will be understood, various layers and portions of a backplane, including a thin-film transistor (TFT) may be fabricated using a variety of suitable materials and processes. For example, the TFT may be fabricated using organic or inorganic materials, which may be deposited and/or processed using techniques such as CVD, PECVD, laser annealing, and PVD (including sputtering). As would be understood, such layers may be patterned using photolithography, which uses a photomask to expose selective portions of a photoresist covering an underlying device layer to UV light. Depending on the type of photoresist used, exposed or unexposed portions of the photomask may then be washed off to reveal desired portion(s) of the underlying device layer. A patterned surface may then be etched, chemically or physically, to effectively remove an exposed portion of the device layer.

Furthermore, while a top-gate TFT has been illustrated and described in certain embodiments above, it will be appreciated that other TFT structures may also be used. For example, the TFT may be a bottom-gate TFT. The TFT may be an n-type TFT or a p-type TFT. Examples of TFT structures include those utilizing amorphous silicon (a-Si), indium gallium zinc oxide (IGZO), and low-temperature polycrystalline silicon (LTPS).

Various layers and portions of a frontplane, including electrodes, one or more organic layers, a pixel definition layer, and a capping layer may be deposited using any suitable deposition processes, including thermal evaporation and/or printing. It will be appreciated that, for example, a shadow mask may be used as appropriate to produce desired patterns when depositing such materials, and that various etching and selective deposition processes may also be used to pattern various layers. Examples of such methods include, but are not limited to, photolithography, printing (including ink or vapor jet printing and reel-to-reel printing), OVPD, and LITI patterning.

While certain embodiment have been described with reference to a top-emission OLED device including a light transmissive cathode, it will be understood that a light transmissive anode may be provided instead of or in addition thereto. For example, the light transmissive electrode according to various embodiments and examples described herein may be used as a light tranmissive anode in an inverted OLED, wherein the anode is a common electrode. Furthermore, it will be appreciated that while certain embodiments have been described herein with reference to an electrode serving as a cathode of an OLED device, such electrode also may be used as an anode or any other electrode of an OLED device or any other electronic device. Accordingly, in some embodiments, an electronic device is provided, the electronic device comprising a fullerene-containing magnesium alloy coating. For example, such coating may be light transmissive. In another example, such coating may be a conductive coating. In a further example, such conductive coating may be an electrode of the electronic device. In other examples, such coating may be an optical coating or other types of coatings.

EXAMPLES

Aspects of some embodiments will now be illustrated and described with reference to the following examples, which are not intended to limit the scope of the present disclosure in any way.

Example 1

In order to characterize optical and electrical performance of a light transmissive electrode, various samples were prepared and their optical transmittance and sheet resistance were measured.

Evaluation Samples 1 to 4

A series of evaluation samples including the following structure was fabricated: Glass/organic layer (about 30 nm)/electrode/out-coupling layer (about 50 nm)/adhesive/barrier film. Specifically, the evaluation samples were prepared by depositing an about 30 nm thick layer of 2-(4-(9,10-di (naphthalene-2-yl)anthracene-2-yl)phenyl)-1-phenyl-1H-benzo-[D]imidazole (LG201), followed by the electrode having a composition of about 5 vol. % $C_{60}$ and about 95 vol. % Mg. An about 50 nm thick optical out-coupling layer was then provided over the electrode, and each sample was encapsulated by applying a barrier film with an adhesive. The thickness of the electrode ranged from about 10 nm to about 40 nm.

Figure 8:
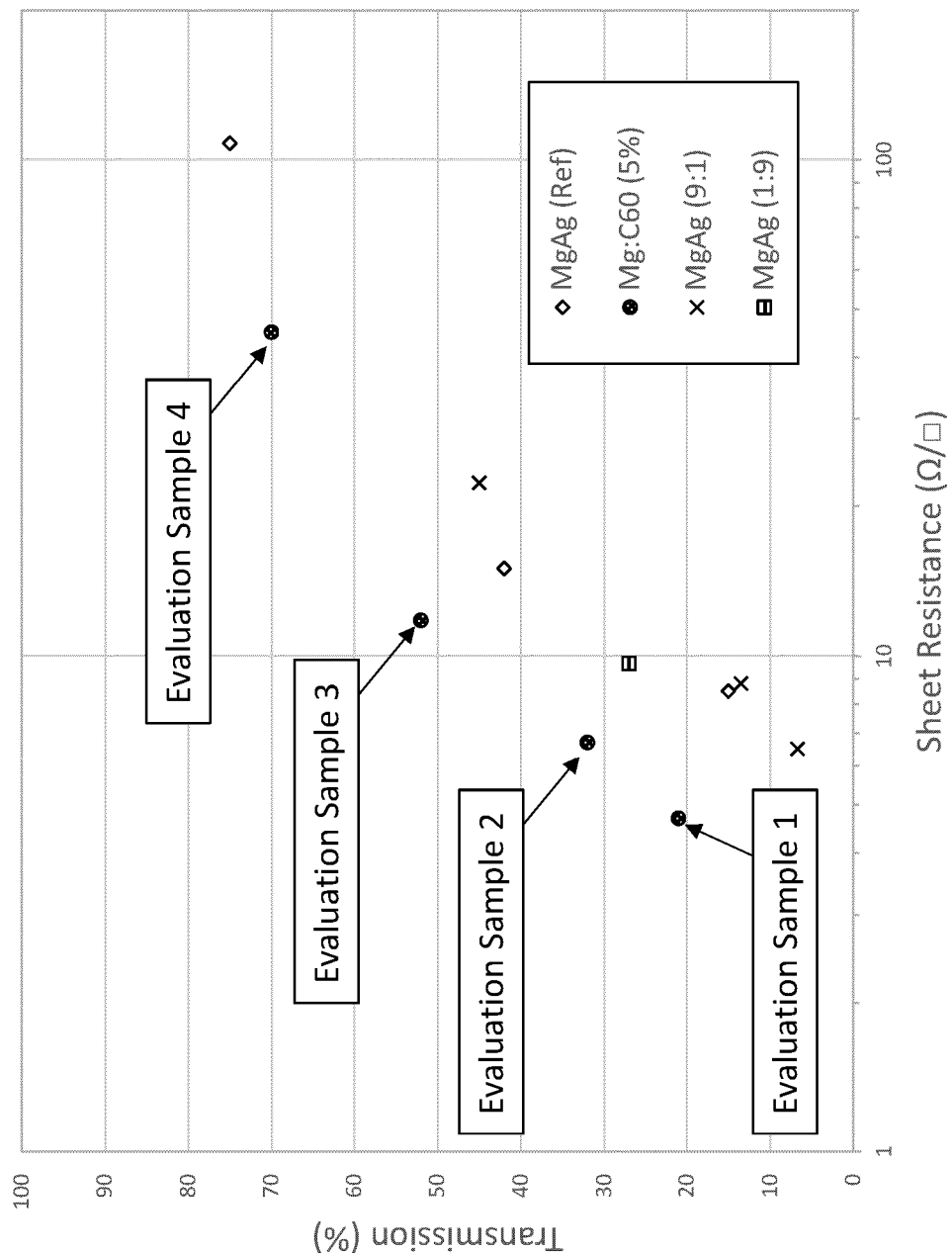
FIG. 8 shows a measured optical transmittance and a sheet resistance of evaluation samples.

FIG. 8 shows a measured optical transmittance and a sheet resistance of these evaluation samples. The sample with the highest electrode thickness (Evaluation Sample 1) was found to have the lowest transmittance of about 21% and the lowest sheet resistance of about 4.7 Ω/sq. In contrast, the sample with the lowest electrode thickness (Evaluation Sample 4) was found to have the highest transmittance of about 70% and the highest sheet resistance of about 45 Ω/sq.

In addition to the evaluation samples, comparative samples were fabricated with other electrode compositions. In particular, comparative samples including Mg:Ag electrodes with about 9:1 and about 1:9 composition ratios (by volume) with varying electrode thicknesses were fabricated and tested. The structures of the comparative samples were substantially identical to that of the evaluation samples. The transmission and sheet resistance of the comparative samples, as well as those reported in U.S. Pat. No. 8,018,137 for other reference Mg:Ag electrodes, are further provided in FIG. 8 to serve as a comparison.

Evaluation Sample 5

Figure 9:
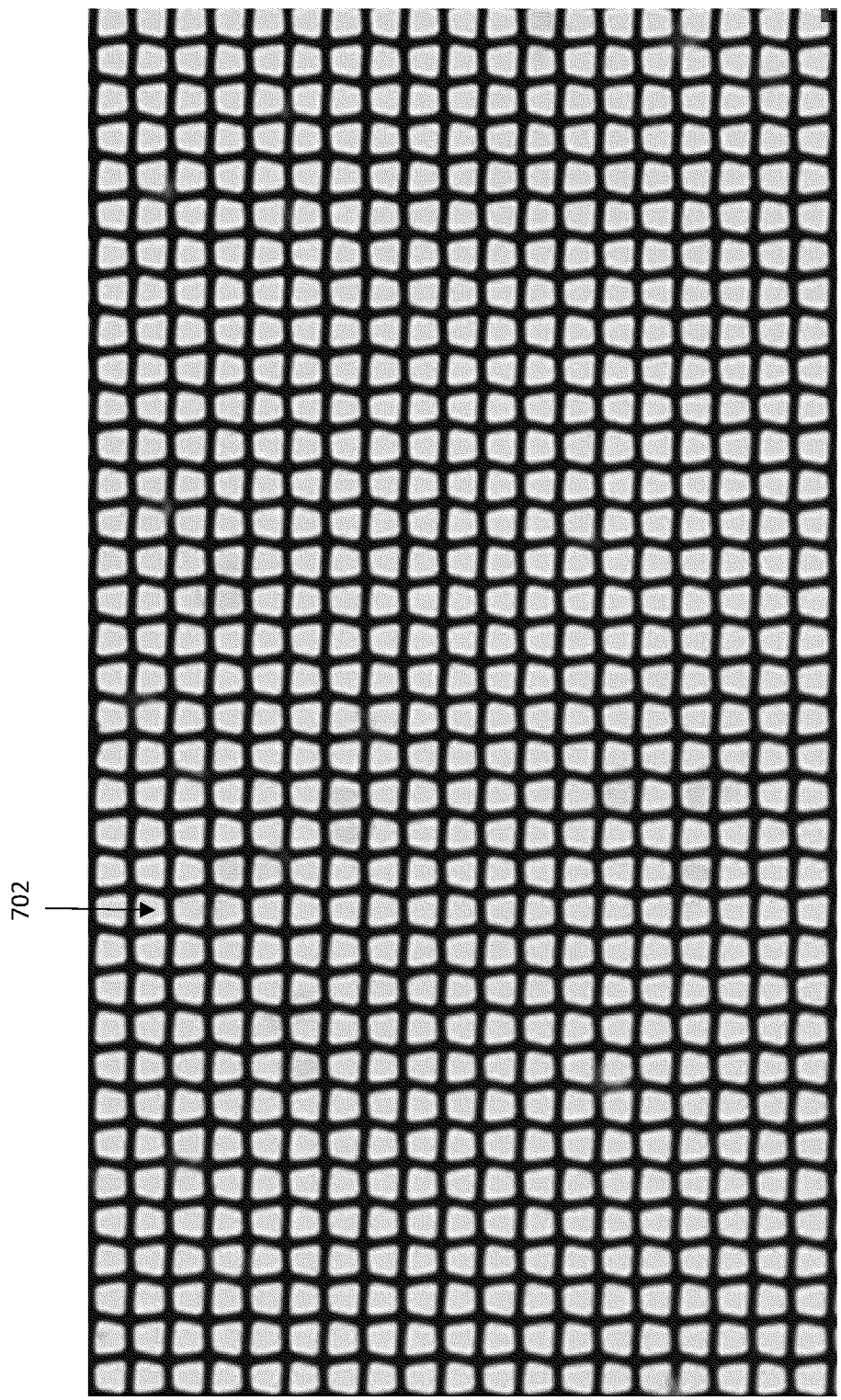
FIG. 9 shows a repeating grid pattern of a busbar structure.

An evaluation sample replicating a grid-patterned busbar structure was fabricated and analyzed. Specifically, Evaluation Sample 5 was fabricated according to the following structure: Glass/organic layer (about 30 nm)/busbar structure/out-coupling layer (about 50 nm)/adhesive/barrier film. The repeating grid pattern of the busbar structure is shown in FIG. 9, which illustrates a plurality of apertures 702 defined by the busbar structure. An average width or size of each aperture 702 was about 70 μm, and a thickness of the busbar structure was about 1 μm.

Evaluation Sample 6

In addition to the above, Evaluation Sample 6 was fabricated to incorporate the grid-patterned busbar structure of Evaluation Sample 5 on top of an electrode of Evaluation Sample 4. Specifically, Evaluation Sample 6 was fabricated according to the following structure: Glass/organic layer (about 30 nm)/electrode/busbar structure/out-coupling layer (about 50 nm)/adhesive/barrier film. The structure of Evaluation Sample 6 was substantially identical to that of Evaluation Sample 4 (including the electrode thickness), with the exception of the busbar structure being provided between the electrode and the out-coupling layer. The busbar structure of Evaluation Sample 6 was substantially identical to the busbar structure of Evaluation Sample 5.

Figure 10:
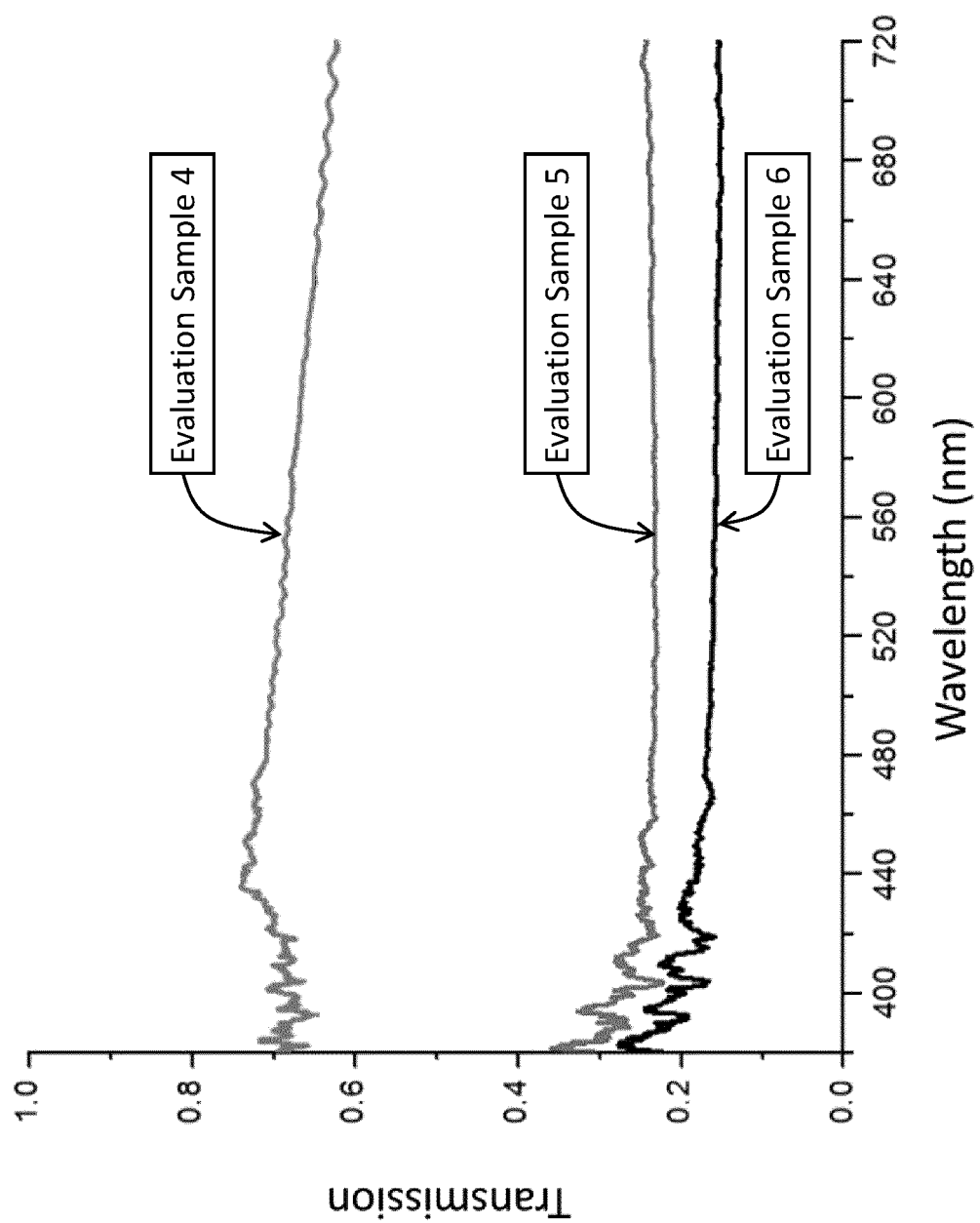
FIG. 10 is a plot showing transmission profiles of evaluation samples.

FIG. 10 is a plot showing transmission profiles of Evaluation Samples 4, 5, and 6, and transmission and sheet resistance measurements of these samples are summarized in Table 1 provided below.

TABLE 1

Transmission and sheet resistance measurements of Evaluation Samples 4-6

| | Transmission (%) | Aperture Transmission (%) | Sheet Resistance (Ω/sq) |
|---|---|---|---|
| Evaluation Sample 4 | 70 | — | 41 |
| Evaluation Sample 5 | 25 | 100 | 0.1 |
| Evaluation Sample 6 | 17.5 | 70 | 0.1 |

As can be seen from Table 1, Evaluation Sample 5 was found to exhibit a relatively low overall transmittance of about 25% due to the presence of the opaque busbar structure. Similarly, while a transmissive cathode of Evaluation Sample 4 was incorporated in Evaluation Sample 6, an overall transmittance of Evaluation Sample 6 was also relatively low (about 17.5%) due to the presence of the opaque busbar structure over the cathode.

However, when an aperture transmission was calculated according to the equation below, it was found that the presence of the busbar structure did not affect the transmission of light through apertures of the busbar structure to a measurable degree.

$$T_{aperture} = \frac{T_{cathode+grid}}{T_{grid}} = \frac{17.5\%}{25\%} = 70\% = T_{cathode}$$

Specifically, the aperture transmission in Table 1 and the equation above represent the transmittance of light through the apertures formed in the busbar structure (e.g. regions 702 illustrated in FIG. 9). Accordingly, the aperture transmission can be calculated by dividing the overall transmission of Evaluation Sample 6, which includes both the cathode and the busbar structure, with the overall transmission of Evaluation Sample 5, which includes just the busbar structure. Since the aperture transmission was calculated to be about 70%, which is substantially equal to the overall transmission of Evaluation Sample 4 (which includes just the cathode), it can be concluded that the presence of the busbar structure does not substantially affect the transmission of light through its apertures.

In view of the above, it can be seen that if a busbar structure is selectively provided in non-emissive regions of an OLED device, the presence of such structure would not substantially affect an output of light from emissive regions (e.g., pixels). Moreover, it is observed that, by providing such busbar structure, a sheet resistance of a cathode can be significantly reduced. For example, in the evaluated example above, the sheet resistance of the cathode by itself was measured to be about 41 Ω/sq (Evaluation Sample 4). However, by forming a busbar structure in electrical communication with the cathode, the sheet resistance of the cathode was reduced to about 0.1 Ω/sq (Evaluation Sample 6).

Example 2

A series of samples were fabricated and a reflectivity and an absorption of various electrode compositions were measured.

Each sample was prepared by depositing, on a glass substrate, an about 30 nm thick 1,3,5-tris-(N-phenylbenzimidazole-2-yl)-benzene (TPBi) layer, an about 1 nm thick 8-hydroxyquinoline lithium (Liq) layer, followed by an about 1 nm thick layer of $C_{60}$. An electrode was then deposited over each of the samples. The electrode compositions of the samples which were fabricated and tested in this example are as follows: Evaluation Sample 7 was fabricated with about 10 vol. % $C_{60}$ and about 90 vol. % magnesium; Evaluation Sample 8 was fabricated with about 10 vol. % magnesium and about 90 vol. % silver; and Evaluation Sample 9 was fabricated with about 10 vol. % silver and about 90 vol. % magnesium. Samples having various thicknesses were fabricated using each of the different electrode compositions.

Figure 11:
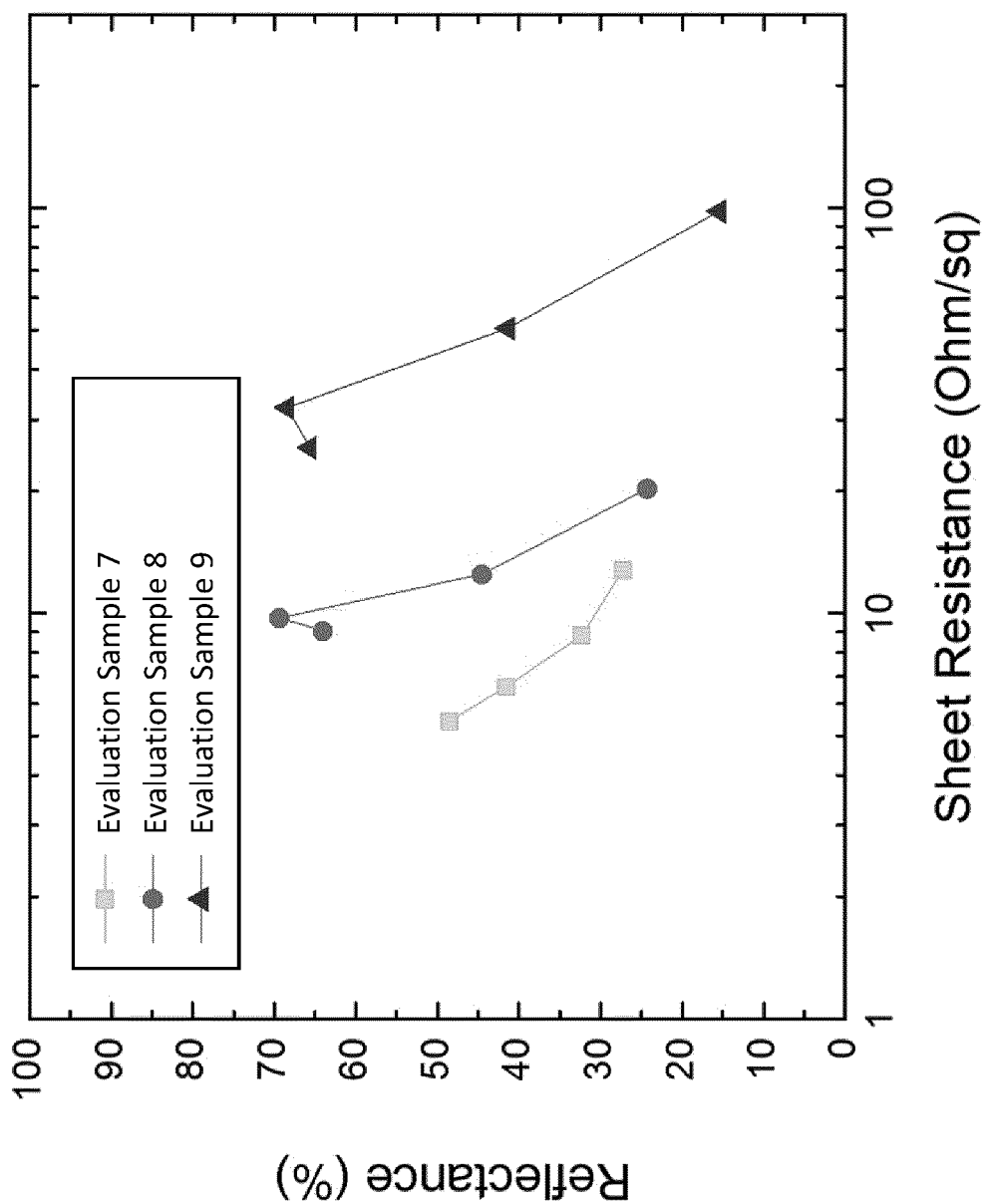
FIG. 11 is a plot of reflectance vs. sheet resistance of evaluation samples.
Figure 12:
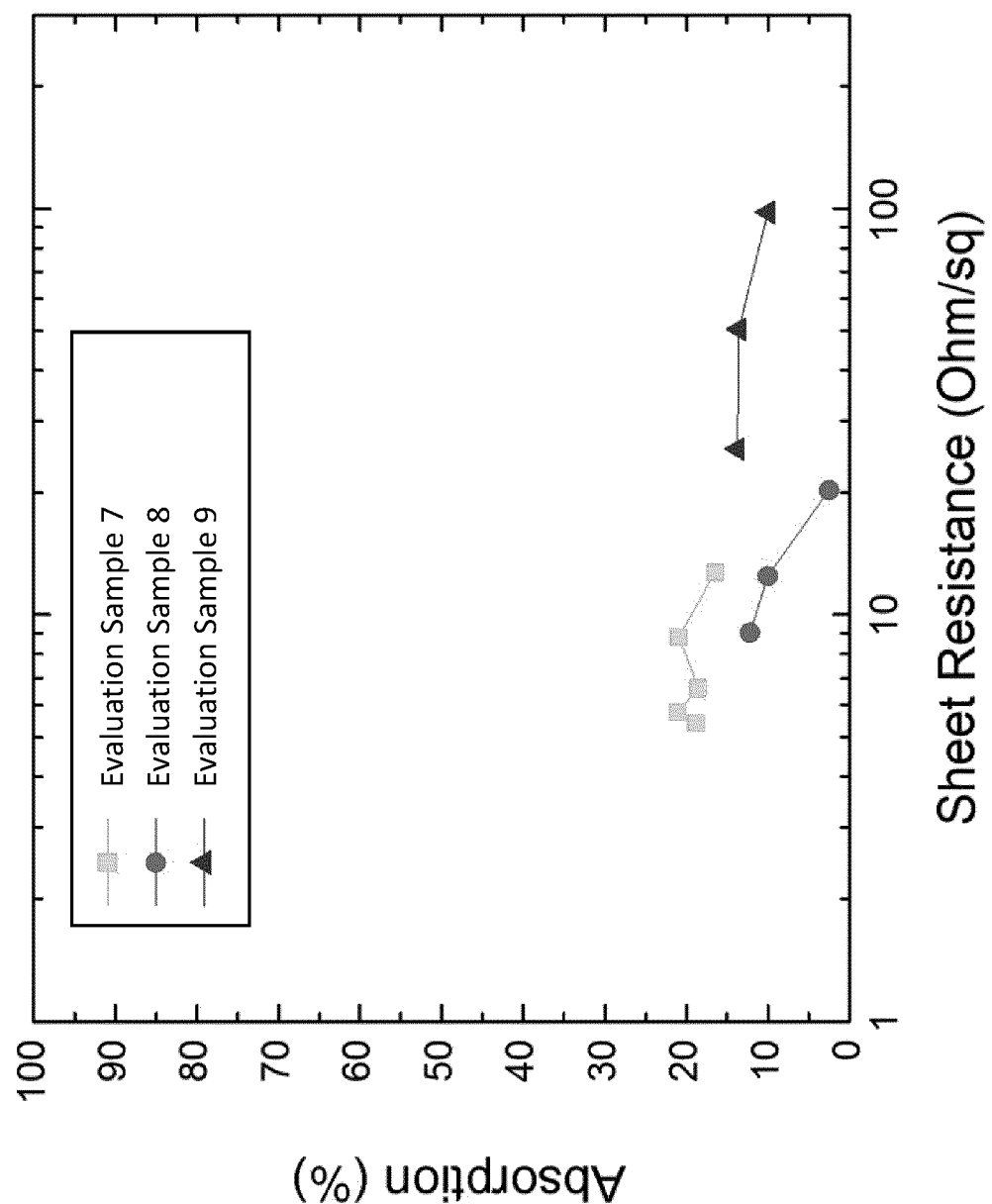
FIG. 12 is a plot of absorption vs. sheet resistance of evaluation samples.

Once the samples were fabricated, they were characterized to measure their optical reflectivity and absorption at a wavelength of about 520 nm. A plot of reflectance vs. sheet resistance of the samples is provided in FIG. 11, and a plot of absorption vs. sheet resistance of the samples is provided in FIG. 12. Any reflection and/or absorption due to the presence of the underlying layers (including the substrate, TPBi, Liq, and/or the about 1 nm thick $C_{60}$ layer) were subtracted from the measurements, such that the measured values are attributed to effects caused by the electrodes. As can be seen from the plot of FIG. 11, a relatively low reflectance of about 30% can be attained at a sheet resistance of about 10 0/sq for a sample fabricated with about 10 vol. % $C_{60}$ and about 90 vol. % magnesium (Evaluation Sample 7). However, for a sample fabricated with about 10 vol. % magnesium and about 90 vol. % silver (Evaluation Sample 8), reflectance of about 30% is attained at a sheet resistance of about 18 Ω/sq. It may be particularly advantageous to use a cathode exhibiting a low reflectance and a low sheet resistance for certain applications, since a reflection of external light off any layer or coating of a device can cause a loss of contrast in a top-emission device, such as in a top-emission AMOLED device. Turning to FIG. 12, it can be seen that an optical absorption of an electrode was greater for a sample fabricated with about 10 vol. % $C_{60}$ and about 90 vol. % magnesium (Evaluation Sample 7) than other samples. In particular, an optical absorption of about 20% was observed at about 10 Ω/sq for Evaluation Sample 7, while an optical absorption of about 11% was measured at about 10 Ω/sq for Evaluation Sample 8. It is postulated that the greater optical absorption in the sample including about 10 vol. % $C_{60}$ and about 90 vol. % magnesium (Evaluation Sample 7) may be attributed to the presence of $C_{60}$, which can absorb light in the visible portion of the electromagnetic spectrum.

Example 3

A series of top-emission OLED device samples were fabricated using various electrode compositions and thicknesses, and their device performances were measured.

Each device was fabricated such that its device structure was substantially identical to one another, with the exception of the following:

Evaluation Sample 10 was fabricated by depositing an about 1 nm thick $C_{60}$ layer, followed by an about 20 nm thick cathode layer including about 10 vol. % $C_{60}$ and about 90 vol. % magnesium;

Evaluation Sample 11 was fabricated by depositing an about 15 nm thick cathode layer including about 10 vol. % silver and about 90 vol. % magnesium; and Evaluation Sample 12 was fabricated by depositing an about 1 nm thick $C_{60}$ layer, followed by an about 15 nm thick cathode layer including about 10 vol. % silver and about 90 vol. % magnesium.

Figure 13:
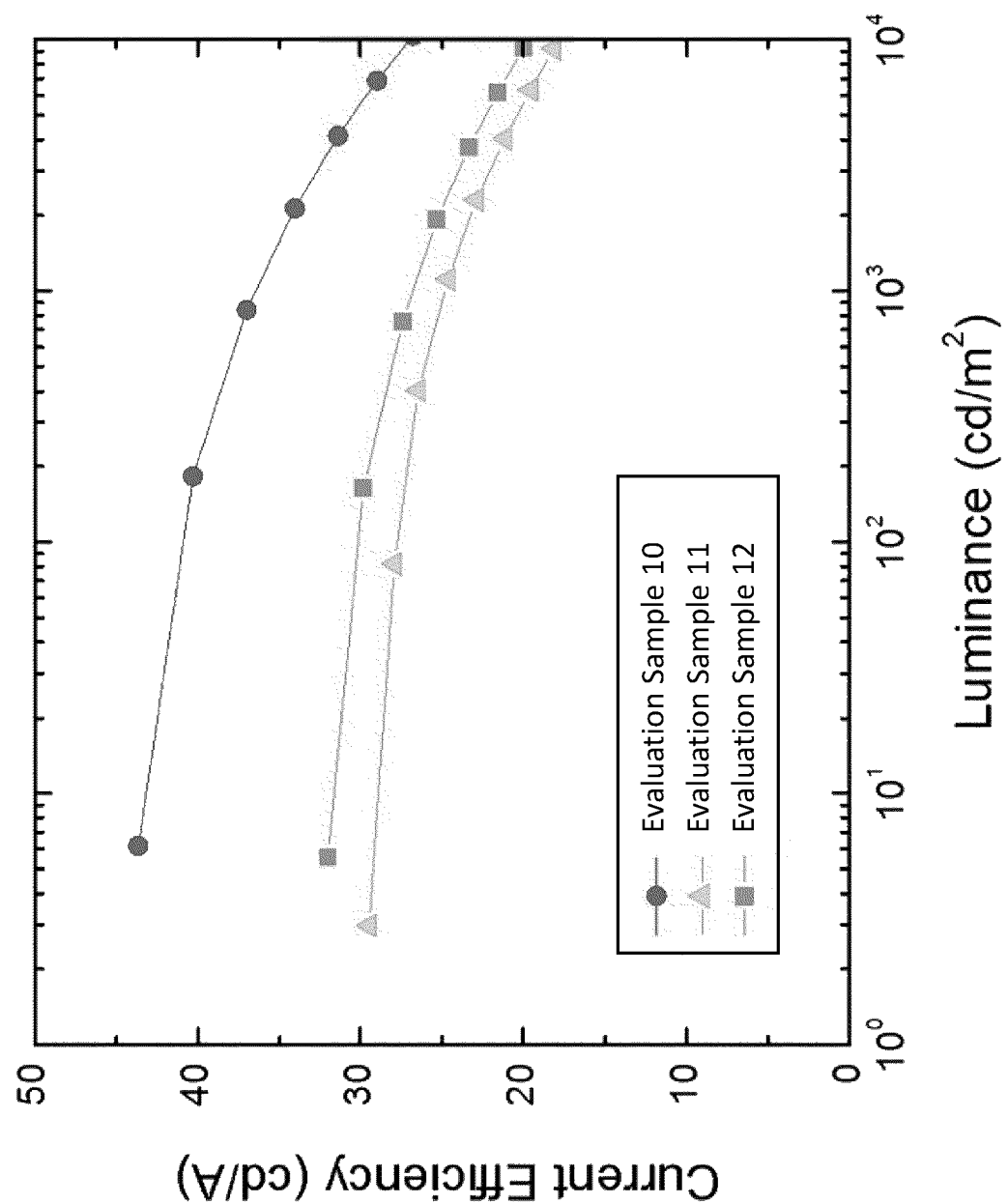
FIG. 13 is a plot of current efficiency vs. luminance for evaluations samples.
Figure 14:
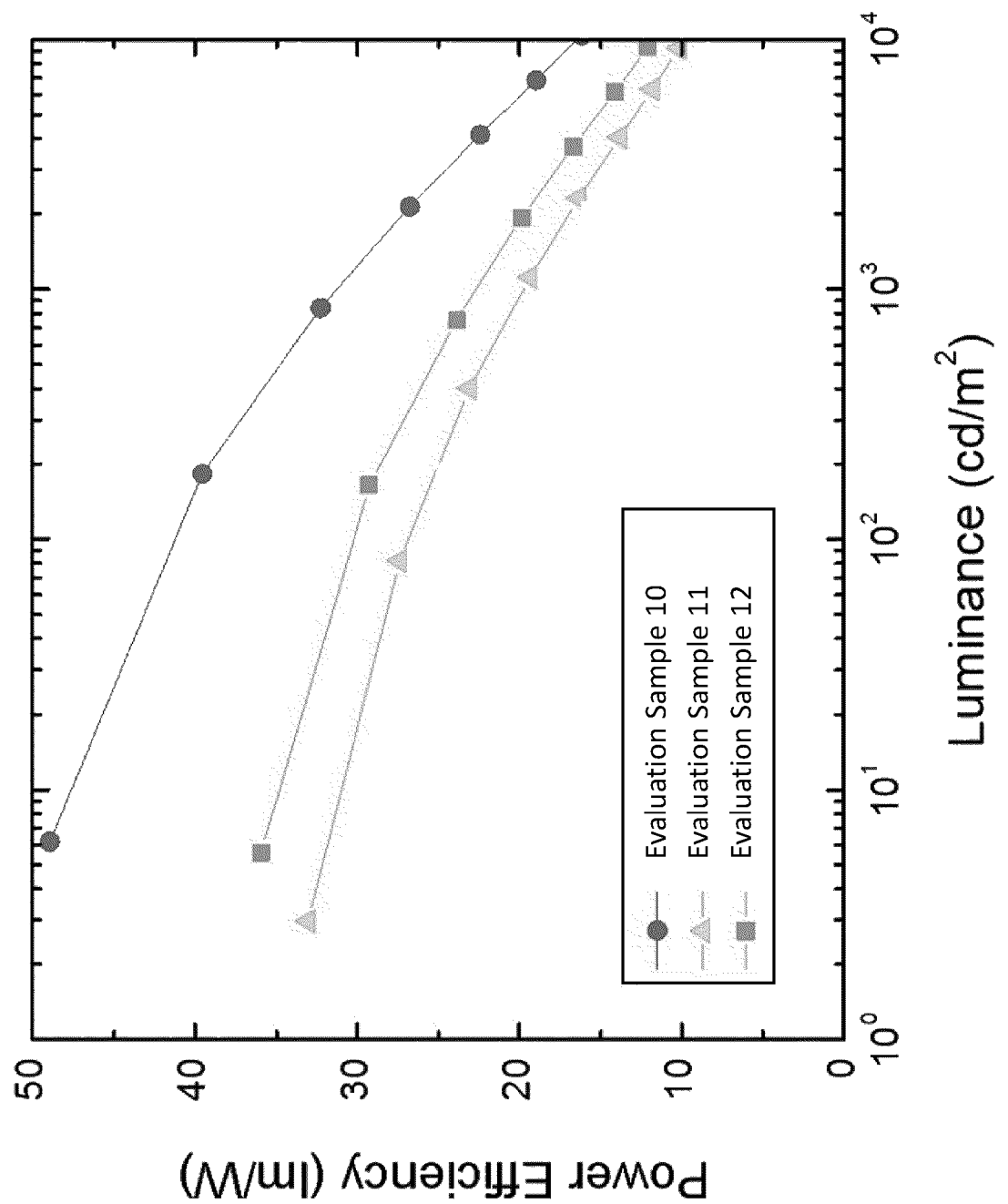
FIG. 14 is a plot of power efficiency vs. luminance for evaluation samples.
Figure 15:
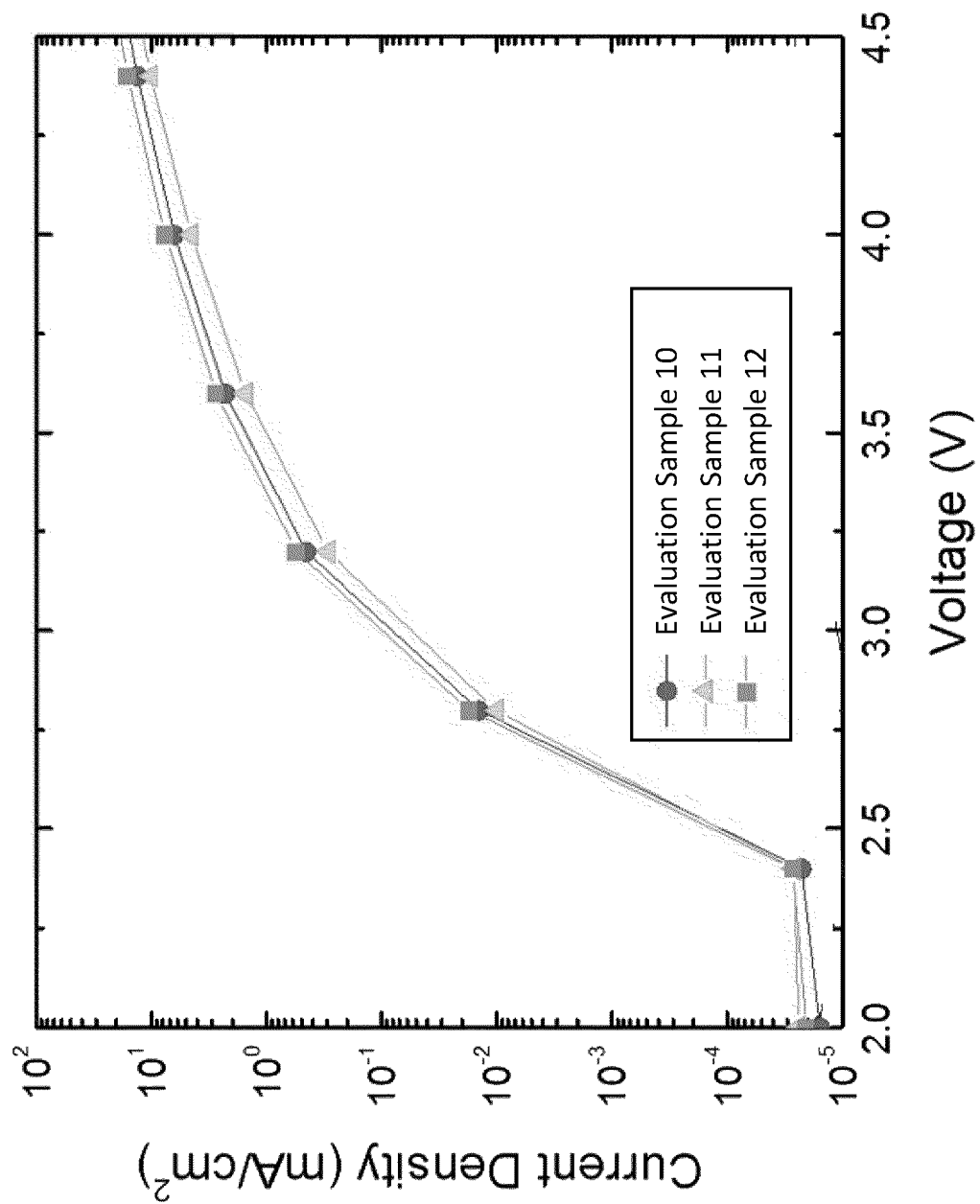
FIG. 15 is a plot of current density vs. voltage (I-V) for evaluation samples.
Figure 16:
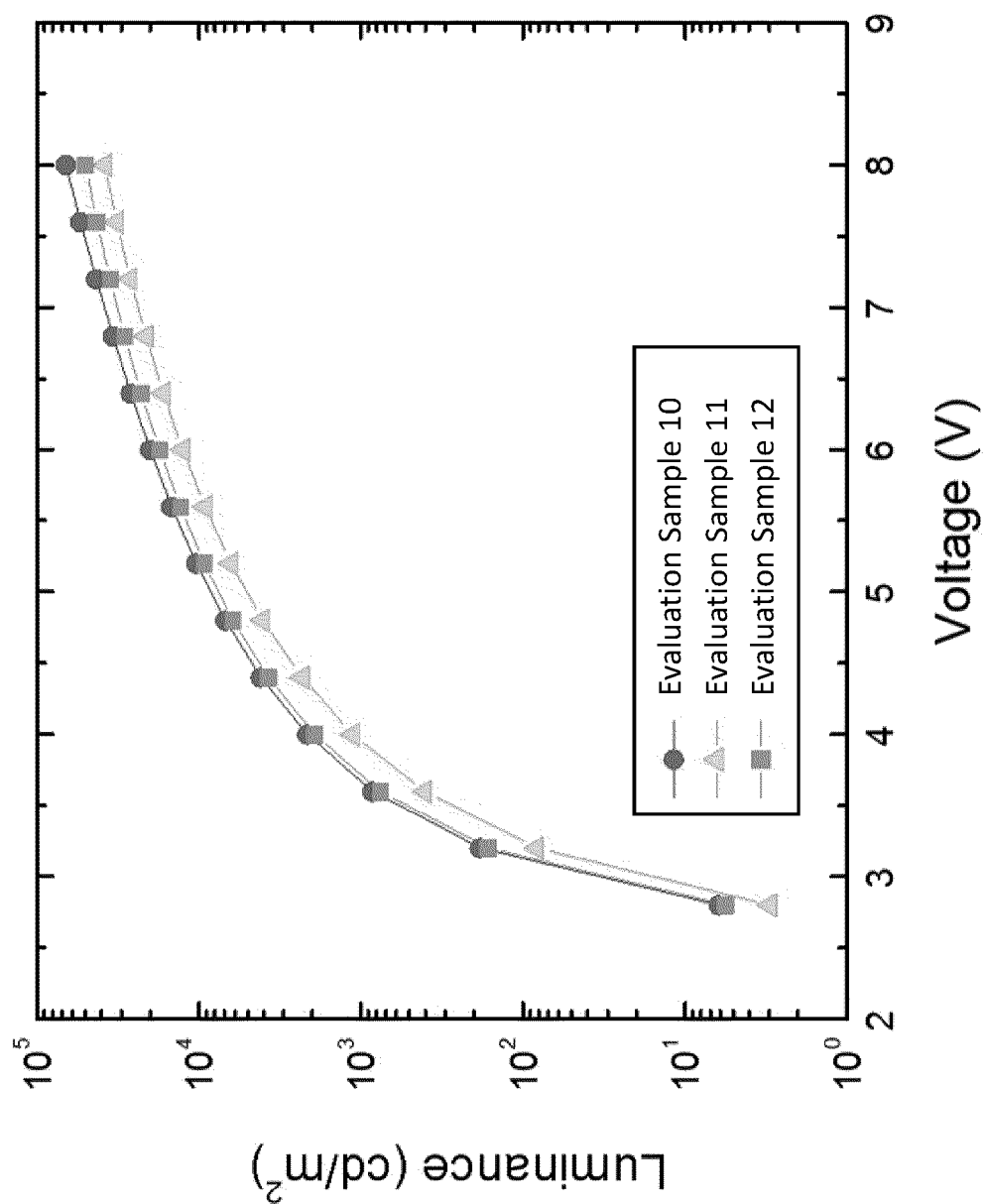
FIG. 16 is a plot of luminance vs. voltage (L-V) for evaluation samples.

FIG. 13 is a plot of current efficiency vs. luminance for the above evaluations samples, FIG. 14 is a plot of power efficiency vs. luminance for the evaluation samples, FIG. 15 is a plot of current density vs. voltage (I-V) for the evaluation samples, and FIG. 16 is a plot of luminance vs. voltage (L-V) for the evaluation samples. As can be seen, the I-V and L-V profiles of all the samples are similar; however, it was found that Evaluation Sample 10 exhibited significantly higher current efficiency and power efficiency across the measured luminance range compared to other evaluation samples. As would be appreciated, a higher device efficiency is generally advantageous, as less power is involved for a device to provide a target output luminance.

Example 4

A series of evaluation samples were fabricated to measure the effects of varying a thickness as well as a relative composition of an electrode.

All of the samples were fabricated to include the following structure: Glass/organic layer (about 30 nm)/$C_{60}$ layer (about 1 nm)/electrode/adhesive/glass encapsulation. Specifically, the evaluation samples were prepared by depositing an about 30 nm thick layer of 2-(4-(9,10-di(naphthalene-2-yl)anthracene-2-yl)phenyl)-1-phenyl-1H-benzo-[D]imidazole (LG201), followed by an electrode formed by magnesium or a mixture of magnesium and $C_{60}$. Each sample was encapsulated by applying a Gold Seal® glass cover slip using an adhesive. The thickness of the electrode was varied from about 15 nm to about 70 nm, and the composition of the electrode was varied from pure magnesium (e.g., about 100 vol. % Mg) to about 20 vol. % $C_{60}$ and about 80 vol. % Mg.

Figure 17:
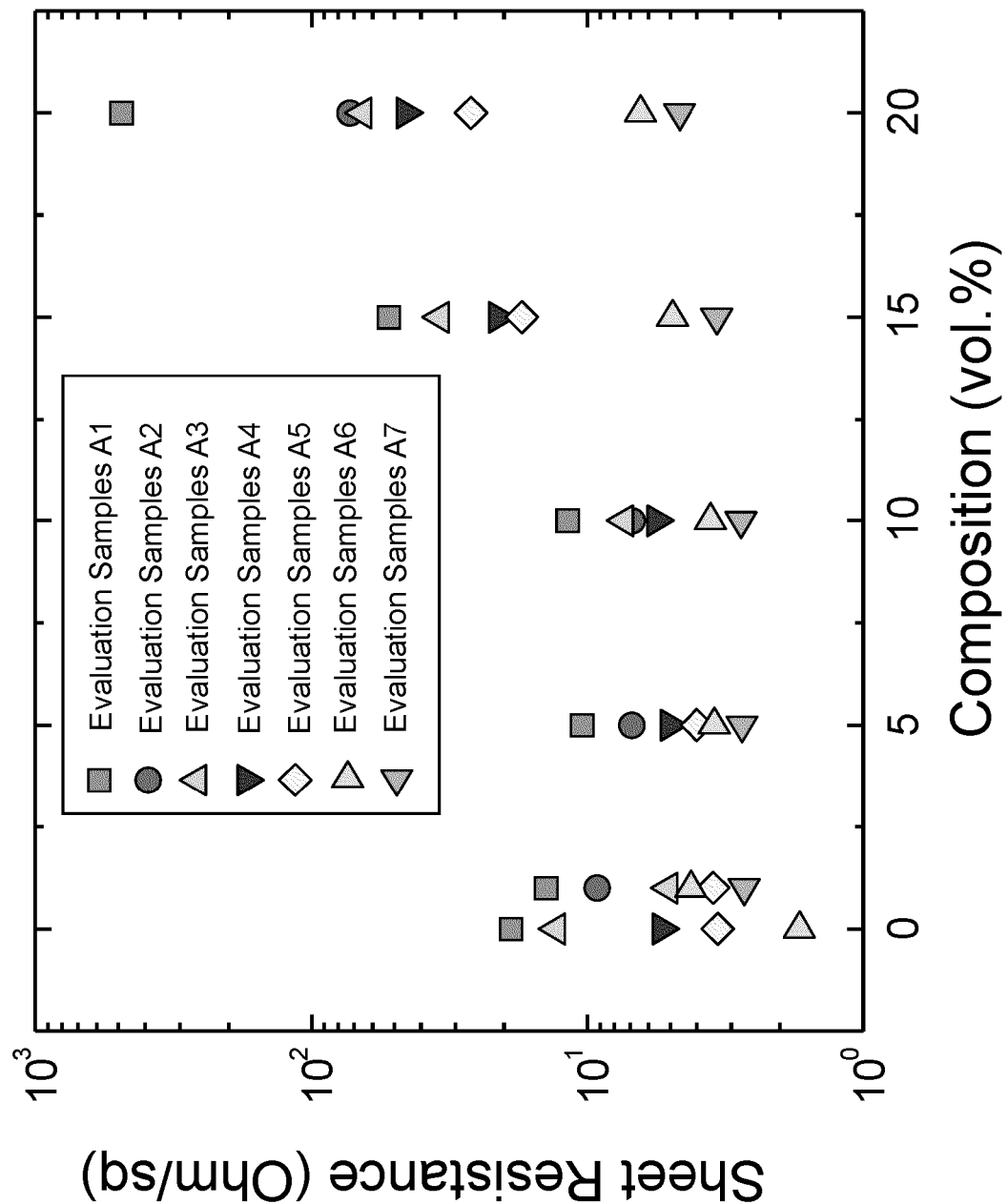
FIG. 17 is a plot of sheet resistance against an approximate composition of $C_{60}$ in evaluation samples for various thicknesses of an electrode.

A sheet resistance of the fabricated samples was measured using a 4-wire contact method, and is plotted against an approximate composition of $C_{60}$ in the samples in FIG. 17 for various thicknesses of the electrode. In the plot of FIG. 17, data obtained from samples prepared with an electrode thickness of about 15 nm is labelled Evaluation Samples A1; data obtained from samples prepared with an electrode thickness of about 20 nm is labelled Evaluation Samples A2; data obtained from samples prepared with an electrode thickness of about 25 nm is labelled Evaluation Samples A3; data obtained from samples prepared with an electrode thickness of about 30 nm is labelled Evaluation Samples A4; data obtained from samples prepared with an electrode thickness of about 35 nm is labelled Evaluation Samples A5; data obtained from samples prepared with an electrode thickness of about 50 nm is labelled Evaluation Samples A6; and data obtained from samples prepared with an electrode thickness of about 70 nm is labelled Evaluation Samples A7. As can be seen from the plot, samples having electrode thicknesses of about 35 nm, about 50 nm, and about 70 nm generally exhibited higher sheet resistance as the composition of $C_{60}$ in the electrode was increased. For the sample prepared with about 30 nm thick electrode, the sheet resistance remained substantially the same from about 0-10 vol. % $C_{60}$ composition, but increased significantly upon reaching higher $C_{60}$ compositions to about 15 vol. %, and then to about 20 vol. %. However, for the samples with electrode thicknesses of about 15 nm, about 20 nm, and about 25 nm, it was surprisingly found that increasing the content of fullerene in the electrode composition, at least over a narrow range of about 1 vol. % to about 10 vol. % $C_{60}$, resulted in a decrease of the sheet resistance. Specifically, for the about 15 nm thick sample, the sheet resistance of the sample decreased when the $C_{60}$ composition of the electrode was increased from 0 vol. % to about 1 vol. %, and again from about 1 vol. % to about 5 vol. %. While the sheet resistance slightly increased when the $C_{60}$ composition was further increased to about 10 vol. %, the sheet resistance at about 10 vol. % $C_{60}$ was still lower than that of a substantially pure magnesium electrode of substantially identical thickness. For the about 20 nm and about 25 nm thick samples, a similar trend in the sheet resistance was observed, with the sheet resistance either remaining substantially unchanged or becoming lower with increase in $C_{60}$ composition up to about 10 vol. %. Given that fullerene such as $C_{60}$ is generally understood to be substantially less conductive than magnesium, it is surprising and unexpected that a relatively small addition of fullerene in a magnesium-dominant composition would lower a sheet resistance at relatively low electrode thicknesses.

For all thicknesses measured, the sheet resistance generally increased when the $C_{60}$ composition was increased from about 10 vol. % to about 15 vol. %, and again to about 20 vol. %.

Figure 18:
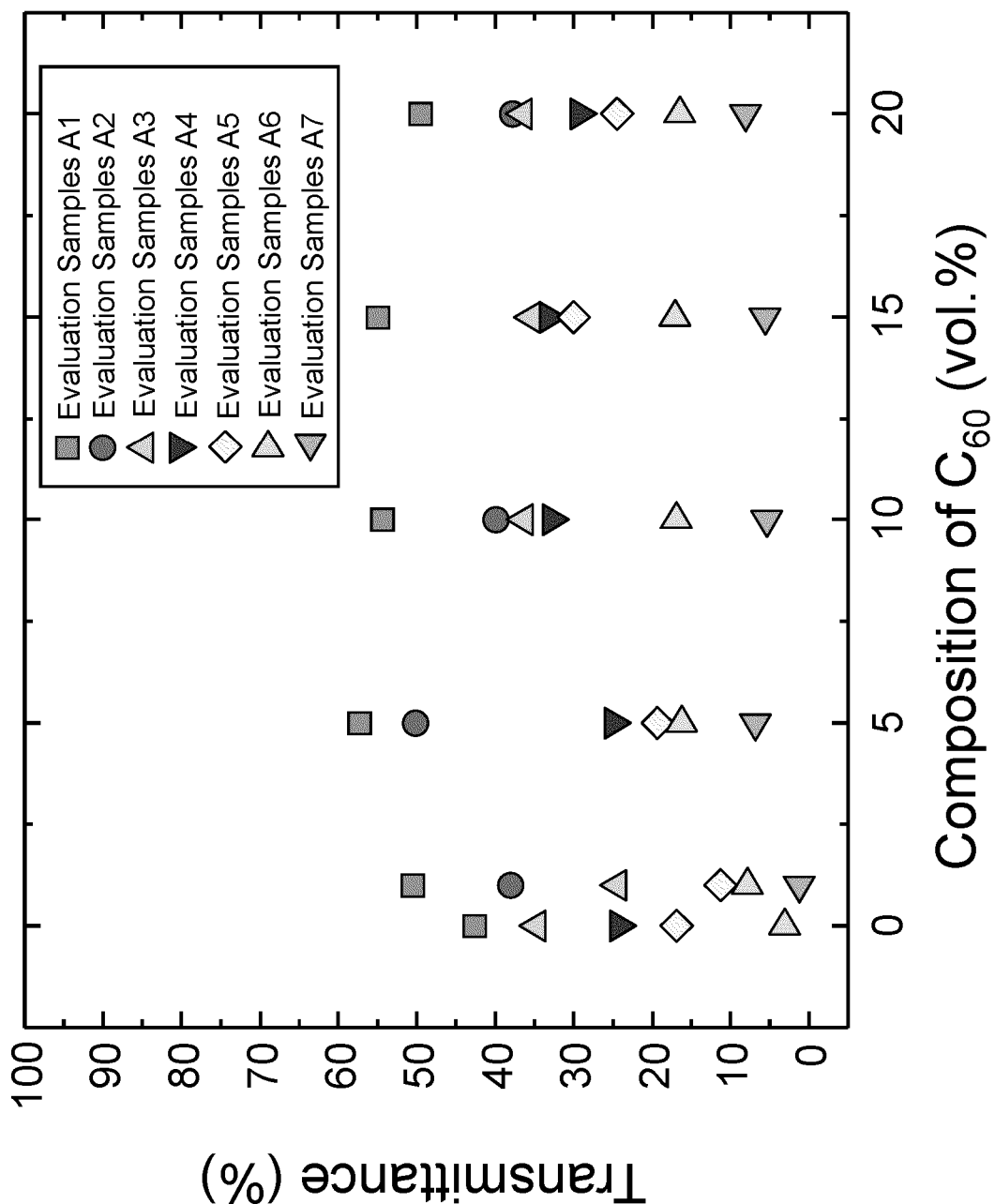
FIG. 18 is a plot of light transmittance against an approximate composition of $C_{60}$ in evaluation samples for various thicknesses of an electrode.

A light transmittance of the samples was also measured and the results are shown in the plot of FIG. 18, and are indicated using the same sample labels as FIG. 17. The visible light transmittance of each electrode sample was detected at a wavelength of about 550 nm, subtracting any optical effects due by presence of the glass substrate or other layers. Based on the results, it was found that the addition of $C_{60}$ at a certain concentration generally enhanced the transmissivity or transmittance of the electrode, especially in comparison to a substantially pure magnesium film of substantially identical thickness. Specifically, for the about 15 nm thick electrode samples, the transmittance increased from about 43% to about 51% when the $C_{60}$ composition was increased from 0 vol. % to about 1 vol. %, and again to about 57% when the $C_{60}$ composition was increased to about 5 vol. %. A similar trend was generally observed for the about 30 nm, about 50 nm, and about 70 nm samples. For the about 20 nm thick electrode samples, the transmittance increased from about 38% at about 1 vol. % $C_{60}$ composition to about 50% at about 5 vol. % $C_{60}$ composition. When the $C_{60}$ composition was further increased to about 10 vol. %, the transmittance decreased to about 40%. For other electrode thicknesses measured, a slight decrease in transmittance was observed when the $C_{60}$ composition was increased from 0% to about 1 vol. %; however, the transmittance generally increased or remained substantially unchanged with subsequent increase in the $C_{60}$ composition.

Figure 19:
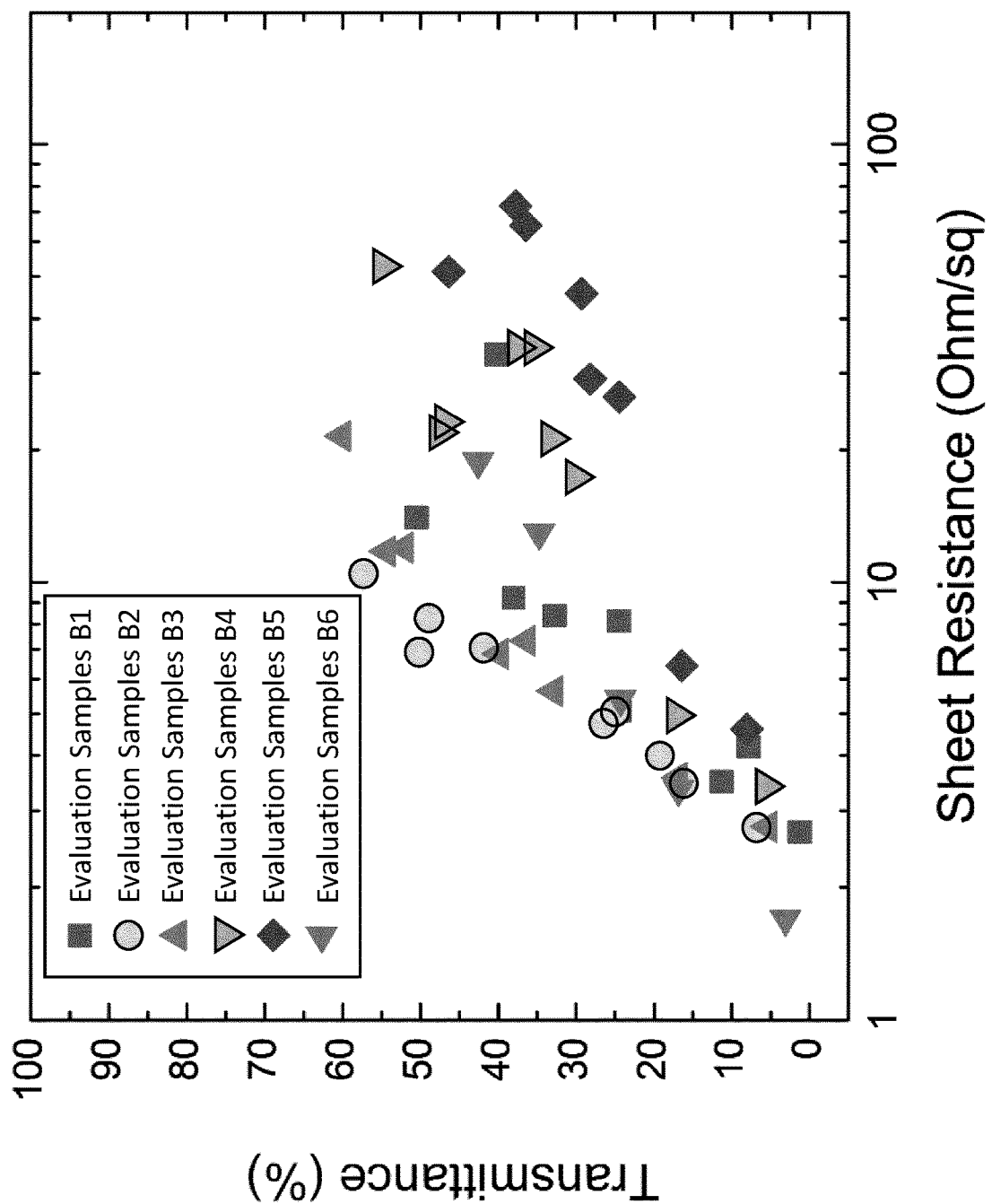
FIG. 19 is a semi-log plot showing a light transmittance at various sheet resistances for evaluated electrode compositions.

FIG. 19 is a semi-log plot showing a light transmittance at various sheet resistances for the electrode compositions which were evaluated. In the plot of FIG. 19, data obtained from samples prepared with an electrode containing about 1 vol. % $C_{60}$ and 99 vol. % magnesium is labelled Evaluation Samples B1; data obtained from samples prepared with an electrode containing about 5 vol. % $C_{60}$ and 95 vol. % magnesium is labelled Evaluation Samples B2; data obtained from samples prepared with an electrode containing about 10 vol. % $C_{60}$ and 90 vol. % magnesium is labelled Evaluation Samples B3; data obtained from samples prepared with an electrode containing about 15 vol. % $C_{60}$ and 85 vol. % magnesium is labelled Evaluation Samples B4; data obtained from samples prepared with an electrode containing about 20 vol. % $C_{60}$ and 80 vol. % magnesium is labelled Evaluation Samples B5; and data obtained from samples prepared with an electrode containing about 100 vol. % magnesium is labelled Evaluation Samples B6. Generally, electrode compositions exhibiting a relatively high transmittance and a relatively low sheet resistance are advantageous for use as a light transmissive electrode in opto-electronic devices. For example, a light transmissive electrode exhibiting a sheet resistance of less than about 20 $\Omega$/sq and a transmittance greater than about 25% is generally considered to be suitable for use as a top-emission electrode of an OLED device, since materials used as a transmissive electrode in such applications generally provide a reasonable trade-off between a sheet resistance and a light transmittance in such range. However, as can be seen based on the plots of FIG. 19 and FIG. 8, fullerene-containing magnesium alloys having certain fullerene compositions may provide a higher light transmittance at a given sheet resistance compared to other fullerene-containing magnesium alloys, as well as other conductive materials used for forming top-emission electrodes. In reference to FIG. 19, it has been found that fullerene-containing magnesium alloys having certain compositions and thicknesses may have opto-electronic characteristics which are equal to, or better than, those of substantially pure magnesium. In particular, it was observed that fullerene-containing magnesium alloys including about 5 vol. % and about 10 vol. % $C_{60}$ composition exhibited comparable or higher light transmittance to a substantially pure magnesium film at any given sheet resistance measured at or above around 5 $\Omega$/sq. For fullerene-containing magnesium alloys including about 1 vol. % and about 15 vol. % $C_{60}$ composition, comparable or higher light transmittance to a substantially pure magnesium film was obtained at about 8 $\Omega$/sq, and at about 20 $\Omega$/sq, respectively.

Figure 20A:
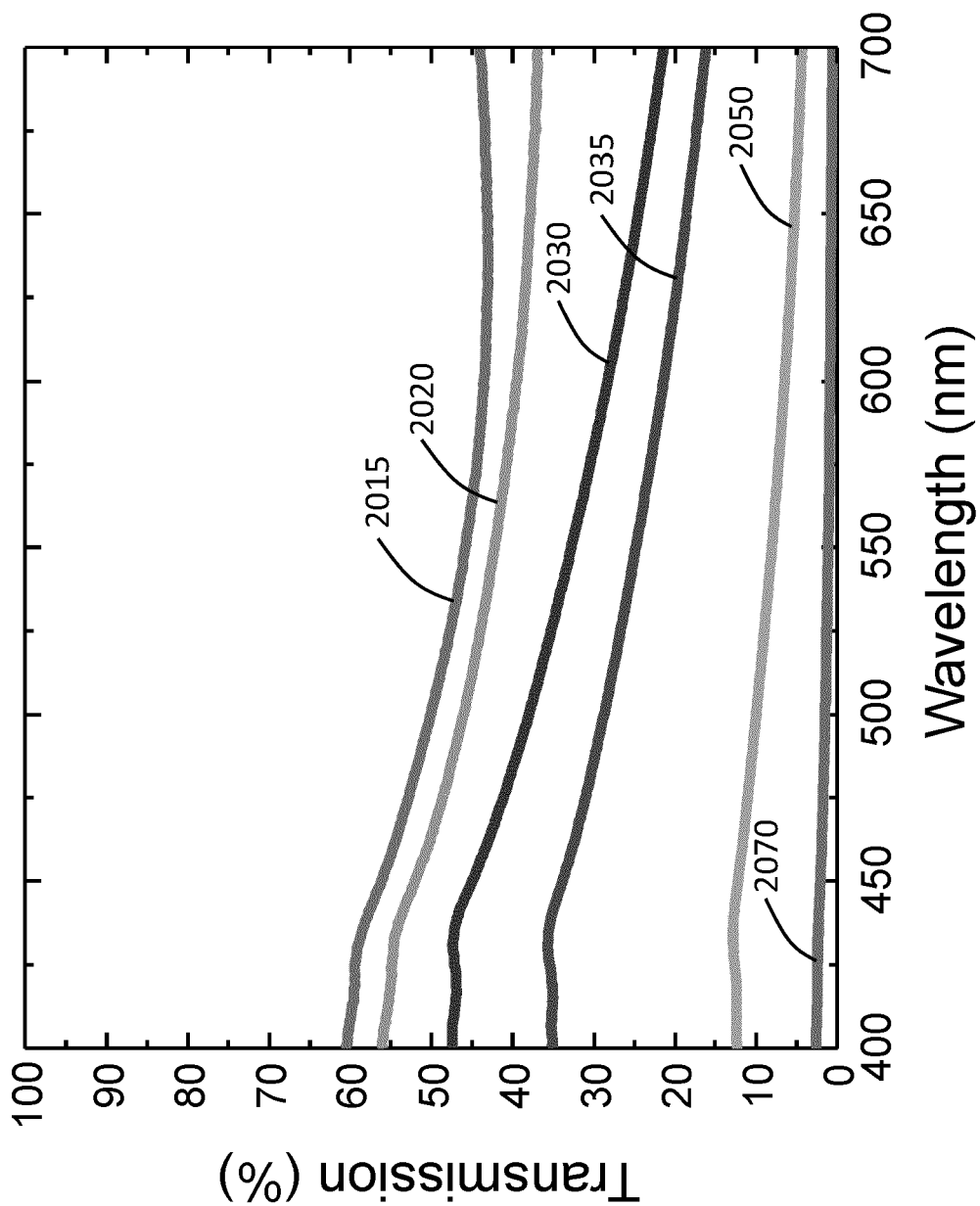
FIG. 20A is a plot of light transmittance against wavelength for various thicknesses of an electrode at an approximate $C_{60}$ composition of about 1 vol. %.
Figure 20B:
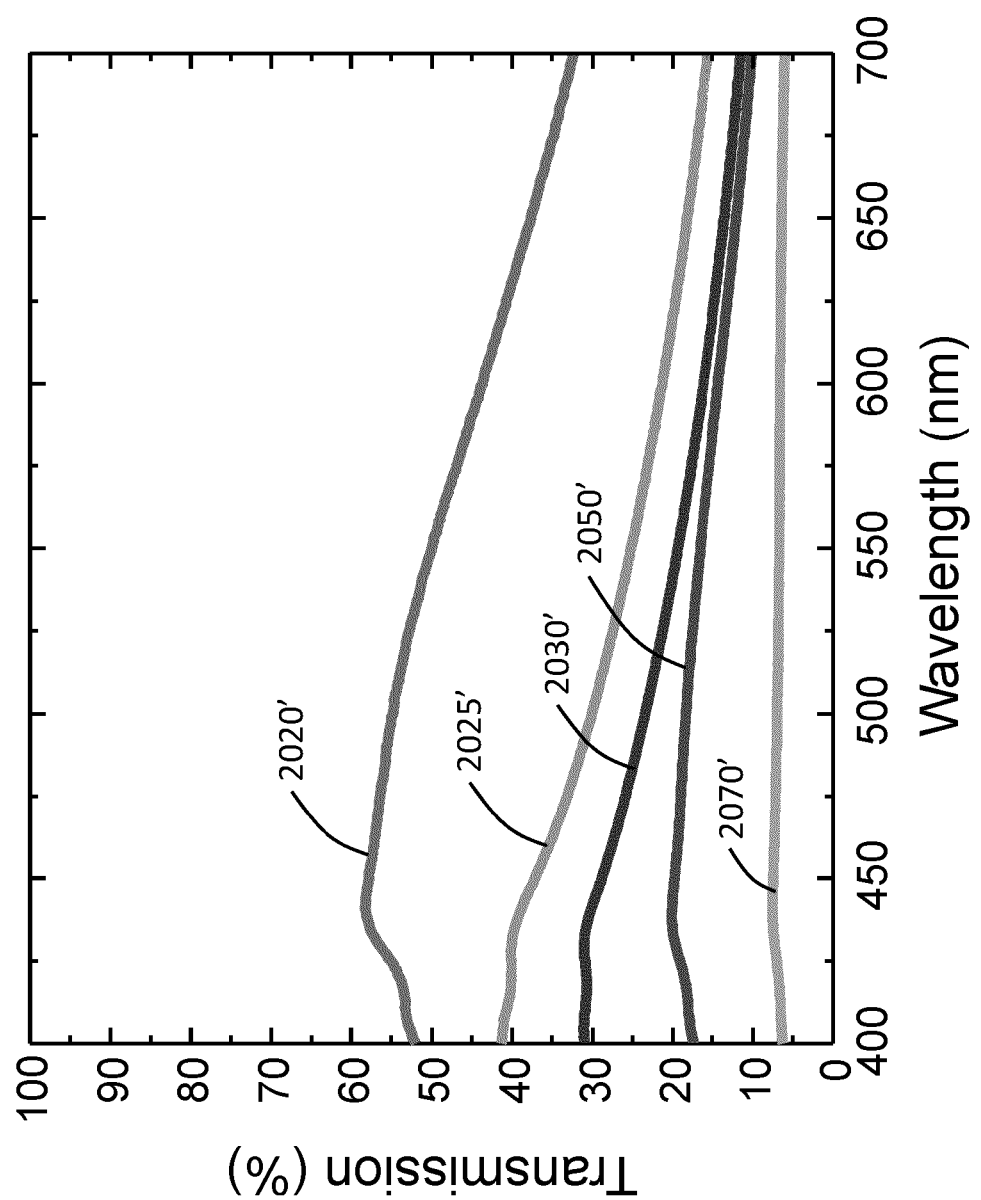
FIG. 20B is a plot of light transmittance against wavelength for various thicknesses of an electrode at an approximate $C_{60}$ composition of about 5 vol. %.
Figure 20C:
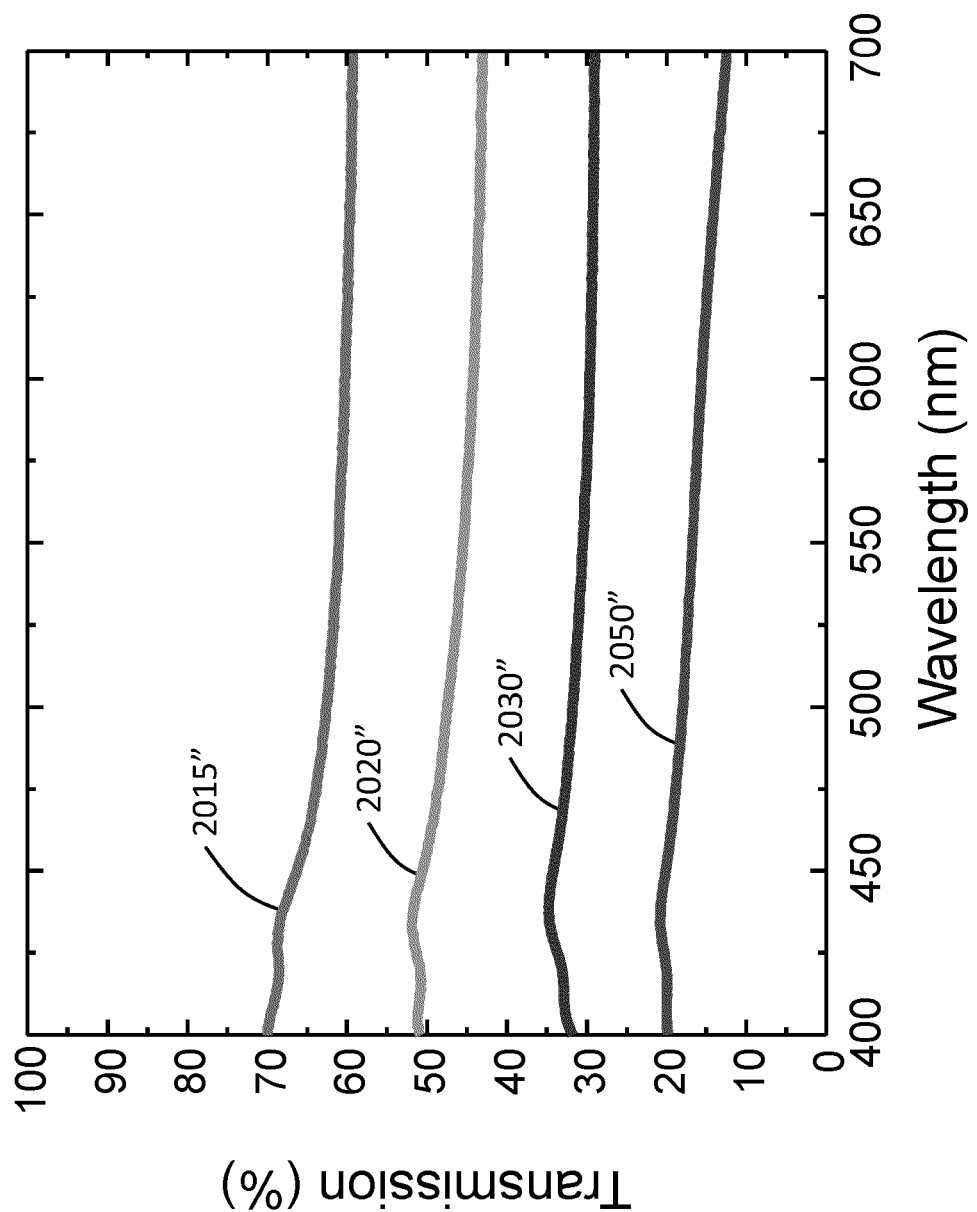
FIG. 20C is a plot of light transmittance against wavelength for various thicknesses of an electrode at an approximate $C_{60}$ composition of about 10 vol. %.

FIG. 20A to FIG. 20C show plots of light transmission at wavelengths of between about 400 nm and about 700 nm for electrode samples of various thicknesses between about 15 nm and about 70 nm, and a $C_{60}$ composition of about 1 vol. %, about 5 vol. %, or about 10 vol. %.

In FIG. 20A, the transmission spectrum for an electrode having a thickness of about 15 nm is labelled 2015, the transmission spectrum for an electrode having a thickness of about 20 nm is labelled 2020, the transmission spectrum for an electrode having a thickness of about 30 nm is labelled 2030, the transmission spectrum for an electrode having a thickness of about 35 nm is labelled 2035, the transmission spectrum for an electrode having a thickness of about 50 nm is labelled 2050, and the transmission spectrum for an electrode having a thickness of about 70 nm is labelled 2070. All electrode samples used to obtain the transmission spectra plotted in FIG. 20A contained about 1 vol. % $C_{60}$.

In FIG. 20B, the transmission spectrum for an electrode having a thickness of about 20 nm is labelled 2020', the transmission spectrum for an electrode having a thickness of about 25 nm is labelled 2025', the transmission spectrum for an electrode having a thickness of about 30 nm is labelled 2030', the transmission spectrum for an electrode having a thickness of about 50 nm is labelled 2050', and the transmission spectrum for an electrode having a thickness of about 70 nm is labelled 2070'. All electrode samples used to obtain the transmission spectra plotted in FIG. 20B contained about 5 vol. % $C_{60}$.

In FIG. 20C, the transmission spectrum for an electrode having a thickness of about 15 nm is labelled 2015", the transmission spectrum for an electrode having a thickness of about 20 nm is labelled 2020", the transmission spectrum for an electrode having a thickness of about 30 nm is labelled 2030", and the transmission spectrum for an electrode having a thickness of about 50 nm is labelled 2050". All electrode samples used to obtain the transmission spectra plotted in FIG. 20C contained about 10 vol. % $C_{60}$.

Figure 20D:
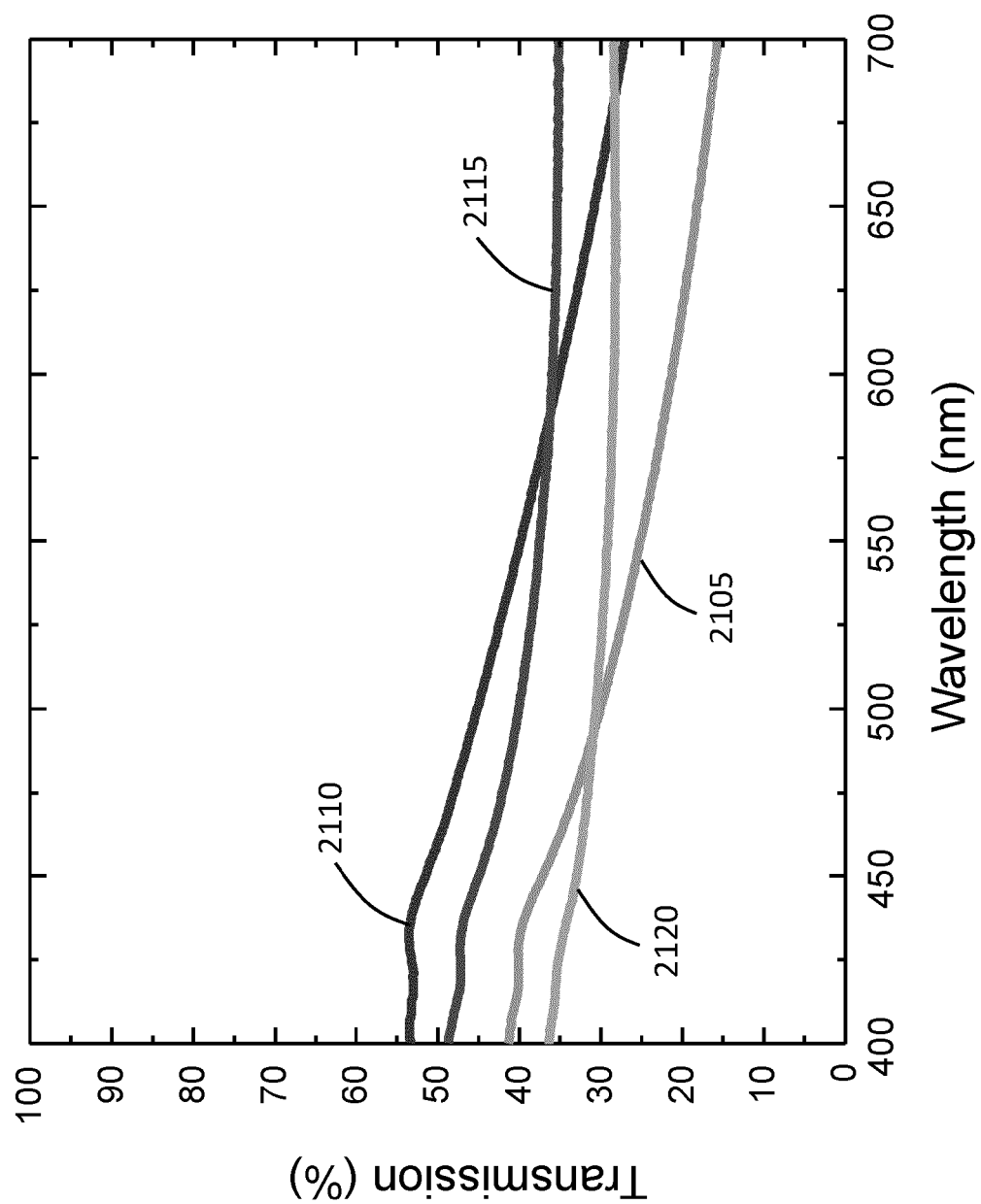
FIG. 20D is a plot of light transmittance against wavelength for various compositions of an electrode at an thickness of about 25 nm.

FIG. 20D is a transmission spectrum for electrode samples having a thickness of about 25 nm, and a $C_{60}$ composition of about 5 vol. %, about 10 vol. %, about 15 vol. %, or about 20 vol. %. Specifically, in FIG. 20D, the transmission spectrum for an electrode having a $C_{60}$ composition of about 5 vol. % is labelled 2105, the transmission spectrum for an electrode having a $C_{60}$ composition of about 10 vol. % is labelled 2110, the transmission spectrum for an electrode having a $C_{60}$ composition of about 15 vol. % is labelled 2115, and the transmission spectrum for an electrode having a $C_{60}$ composition of about 20 vol. % is labelled 2120. In each of the samples, the remainder of the electrode composition was magnesium.

As can be seen based on the results, the transmission generally decreased across the measured spectrum with increasing electrode thickness for all electrode compositions. It was also found that electrodes having higher $C_{60}$ compositions generally exhibited higher uniformity in light transmission across the measured spectrum. For example, the light transmission for an electrode sample having about 1 vol. % $C_{60}$ and a thickness of about 30 nm was found to vary as much as by approximately 25% across the measured spectrum. However, samples having compositions of about 5 vol. % $C_{60}$ and about 10 vol. % $C_{60}$ were found to vary as much as by approximately 20% and approximately 6%, respectively, across the measured spectrum. Accordingly, in certain embodiments where relatively low variation in transmission across the visible spectrum is advantageous, electrodes containing higher fullerene composition (e.g. those containing between about 5 vol. % or about 10 vol. % fullerene) may be particularly useful. It was also found, somewhat surprisingly, that electrodes containing about 10 vol. % $C_{60}$ composition may, at least in certain thickness ranges, exhibit higher transmission in some cases compared to those containing about 5 vol. % $C_{60}$ composition. For example, an electrode containing about 10 vol. % $C_{60}$ composition and having a thickness of about 30 nm was found to exhibit higher transmittance at wavelengths greater than about 600 nm when compared to an electrode containing about 5 vol. % $C_{60}$ composition and having a thickness of about 30 nm.

Figure 21A:
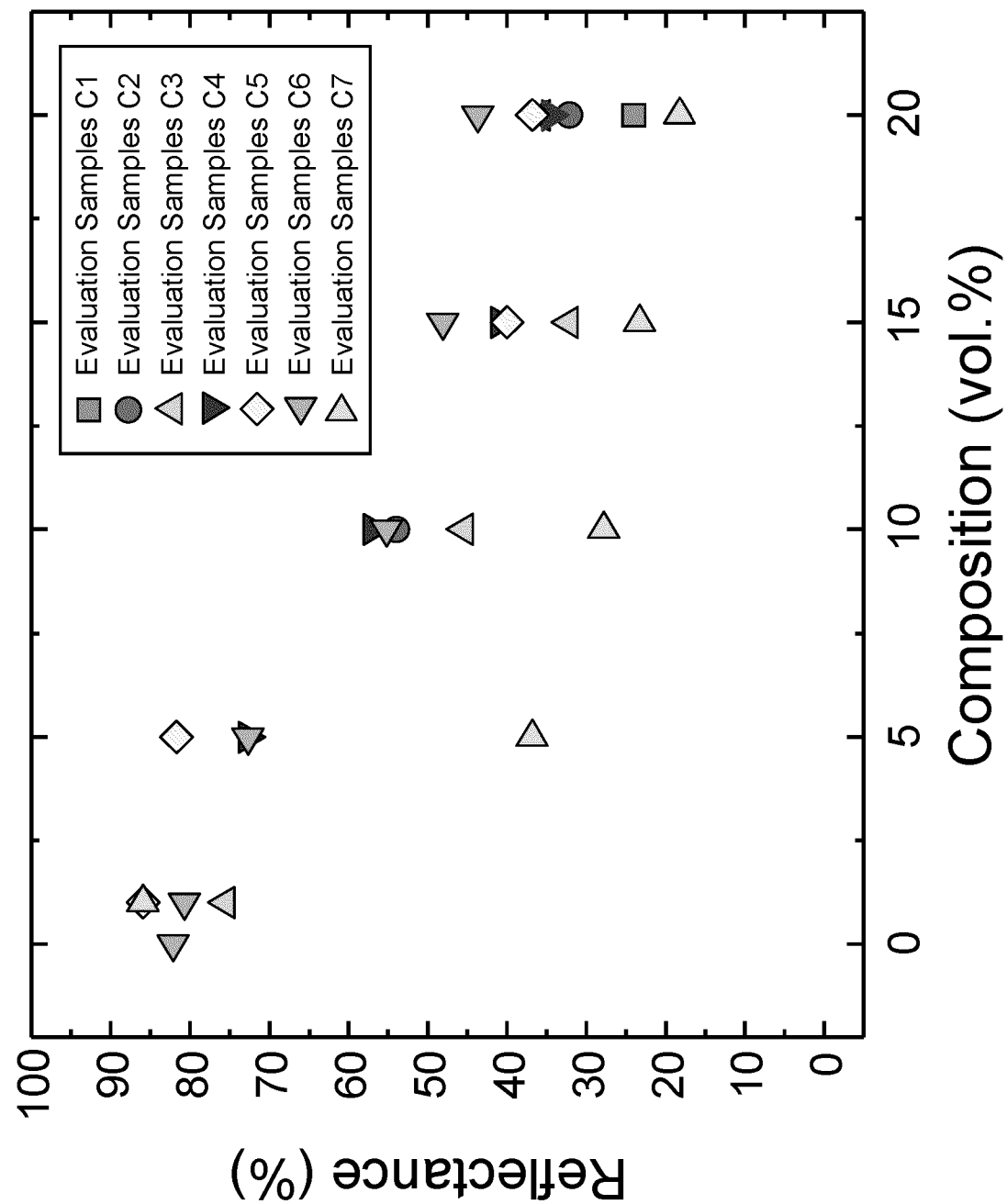
FIG. 21A is a plot of reflectance against $C_{60}$ composition of an electrode for various electrode thicknesses.
Figure 21B:
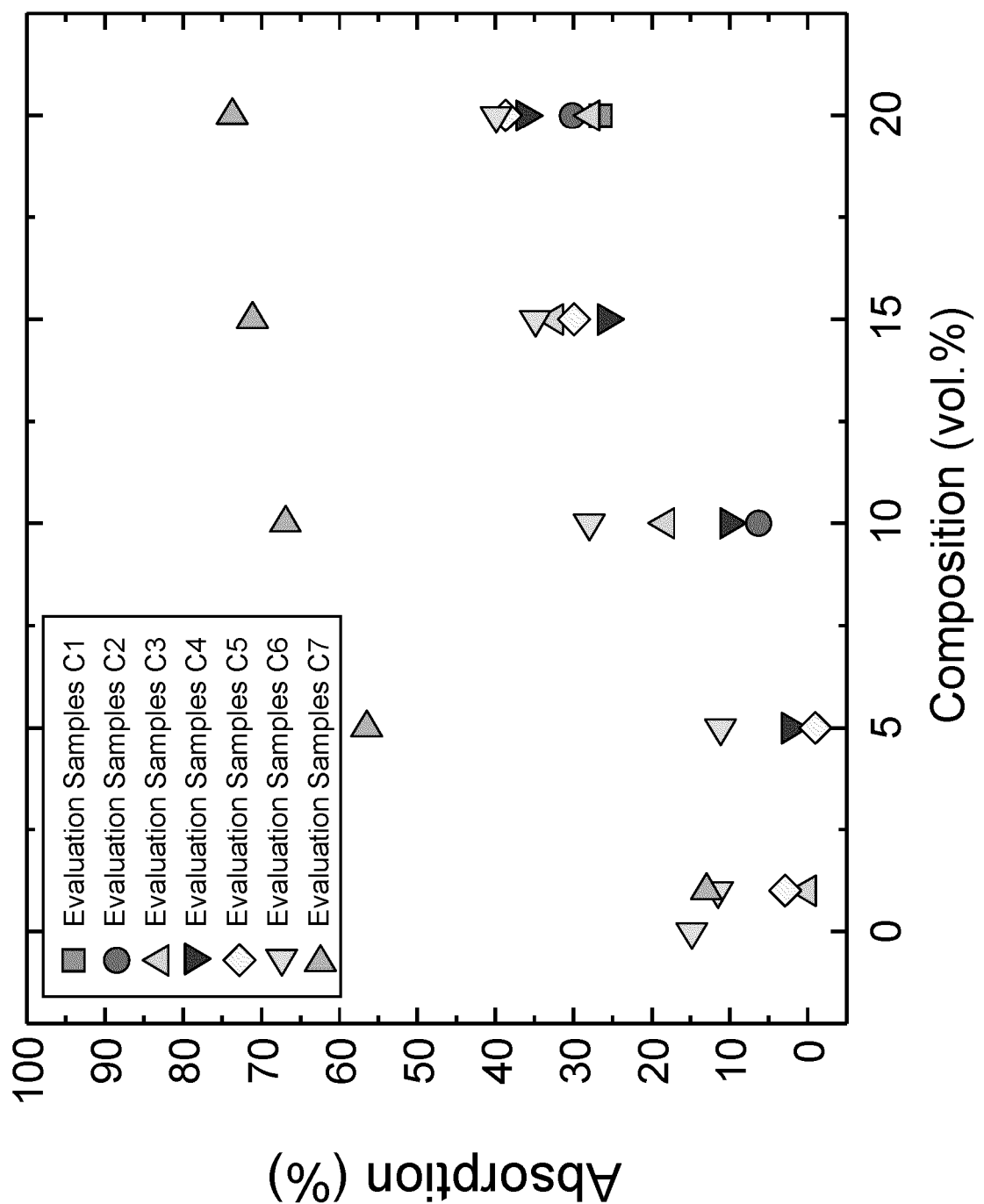
FIG. 21B is a plot of absorption against $C_{60}$ composition of an electrode for various electrode thicknesses.

Additional samples were prepared in substantially the same manner as described above, except the samples were left unencapsulated (e.g., the adhesive and the glass encapsulation were omitted from the sample structure) to leave the surface of the electrode exposed during measurements. A light reflectance and a light absorption were measured from each of these samples. FIG. 21A is a plot showing the reflectance against the $C_{60}$ composition of the electrode, and FIG. 21B is a plot showing the absorption against the $C_{60}$ composition of the electrode. It was observed based on the results that the reflectance generally decreased with increasing $C_{60}$ composition and the absorption generally increased with increasing $C_{60}$ composition. The reflectance and absorption were both measured at a wavelength of about 550 nm.

In the plots of FIGS. 21A and 21B, data obtained from samples prepared with an electrode having a thickness of about 15 nm is labelled Evaluation Samples C1; data obtained from samples prepared with an electrode having a thickness of about 20 nm is labelled Evaluation Samples C2; data obtained from samples prepared with an electrode having a thickness of about 25 nm is labelled Evaluation Samples C3; data obtained from samples prepared with an electrode having a thickness of about 30 nm is labelled Evaluation Samples C4; data obtained from samples prepared with an electrode having a thickness of about 35 nm is labelled Evaluation Samples C5; data obtained from samples prepared with an electrode having a thickness of about 50 nm is labelled Evaluation Samples C6; and data obtained from samples prepared with an electrode having a thickness of about 70 nm is labelled Evaluation Samples C7.

Based on these results and observations, it is postulated that, for compositions containing greater than about 20 vol. % fullerene, the fraction of incident light that is absorbed by such electrode will generally be greater than those containing about 20 vol. % fullerene or less at comparable electrode thickness, and also exhibit less reflectance and lower transmission of light in general. In addition, compositions containing greater than about 20 vol. % fullerene is expected to exhibit higher sheet resistance in comparison to those containing about 20 vol. % fullerene or less.

Example 5

A series of electrode samples were fabricated and characterized using scanning electron microscopy (SEM) and atomic force microscopy (AFM) to measure the effects on a grain size due to variations in electrode thickness and composition.

All of the samples were fabricated to include the following structure: Silicon/organic layer (about 45 nm)/electrode. Specifically, the evaluation samples were prepared by depositing an about 45 nm thick layer of 2-(4-(9,10-di(naphthalene-2-yl)anthracene-2-yl)phenyl)-1-phenyl-1H-benzo-[D]imidazole (LG201) over a silicon substrate, followed by an electrode formed by magnesium or a mixture of magnesium and $C_{60}$. The thickness of the electrode was varied from about 5 nm to about 100 nm, and the composition of the electrode was varied from pure magnesium (e.g., about 100 vol. % Mg) to about 70 vol. % $C_{60}$ and about 30 vol. % Mg. The samples were imaged using SEM to obtain top-view micrographs, and then these micrograph images were analyzed using image analysis tools to determine an average grain size for each of the electrode samples. Specifically, the average grain size was determined by taking an arithmetic average of the length of the major axis of grains identified from the micrographs.

Figure 22:
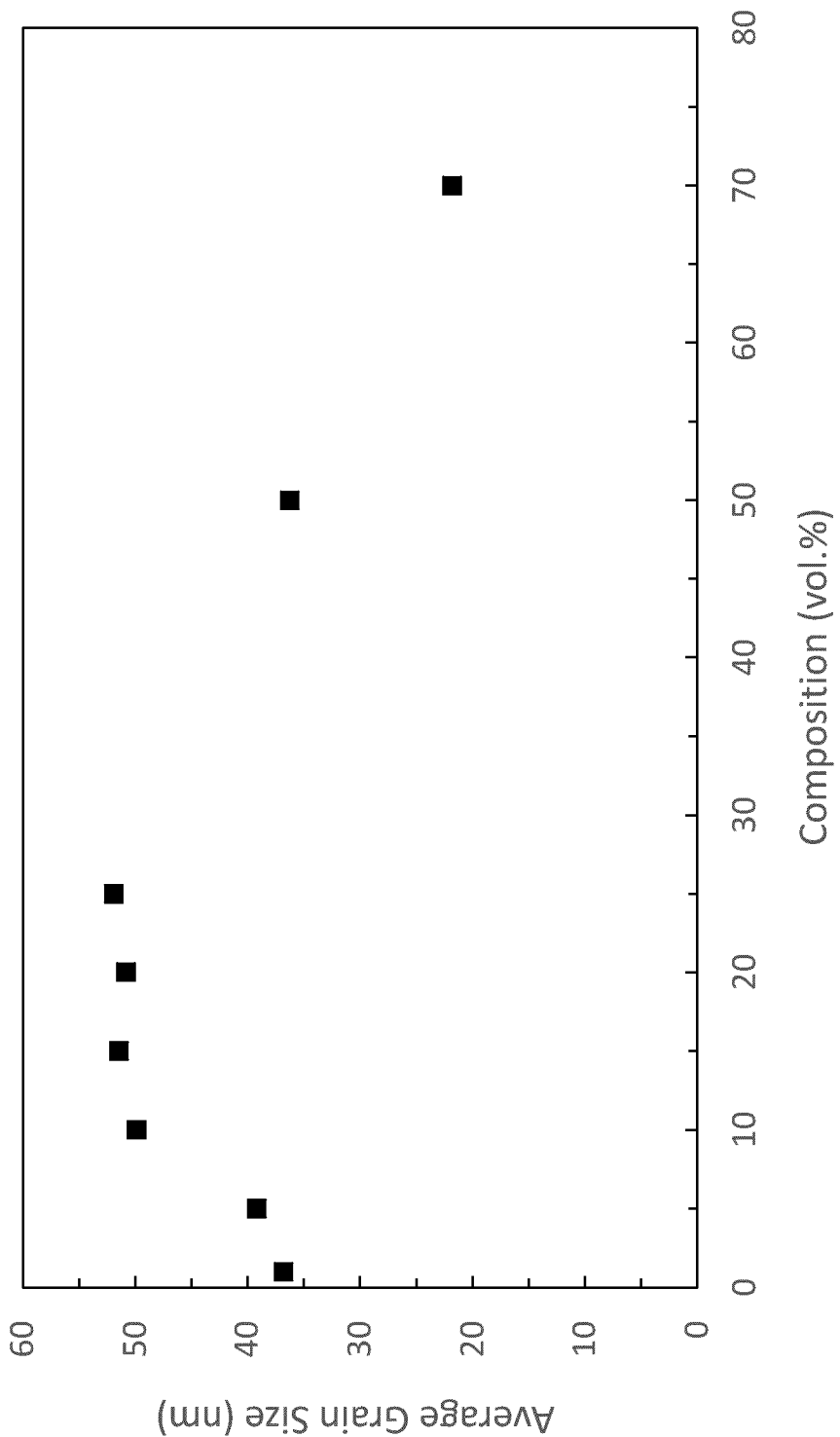
FIG. 22 is a plot showing an average grain size at various $C_{60}$ compositions of an electrode.
Figure 23:
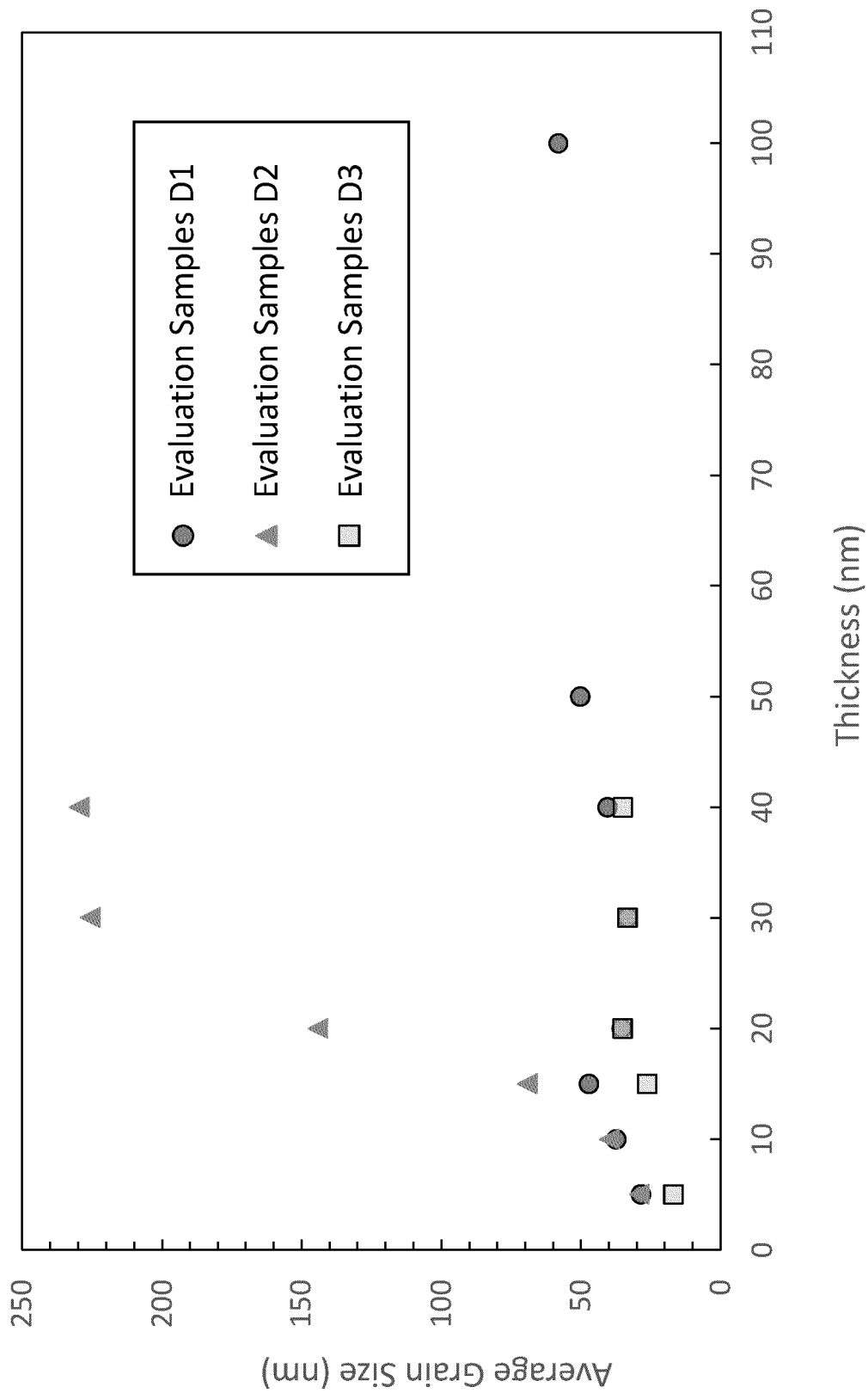
FIG. 23 is a plot showing an average grain size at various electrode thicknesses for a substantially pure magnesium electrode, an electrode including about 10 vol. % $C_{60}$ and about 90 vol. % magnesium, and an electrode including about 90 vol. % magnesium and about 10 vol. % silver.

FIG. 22 is a plot showing the average grain size at various $C_{60}$ compositions at an electrode thickness of about 20 nm. FIG. 23 is a plot showing the average grain size at various electrode thicknesses for electrodes including about 10 vol. % $C_{60}$ and about 90 vol. % magnesium (labelled Evaluation Samples D1), and a substantially pure magnesium electrode (e.g., about 100 vol. % Mg; labelled Evaluation Samples D2). The average grain size of an electrode including about 10 vol. % magnesium and 90 vol. % silver (labelled Evaluation Samples D3) at various thicknesses is also shown in the plot of FIG. 23 for comparison.

Based on the results, it may be particularly advantageous for the electrode to have an average grain size of between about 20 nm and about 60 nm, between about 30 nm and about 60 nm, between about 35 nm and about 55 nm, or between about 45 nm and about 55 nm. Without wishing to be bound by any particular theory, it is postulated that an electrode having a grain size falling within such range may provide favorable optoelectronic properties in terms of optical transmission and resistivity.

Example 6

A series of top-emission OLED device samples were fabricated using various electrode compositions, and their device performances were measured.

Each device was fabricated such that its device structure was substantially identical to one another, with the exception of a composition of a light transmissive electrode. Specifically, each device was constructed to include the general device structure as follows: Glass/Anode/Organic Semiconductor Layers/$C_{60}$ (about 1 nm)/Electrode/Encapsulation. The thickness of the $C_{60}$ layer in all of the devices was about 1 nm. Devices incorporating the following electrode compositions were fabricated and tested: substantially pure magnesium (e.g., about 100 vol. % Mg); about 5 vol. % $C_{60}$ and about 95 vol. % Mg; about 10 vol. % $C_{60}$ and about 90 vol. % Mg; and about 15 vol. % $C_{60}$ and about 85 vol. % Mg at the following electrode thicknesses: about 15 nm, about 20 nm, about 25 nm, and about 30 nm.

Figure 24:
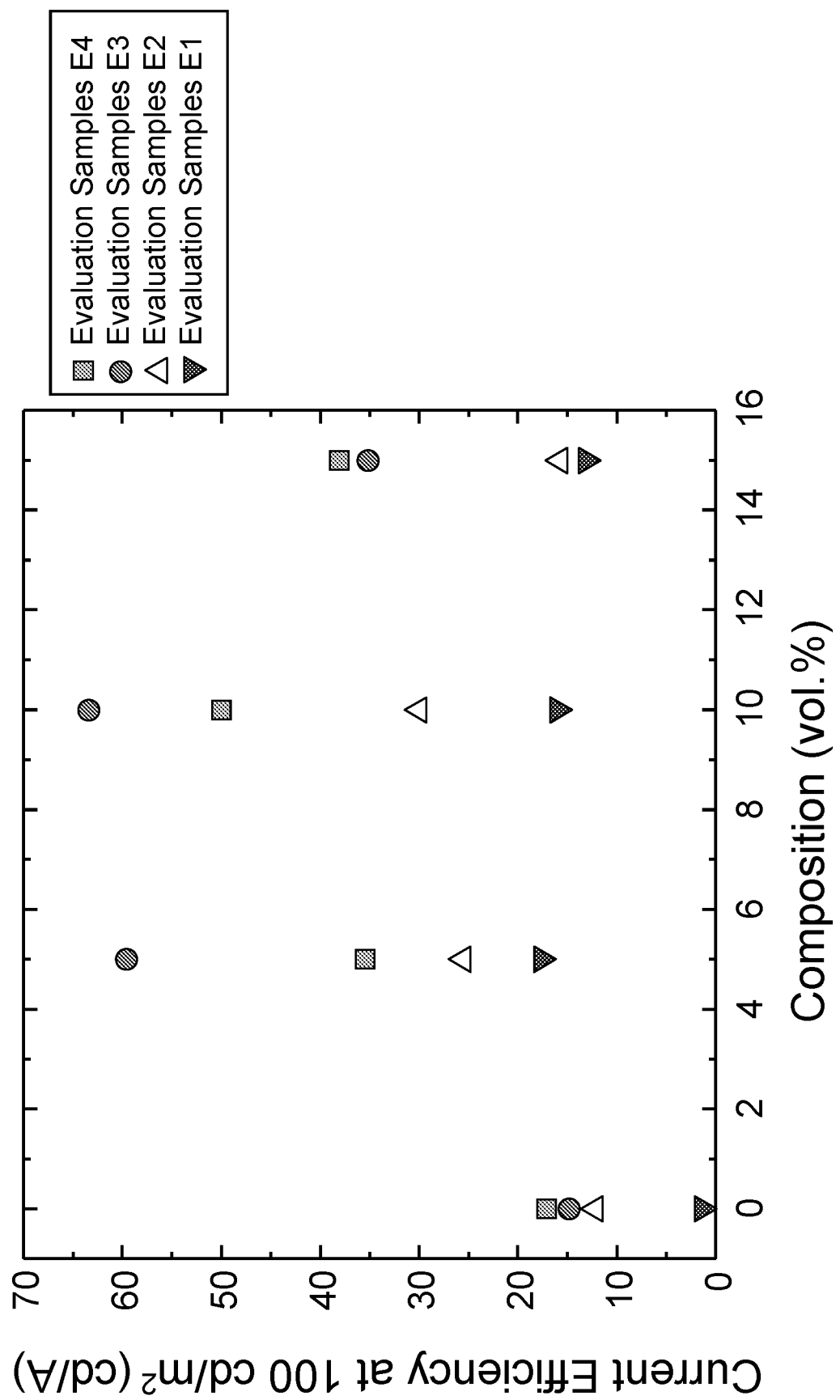
FIG. 24 is a plot of current efficiency at 100 cd/m² against $C_{60}$ composition of an electrode for various electrode thicknesses.
Figure 25:
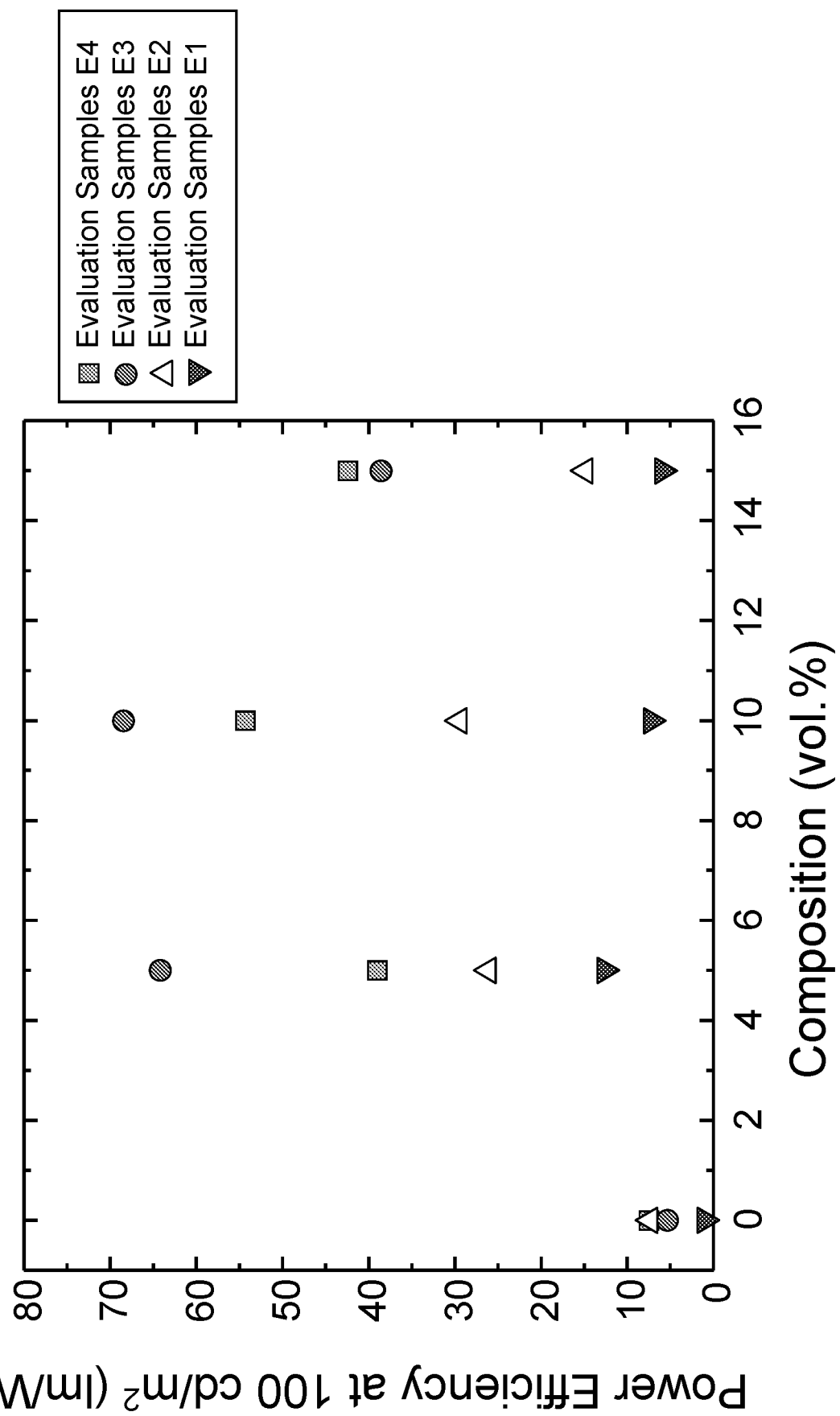
FIG. 25 is a plot of power efficiency at 100 cd/m² against $C_{60}$ composition of an electrode for various electrode thicknesses.

FIG. 24 is a plot showing the current efficiency at about 100 cd/m$^2$ against approximate $C_{60}$ composition for samples having various electrode thicknesses, and FIG. 25 is a plot of power efficiency at about 100 cd/m$^2$ against approximate $C_{60}$ composition for samples having various electrode thicknesses. In the plots of FIGS. 24 and 25, data obtained from samples prepared with an electrode having a thickness of about 15 nm is labelled Evaluation Samples E1; data obtained from samples prepared with an electrode having a thickness of about 20 nm is labelled Evaluation Samples E2; data obtained from samples prepared with an electrode having a thickness of about 25 nm is labelled Evaluation Samples E3; and data obtained from samples prepared with an electrode having a thickness of about 30 nm is labelled Evaluation Samples E4.

As can be seen, the highest current efficiencies and power efficiencies at about 100 cd/m$^2$ were attained for samples including about 5 vol. % or about 10 vol. % $C_{60}$ across the different electrode thicknesses that were evaluated. Specifically, the highest current efficiencies and power efficiencies at about 100 cd/m$^2$ were attained from devices incorporating about 25 nm thick electrode containing either about 5 vol. % $C_{60}$ and about 95 vol. % Mg, or about 10 vol. % $C_{60}$ and about 90 vol. % Mg. It was also found, based on the results, that devices incorporating an electrode having a thickness of about 25 nm exhibited current efficiency and power efficiency that are substantially equal to, or better than, those incorporating an electrode having a thickness of about 30 nm across different electrode compositions. This was followed by devices incorporating an about 20 nm thick electrode, and then by those incorporating an about 15 nm thick electrode. It was also found that devices incorporating an electrode formed by fullerene-containing magnesium alloy of between about 5 vol. % $C_{60}$ to about 15 vol. % $C_{60}$ exhibited substantially higher current and power efficiencies in comparison to devices incorporating a substantially pure magnesium electrode.

Figure 27:
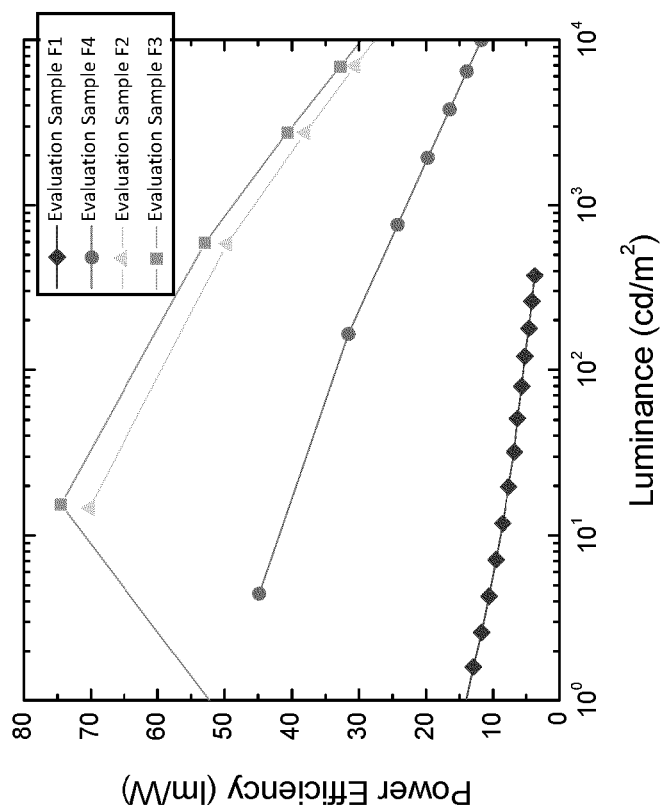
FIG. 27 is a plot of power efficiency vs. luminance for evaluation samples.
Figure 26:
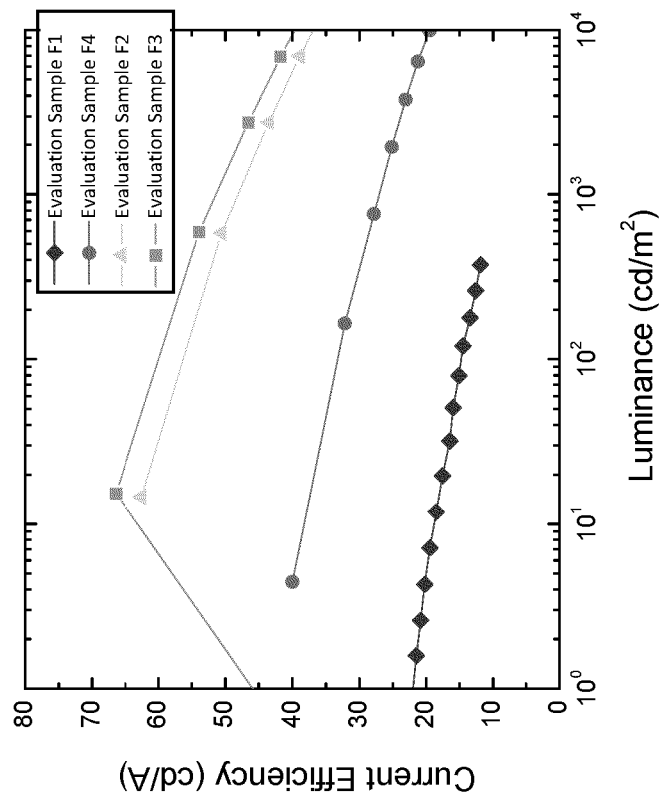
FIG. 26 is a plot of current efficiency vs. luminance for evaluation samples.
Figure 29:
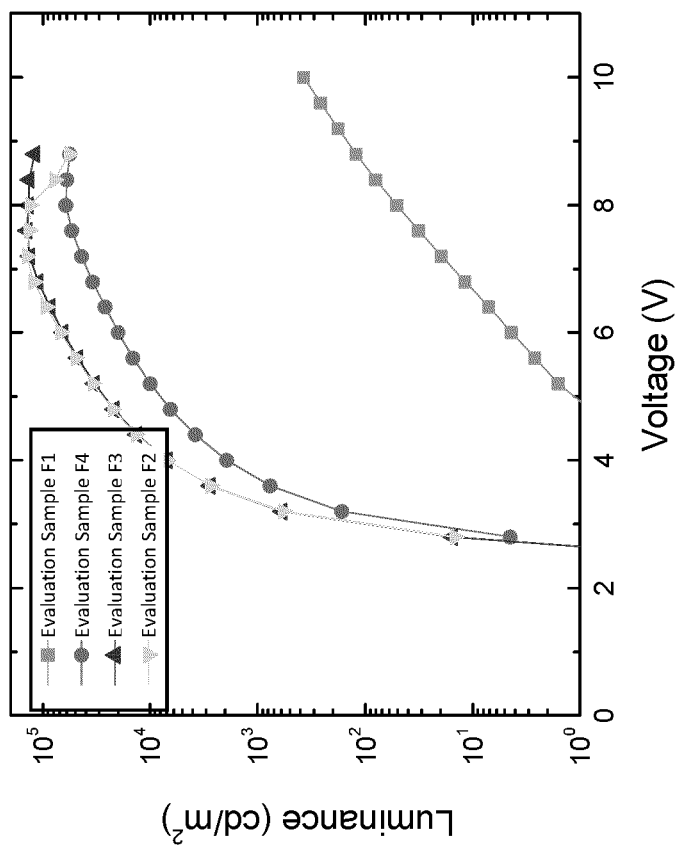
FIG. 29 is a plot of luminance vs. voltage (L-V) for evaluation samples.
Figure 28:
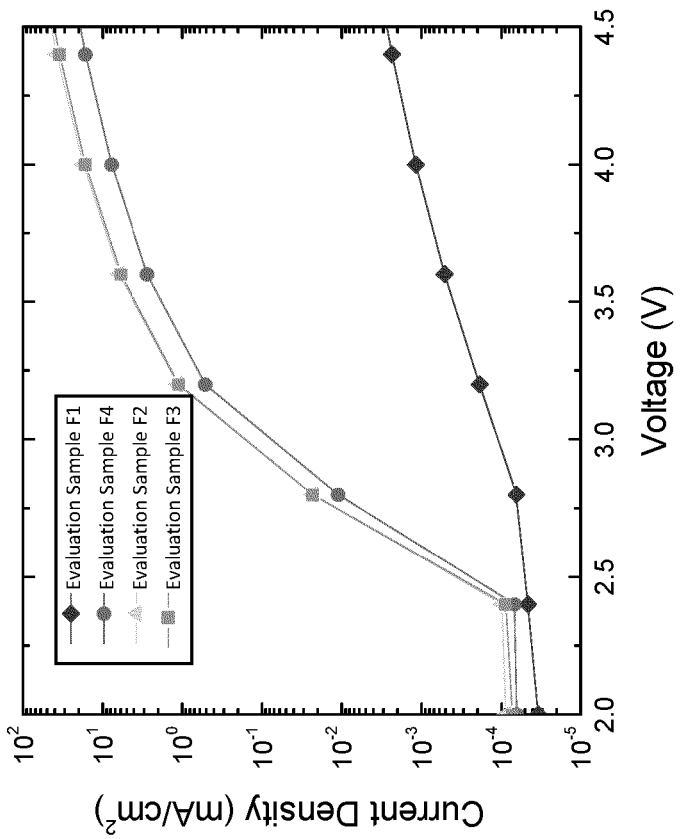
FIG. 28 is a plot of current density vs. voltage (I-V) for evaluation samples.

FIG. 26 is a plot of current efficiency vs. luminance for example device samples fabricated with electrodes having $C_{60}$ compositions of between about 0 vol. % and about 15 vol. %. FIG. 27 is a plot of power efficiency vs. luminance, FIG. 28 is a plot of current density vs. voltage (I-V), and FIG. 29 is a plot of luminance vs. voltage (L-V) for the same set of samples. In the plots of FIGS. 26-29, data obtained from samples prepared with an electrode having a thickness of about 25 nm and containing about 100 vol. % magnesium is labelled Evaluation Samples F1; data obtained from samples prepared with an electrode having a thickness of about 25 nm and containing about 5 vol. % $C_{60}$ and 95 vol. % magnesium is labelled Evaluation Samples F2; data obtained from samples prepared with an electrode having a thickness of about 25 nm and containing about 10 vol. % $C_{60}$ and 90 vol. % magnesium is labelled Evaluation Samples F3; and data obtained from samples prepared with an electrode having a thickness of about 25 nm and containing about 15 vol. % $C_{60}$ and 85 vol. % magnesium is labelled Evaluation Samples F4.

It will be appreciated that experimental results and measurement values recorded in various examples herein may include a certain amount of error due to, for example, inaccuracies, variations, or bias in measurements, random or systematic errors in measurements, detection limit of the tools or equipment used in conducting measurements, defects or inconsistencies in the samples used for measurements, number of sample size, and/or sampling error. For example, the fullerene composition may vary by up to about ±3 vol. %, ±2 vol. %, ±1 vol. %, ±0.5 vol. %, or ±0.1 vol. % from the recorded value in certain examples. The light transmittance, absorption, and reflectivity may, for example, vary by up to about ±10%, ±8%, ±5%, ±3%, ±1%, ±0.5%, or ±0.1% from the recorded value in certain examples. The sheet resistance may, for example, vary by up to about ±10 Ω/sq, ±5 Ω/sq, ±1 Ω/sq, ±0.5 Ω/sq, or ±0.1 Ω/sq from the recorded value in certain examples. The thickness of the electrode may, for example, vary by up to about ±7 nm, ±5 nm, ±3 nm, ±1 nm, ±0.5 nm, or ±0.1 nm from the recorded value in certain examples. The average grain size may, for example, vary by up to about ±30 nm, ±15 nm, ±10 nm, ±8 nm, ±5 nm, or ±3 nm from the recorded value in certain examples. Other reported values may generally vary by up to, for example, about ±10%, ±5%, ±3%, ±1%, ±0.5%, or ±0.1% of that numerical value.

In various examples and embodiments described herein, references are made to fullerene-containing magnesium coating of various thicknesses and compositions. It will be appreciated that the composition of such coating may be determined based on the relative amounts of fullerene and magnesium used to form such coating. For example, in a coating formed by thermal evaporation, it is typical to monitor the mass of the material(s) that is deposited, and thus the approximate thickness of coating based on the reading from a quartz crystal monitor (QCM) system. Accordingly, for example, the composition of a fullerene-containing magnesium coating formed by thermally co-evaporating fullerene and magnesium may be determined based on the QCM reading of the relative thickness or volume of fullerene and magnesium deposited in the process of forming such coating.

As used herein, the terms "substantially," "substantial," "approximately," and "about" are used to denote and account for small variations. When used in conjunction with an event or circumstance, the terms can refer to instances in which the event or circumstance occurs precisely, as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

In the description of some embodiments, a component provided "on" or "over" another component, or "covering" or which "covers" another component, can encompass cases where the former component is directly on (e.g., in physical contact with) the latter component, as well as cases where one or more intervening components are located between the former component and the latter component.

As used herein, the term "size" refers to a characteristic dimension of an object. Thus, for example, a size of an object that is spherical or circular can refer to a diameter of the object. In the case of an object that is non-spherical or non-circular, a size of the non-spherical or non-circular object can refer to a largest dimension of the non-spherical or non-circular object. Thus, for example, a size of an object that is ellipsoidal can refer to a major axis of the object. When referring to a set of objects as having a particular size, it is contemplated that the objects can have a distribution of sizes around the particular size. Thus, as used herein, a size of a set of objects can refer to a typical size of a distribution of sizes, such as an average size, a median size, or a peak size.

Additionally, amounts, ratios, and other numerical values are sometimes presented herein in a range format. It can be understood that such range formats are used for convenience and brevity, and should be understood flexibly to include not only numerical values explicitly specified as limits of a range, but also all individual numerical values or sub-ranges encompassed within that range as if each numerical value and sub-range is explicitly specified.

Although the present disclosure has been described with reference to certain specific embodiments, various modifications thereof will be apparent to those skilled in the art. Any examples provided herein are included solely for the purpose of illustrating certain aspects of the disclosure and are not intended to limit the disclosure in any way. Any drawings provided herein are solely for the purpose of illustrating certain aspects of the disclosure and may not be drawn to scale and do not limit the disclosure in any way. The scope of the claims appended hereto should not be limited by the specific embodiments set forth in the above description, but should be given their full scope consistent with the present disclosure as a whole. The disclosures of all documents recited herein are incorporated herein by reference in their entirety.

The invention claimed is:

1. An opto-electronic device comprising:
   a substrate;
   a first electrode disposed over the substrate;
   at least one semiconductor layer disposed over the first electrode, the semiconductor layer including an emissive layer; and
   a second electrode disposed over the semiconductor layer, the second electrode being light-transmissive and including a fullerene-containing magnesium alloy which includes a non-zero amount of a fullerene of up to 15 vol. % of the fullerene, the second electrode having a thickness of 50 nm or less.

2. The opto-electronic device of claim 1, wherein the thickness of the second electrode is in a range from 5 nm to 50 nm, and the amount of the fullerene in the fullerene-containing magnesium alloy is in a range from 0.1 vol. % to 15 vol. %.

3. The opto-electronic device of claim 1, wherein the thickness of the second electrode is in a range from 10 nm to 40 nm, and the amount of the fullerene in the fullerene-containing magnesium alloy is in a range from 1 vol. % to 10 vol. %.

4. The opto-electronic device of claim 1, wherein a remainder of the fullerene-containing magnesium alloy consists essentially of magnesium.

5. The opto-electronic device of claim 1, wherein the fullerene includes Cn, where n is an integer in a range from 60 to 84.

6. The opto-electronic device of claim 1, wherein the fullerene includes $C_{60}$, $C_{70}$, $C_{72}$, $C_{74}$, $C_{76}$, $C_{78}$, $C_{80}$, $C_{82}$, $C_{84}$, or a combination of two or more thereof.

7. The opto-electronic device of claim 1, further comprising a fullerene-containing coating disposed between the semiconductor layer and the second electrode.

8. The opto-electronic device of claim 7, wherein a thickness of the fullerene-containing coating is less than the thickness of the second electrode.

9. The opto-electronic device of claim 7, wherein a thickness of the fullerene-containing coating is 5 nm or less.

10. The opto-electronic device of claim 1, wherein the second electrode has a sheet resistance of 20 Ω/sq or less, and a light transmittance at a wavelength of 550 nm of 25% or greater.

11. The opto-electronic device of claim 1, wherein the first electrode is an anode, and the second electrode is a cathode.

12. The opto-electronic device of claim 1, wherein the semiconductor layer further includes one or more organic semiconductor layers selected from a group consisting of: a hole injection layer, a hole transport layer, an electron transport layer, an electron injection layer, a hole blocking layer, and an electron blocking layer.

13. The opto-electronic device of claim 1, further comprising a thin film transistor electrically connected to the first electrode.

14. The opto-electronic device of claim 1, further comprising an auxiliary electrode disposed over and electrically connected to the second electrode.

15. The opto-electronic device of claim 14, wherein a thickness of the auxiliary electrode is greater than the thickness of the second electrode.

16. The opto-electronic device of claim 14, wherein the auxiliary electrode includes magnesium.

17. The opto-electronic device of claim 1, wherein the opto-electronic device is an organic light emitting diode (OLED) device.

18. The opto-electronic device of claim 17, wherein the OLED device is a top-emission OLED device or a double-sided emission OLED device.

19. The opto-electronic device of claim 1, wherein an average grain size of the second electrode is in a range from 20 nm to 60 nm.

* * * * *